United States Patent
Iyer

(10) Patent No.: US 7,302,417 B2
(45) Date of Patent: Nov. 27, 2007

(54) METHOD AND APPARATUS FOR IMPROVING EFFICIENCY OF CONSTRAINT SOLVING

(75) Inventor: Mahesh Anantharaman Iyer, Burlingame, CA (US)

(73) Assignee: Synopsys, Inc., Mountain View, CA (US)

( * ) Notice: Subject to any disclaimer, the term of this patent is extended or adjusted under 35 U.S.C. 154(b) by 198 days.

(21) Appl. No.: 11/120,920

(22) Filed: May 2, 2005

(65) Prior Publication Data

US 2006/0247930 A1 Nov. 2, 2006

(51) Int. Cl.
G06E 1/00 (2006.01)
G06F 17/50 (2006.01)

(52) U.S. Cl. .................. 706/19; 716/2; 716/4; 716/5

(58) Field of Classification Search .................. 706/19
See application file for complete search history.

(56) References Cited

U.S. PATENT DOCUMENTS 5,831,996 A * 11/1998 Abramovici et al. ........ 714/738

OTHER PUBLICATIONS

Iyer, Race: A Word-Level ATPG-Based Constraints Solver System for Smart Random Simulation, 2003.☐☐.*

Nam et al., A Comparative Study of Two Boolean Formulations of FPGA Detailed Routing Constraints, 2004.☐☐.*
Kuehlmann et al., Robust Boolean Reasoning for Equivalence Checking and Functional Property Verification, 2002.☐☐.*
Waters, System Validation via Constraint Modeling, 1991.☐☐.*
Burch et al., Sequential Circuit Verification Using Symbolic Model Checki:ng, 1990.☐☐.*

* cited by examiner

Primary Examiner—Anthony Knight
Assistant Examiner—Nathan H. Brown, Jr.
(74) Attorney, Agent, or Firm—Park, Vaughan & Fleming LLP

(57) ABSTRACT

Techniques are presented for identifying blockable subsets. Blockable subsets can increase the efficiency by which solutions to a constraint set representation (CSR) can be found. Nodes of a blockable subset can be marked as "blocked" and learning or implication procedures, used as part of a CSR solving process, can be designed to skip nodes marked as blocked. The identification of a particular blockable subset is typically associated with certain conditions being true. If and when the conditions no longer hold, the nodes of the blockable subset need to be unblocked. One type of blockable subset can be identified during the operation of an implication engine (IE) by a technique called justified node blocking (JNB). Another type of blockable subset can be identified by a technique called pivot node learning (PNL). PNL can be applied in-between application of an IE and application of case-based learning.

9 Claims, 41 Drawing Sheets

CALL TO CSR SOLVER

"ATPG"

State of ImplyValuesInCircuitFe when first called

After step 1 of ImplyValuesInCircuitFe has been accomplished

After step 2 of ImplyValuesInCircuitFe has been accomplished

333 →

Level 0 forwardQueues: ( )
Level 1 forwardQueues: (CU_1, +, -, CU_2)
Level 2 forwardQueues: ( )
Level 3 forwardQueues: ( )
Level 4 forwardQueues: ( )

← 334

Level 0 backwardQueues: ( )
Level 1 backwardQueues: ( )
Level 2 backwardQueues: ( )
Level 3 backwardQueues: ( )
Level 4 backwardQueues: (&&)

Result of ForwardImply on CSR 330 of Figure 3C

412

Level 0 forwardQueues: ( )
Level 1 forwardQueues: ( )
Level 2 forwardQueues: ( )
Level 3 forwardQueues: ( )
Level 4 forwardQueues: ( )

413

Level 0 backwardQueues: ( )
Level 1 backwardQueues: (CU_2, CU_1, +, -)
Level 2 backwardQueues: (Pr_1, Pr_2)
Level 3 backwardQueues: (==_1, ==_2)
Level 4 backwardQueues: (&&)

Result of BackwardImply on CSR 410 of Figure 4A

412 →

Level 0 forwardQueues: ( )
Level 1 forwardQueues: (+, -)
Level 2 forwardQueues: (Pr_1, Pr_2)
Level 3 forwardQueues: (==_1, ==_2)
Level 4 forwardQueues: (&&)

← 413

Level 0 backwardQueues: ( )
Level 1 backwardQueues: ( )
Level 2 backwardQueues: ( )
Level 3 backwardQueues: ( )
Level 4 backwardQueues: ( )

Result of second call to ForwardImply on CSR 410 of Figure 4B

412 ⟶

Level 0 forwardQueues: ( )
Level 1 forwardQueues: ( )
Level 2 forwardQueues: ( )
Level 3 forwardQueues: ( )
Level 4 forwardQueues: ( )

⟵ 413

Level 0 backwardQueues: ( )
Level 1 backwardQueues: (+, -)
Level 2 backwardQueues: (Pr_1, Pr_2)
Level 3 backwardQueues: (==_1, ==_2)
Level 4 backwardQueues: (&&)

Result of second call to BackwardImply on CSR 410 of Figure 4C

412 →

Level 0 forwardQueues: ( )
Level 1 forwardQueues: ( )
Level 2 forwardQueues: ( )
Level 3 forwardQueues: ( )
Level 4 forwardQueues: ( )

← 413

Level 0 backwardQueues: ( )
Level 1 backwardQueues: ( )
Level 2 backwardQueues: ( )
Level 3 backwardQueues: ( )
Level 4 backwardQueues: ( )

FIGURE 5

```
1    /* Top-level function for implication engine.
2     * impVals is a table of node-value pairs to be implied
3     * nodesImplied is the table of node-value pairs that are implied
4     */
5    Boolean ImplyValuesInCircuitFe (impVals, nodesImplied)
6    {
7        1. Set the initial values in the passed-in impVals table to the corresponding nodes.
8           All these node-value pairs are also inserted in the passed-in nodesImplied table.
9        2. Create the initial forward and backward queues. A forward and backward queue
10          is maintained for each level of the levelized circuit on which implications are
11          performed. The fanout nodes of all non-primary-output nodes in the
12          nodesImplied table are added to the corresponding forward queue. All non-
13          primary-input nodes in the nodesImplied table are added to the corresponding
14          backward queue.
15       3. retVal = ForwardImply(forwardQueues, backwardQueues, nodesImplied): This
16          step performs all forward implications by processing all forwardQueues in order,
17          starting with the lowest level. As part of implying forward on a node, other nodes
18          may get scheduled for forward propagation and the node itself may get
19          scheduled for backward propagation.
20       4. If retVal
21          a. retVal = BackwardImply(forwardQueues, backwardQueues,
22             nodesImplied): This step performs all backward implications by
23             processing all backwardQueues in order, starting with the highest level.
24             As part of implying backward on a node, other nodes may get scheduled
25             for backward propagation and the node itself may get scheduled for
26             forward propagation.
27       5. If retVal && pending events in forward or backward queues
28          a. go to Step 3.
29       6. return retVal.
30   }
```

FIGURE 6

```
1   /* This function is the core forward implication engine */
2   Boolean ForwardImply (forwardQueues, backwardQueues, nodesImplied)
3   {
4
5       /* Iterate over each forward queue in forwardQueues, starting from queue for lowest level */
6       foreach forwardEvents in forwardQueues
7       {
8           foreach node in forwardEvents [ that is not blocked ]
9           {
10              newValue = forward evaluate node;
11              oldValue = current value of node;
12              if (newValue == oldValue)
13                  Schedule node for backward implications;
14              else
15              {
16                  intersectValue = newValue ∩ oldValue;
17                  if intersectValue
18                  {
19                      [ look_for_justified_nodes_and_block(
20                        intersectValue, node) ]
21                      Store node-intersectValue-pair in nodesImplied;
22                      Set value of node to intersectValue;
23                      Schedule node for backward implications;
24                      Schedule fanout nodes of node for forward
25                      implications;
26                  }
27                  else return false;
28              }
29          } /* end foreach node */
30      } /* end foreach forwardEvents */
31      return true
32  } /* end ForwardImply */
```

FIGURE 7

```
1   /* This function is the core backward implication engine */
2   boolean BackwardImply (forwardQueues, backwardQueues, nodesImplied)
3   {
4
5       /* Iterate over each backward queue in backwardQueues, starting from queue for hghest level */
6       foreach backwardEvents in backwardQueues
7       {
8           foreach node in backwardEvents [ that is not blocked ]
9           {
10              foreach input_node of node
11              {
12                  If value of input_node is not a singleton value
13                  {
14                      newValue = backward evaluate to input_node;
15                      OldValue = old value of input_node;
16                      intersectValue = newValue ∩ oldValue;
17                      if intersectValue is empty, return false;
18                      if (newValue != oldValue)
19                      {
20                          [ look_for_justified_nodes_and_block(
21                              intersectValue, input_node) ]
22                          Store input_node-intersectValue-pair in
23                              nodesImplied;
24                          Set value of input_node to intersectValue;
25                          Schedule input_node for backward implications;
26                          Schedule all fanout nodes of input_node for forward
27                              implications;
28                      }
29                  }
30
31              } /* end foreach input */
32
33          } /* end foreach node */
34
35      } /* end foreach backwardEvents */
36
37      return true;
38
39  } /* end BackwardImply */
```

FIGURE 8A

```
1   look_for_justified_nodes_and_block(intersectValue, node)
2   {
3
4   /* If new range for "node" does not contain zero, "node" can cause the justification of any OR node it drives
5   */
6   if (intersectValue == a range that does not include {0:0} )
7           /* A new value for "node" has been produced that can serve as a controlling value to an OR node
8           driven by "node" */
9           foreach output_node in fanout of node
10          {
11          if ( function(output_node) == OR && not_justified(output_node) )
12                  /* in future, when "not_justified" function is applied to output_node, it will return false */
13                  mark output_node as justified;
14
15                  foreach "output_node_input" that is an input of output_node, other than
16                  "node"
17                  {
18                          /* The transitive fanin nodes of output_node_input include output_node_input
19                          itself */
20                          foreach tfi_node of output_node_input
21                          {
22                                  if (all paths from tfi_node to a primary output include
23                                  output_node_input)
24                                          mark tfi_node as blocked;
25                          } /* end "foreach tfi_node" */
26                  } /* end "foreach output_node_input" */
27
28          } /* end "foreach output_node" */
29
30  /* If new range for "node" is zero, "node" can cause the justification of any AND node it drives */
31  if (intersectValue == ({0:0}) )
32          /* A new value for "node" has been produced that can serve as a controlling value to an AND
33          node driven by "node" */
34          foreach output_node in fanout of node
35          {
36          if ( function(output_node) == AND && not_justified(output_node) )
37                  /* in future, when "not_justified" function is applied to output_node, it will return false */
38                  mark output_node as justified;
39
40                  foreach "output_node_input" that is an input of output_node, other than
41                  "node"
42                  {
43                          /* The transitive fanin nodes of output_node_input include output_node_input
44                          itself */
45                          foreach tfi_node of output_node_input
46                          {
47                                  if (all paths from tfi_node to a primary output pass through
48                                  output_node_input)
49                                          mark tfi_node as blocked;
```

FIGURE 8B

```
1                    } /* end "foreach tfi_node" */
2                    } /* end "foreach output_node_input" */
3
4       } /* end "foreach output_node" */
5
6   } /* end "look_for_justified_nodes_and_block" */
```

FIGURE 10

```
1    /* Top-level function for recursive learning.

2    ImplyValuesInCircuitFe is the "implication engine." It's first parameter is an input table that specifies the
3    initial setting for the nodes of the network to be implied. To the extent such node settings are unchanged
4    by the implication engine, they are include in the output table of the second parameter. */

5    boolean PerformLearningInCircuitFe( raceCircuit, nodesImplied )

6    {

7    /* Loop over each unjustified Boolean node (UBN) of circuit (i.e., the CSR). The list of unjustified nodes is
8    in the raceCircuit parameter. */

9    Foreach UBN of the following set: all unjustified Boolean nodes of raceCircuit that are
10   not blocked

11   {

12           retVal = PerformLearningInCircuit(raceCircuit, UBN, learnedImps);

13           /* If PerformLearningInCircuit succeeded (retVal is true), then pursue any implications of the
14           recursive learning by applying ImplyValuesInCircuitFe */

15           If (retVal)

16                   retVal = ImplyValuesInCircuitFe(learnedImps, nodesImplied);

17           else return retVal;

18   }

19   return retVal

```
1   /* Core learning engine. All the recursive learning possible, from the particular UBN chosen, is explored.
2   Results learned are returned in learnedImps table. */
3   boolean PerformLearningInCircuit(raceCircuit, UBN, learnedImps)
4   {
5   failCount = 0;
6   Foreach input_node of the following set: all input nodes of UBN that are not blocked
7   {
8           /* set the current input of UBN, "input_node," to a controlling value */
9           sel_value = (controlling value for UBN using precision and sign of input_node) ∩
10          (current value of input_node);
11
12          /* find the implications of setting current input of UBN to a controlling value */
13          retVal = RecursiveImplyDecisionValue(raceCircuit, input_node, sel_value,
14          nodesImplied);
15
16          If (retVal)
17          /* RecursiveImplyDecisionValue succeeded. */
18          {
19                  /* Test whether input_node just processed is the first input, to UBN, to be selected for
20                  processing by above "foreach" loop. */
21              if ( first(input_node) )
22                      /* if first input of UBN, then keep the implications learned in the "learnedImps"
23                      table */
24                  learnedImps = nodesImplied;
25
26              else
27              /* input_node just processed is the second input, to UBN, to be selected for processing
28              by above "foreach" loop. */
29                  {
30                          /* below loop unions results learned from first input to current UBN with
31                          results just learned from second input.
32                          Have two tables, learnedImps and nodesImplied. If there is a variable
33                          "a" in learnedImps that also exists in nodesImplied, take the value got
34                          for "a" in learnedImps, and value got for "a" in nodesImplied, and union
35                          them.
36                          To rephrase, if there is a variable "a" about which an implication was
37                          learned when either input_node to the UBN was set to a controlling
38                          value, then the union of the two implications is put into the learnedImps
```

FIGURE 11B

```
1       table that the current recursive level of PerformLeaningInCircuit returns
2       as its result. */
3              Foreach impliedNode_LI in learnedImps
4              {
5                     Foreach impliedNode_NI in nodesImplied
6                     {
7                            If impliedNode_LI and nodesImplied_NI
8                            apply to same rv
9                            {
10                                  unionValue = (range of
11                                         impliedNode_LI) U (range of
12                                         impliedNode_NI);
13                                  insert impliedNode_LI-unionValue pair
14                                         in newLearnedImps;
15                            }
16                     }
17              }
18              learnedImps = newLearnedImps;
19        }
20    } /* end if (retVal) */
21    else
22    /* RecursiveImplyDecisionValue failed. This means it is not possible to set the current UBN
23    input_node to a controlling value, since a conflict resulted. Exclude the controlling value from
24    current UBN input_node. The range of the input_node, less the controlling value, is stored in an
25    exclusions map to insure the controlling value will not be tried again. */
26    {
27           excludeValue = exclude sel_value from current value of input_node;
28           Insert input_node-excludeValue pair in excludeImps;
29           Increment failCount;
30    }
31
32    /* restore circuit to the state it was in before the above call to RecursiveImplyDecisionValue. This
33    insures that, when second input of current UBN is the current input_node, a "fresh start" is taken
34    as to the resulting implications. */
35    Restore circuit to the state before above call to RecursiveImplyDecisionValue;
36
37 } /* end foreach input_node */
```

FIGURE 11C

```
1   /* Note that, in above "foreach input_node" loop, whenever setting an input node of the current UBN to a
2   controlling value failed (produced a conflict), the failCount is incremented. As long as failCount is less than
3   2, whatever learning was accomplished from the current UBN is accumulated in the learnedImps table. */
4   if (failCount != 2)
5   {
6           Foreach impliedNode_LI in learnedImps
7           {
8                   Foreach impliedNode_EI in excludeImps
9                   /* At this point, both inputs have been tried but one has failed (otherwise
10                  excludeImps would be empty). If same rv is represented in both learnedImps
11                  and excludeImps, the range of the rv in learnedImps has unioned with it the
12                  range of the rv in excludeImps. Any rv of learnedImps that is not present in
13                  excludeImps has its range unchanged. */
14                  If impliedNode_LI and impliedNode_EI apply to the same rv
15                          range of impliedNode_LI = range of impliedNode_LI ∪
16                          range of impliedNode_EI;
17          }
18          return true;
19  }
20
21  /* if failCount == 2, then setting either input to a controlling value resulted in conflicts where it is already
22  known that at least one of them must be controlling since a UBN means the output is controlling. Thus,
23  something is seriously wrong and the whole case-based learning process for the circuit must fail.
24  PerformLearningInCircuit returning a false value to PerformLearningInCircuitFe causes
25  PerformLearningInCircuitFe to do no implication of the circuit based upon case-based learning information
26  and PerformLearningInCircuitFe simply returns a failure value. */
27  else
28  {
29          Empty learnedImps table
30          Return false
31  }
32
33  }
```

FIGURE 12

```
1   /* Core top-level function to find the recursive implications of setting input_node, of UBN selected by
2   PerformLearningInCircuit, to the controlling value represented by sel_value.
3   The resulting implications are stored in "nodesImplied" table.
4   If the implications include producing more UBNs, then RecursiveImplyDecisionValue pursues those UBNs
5   with RecursiveLearnAndImply, otheriwse RecursiveImplyDecisionValue can return after running the
6   implication engine (ImplyValuesInCircuitFe) */
7   boolean RecursiveImplyDecisionValue(raceCircuit, input_node, sel_value,
8   nodesImplied)
9   {
10      /* create table impVals to express the setting of input_node to a controlling value in a format that
11      ImplyValuesInCircuitFe can process. */
12      Insert input_node-sel_value pair in impVals table;
13      /* Apply IE to the situation of input_node being set to sel_value */
14      retVal = ImplyValuesInCircuitFe(impVals, nodesImplied);
15      if retVal
16      {
17          /* Since list unjustNodes is based upon nodesImplied, which was set by the just-above call to
18          ImplyValuesInCircuitFe, unjustNodes just includes those UBNs that are a result of input_node
19          being set to a controlling value.
20          Therefore, unjustNodes does not include parent UBN to input_node, since the setting of
21          input_node to a controlling value justified its parent node.
22          unjustNodes will include input_node itself if input_node is a boolean node and if no input of
23          input_node has a controlling value. */
24          unjustNodes = list of unjustified nodes in nodesImplied;
25          /* if circuit has no UBNs, no need to call RecursiveLearnAndImply */
26          if ( not_null(unjustNodes) )
27          {
28              /* The UBNs are levelized, with leaf nodes being level 0 and root node having highest
29              level. The UBNs of "unjustNodes" are sorted such that nodes with the highest level (and
30              therefore closest to the root) come first. Closest-to-the-root UBNs are selected first by
31              RecursiveLearnAndImply. Strategy is that lower-down UBNs may be subsumed by the
32              higer UBNs anyway. */
33              sort unjustNodes based on reverse levelized order;
34              retVal = RecursiveLearnAndImply(raceCircuit, unjustNodes,
35              nodesImplied);
36          }
37      }
38      return retVal
39  }
```

FIGURE 13

```
1   /* Recursively applies PerformLearningInCircuit to acquire further case-based implications. Implications
2   acquired are returned in nodesImplied.
3   Given a list "unjustNodes" of UBNs to each of which PerformLearningInCircuit is recursively applied. */
4   boolean RecursiveLearnAndImply(raceCircuit, unjustNodes, nodesImplied)
5   {
6
7   foreach unjust_node in unjustNodes
8   {
9           retVal = PerformLearningInCircuit(raceCircuit, unjust_node, learnedImps);
10          if retVal
11              retVal = ImplyValueInCircuitFe(learnedImps, nodesImplied);
12  }
13
14  return retVal
15  }
```

```
rand bit[31 : 0] a;
constraint c1 {
  a == 10 || a == 15 || a == 20;
  a mod 2 == 0;
}
```
1400

1401

FIGURE 14D
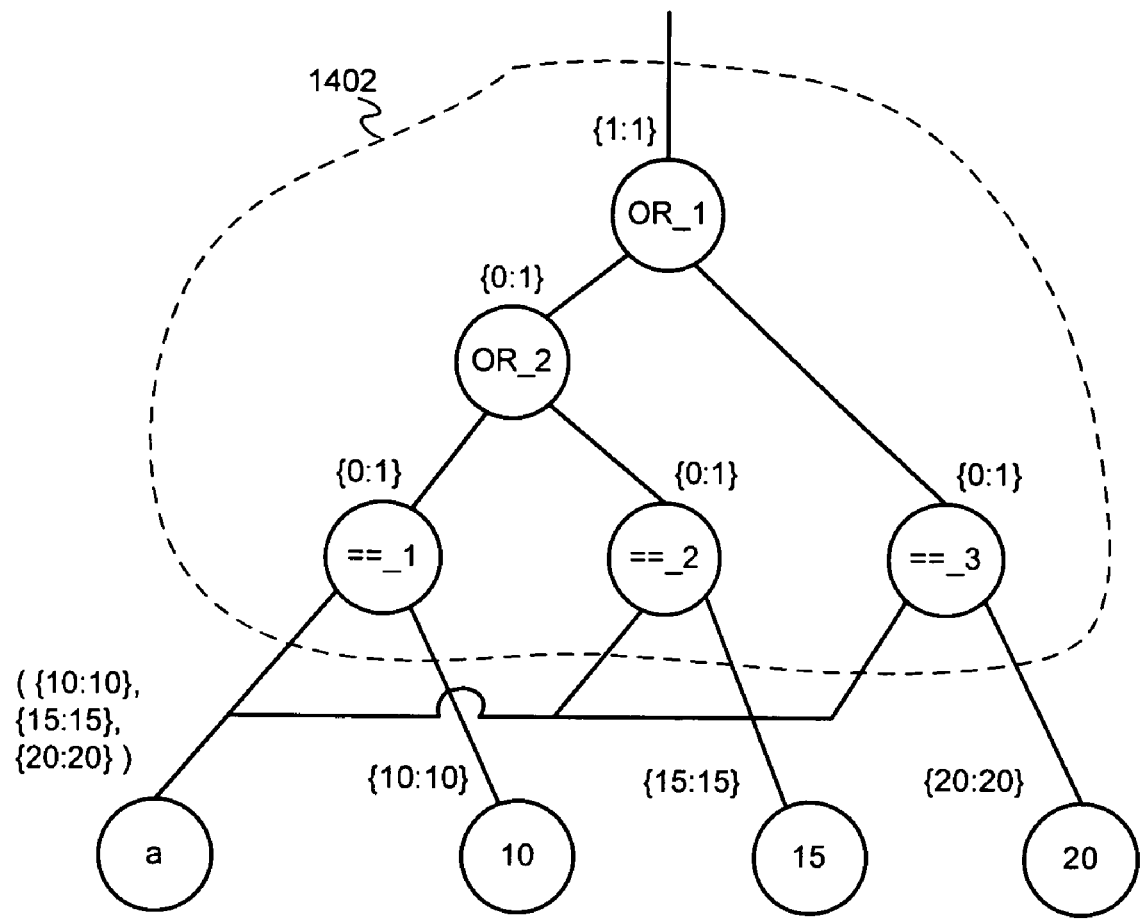
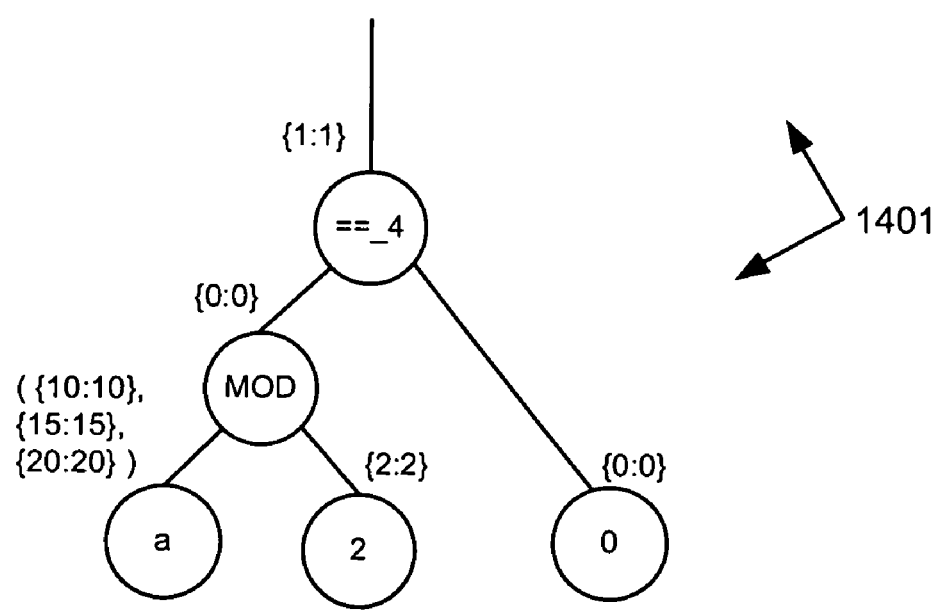

FIGURE 14E
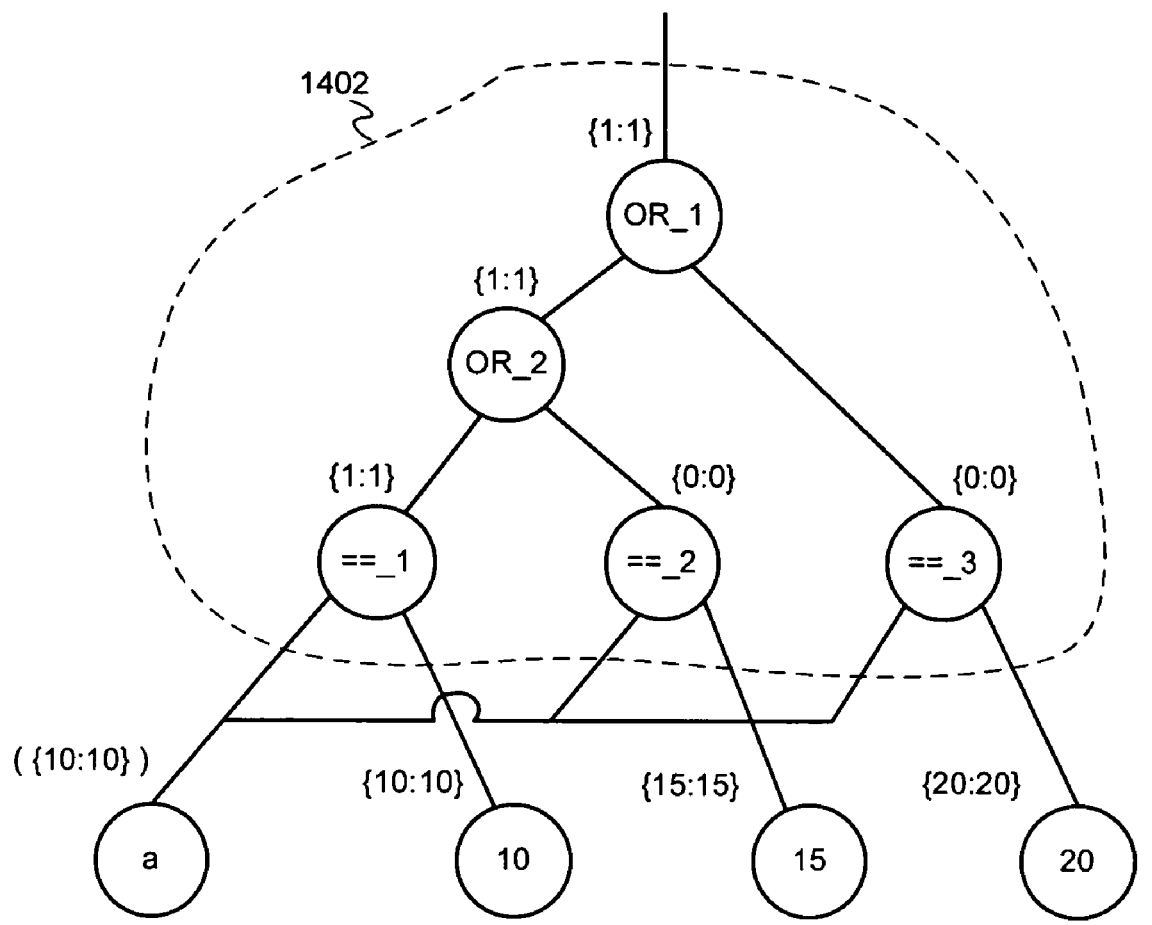
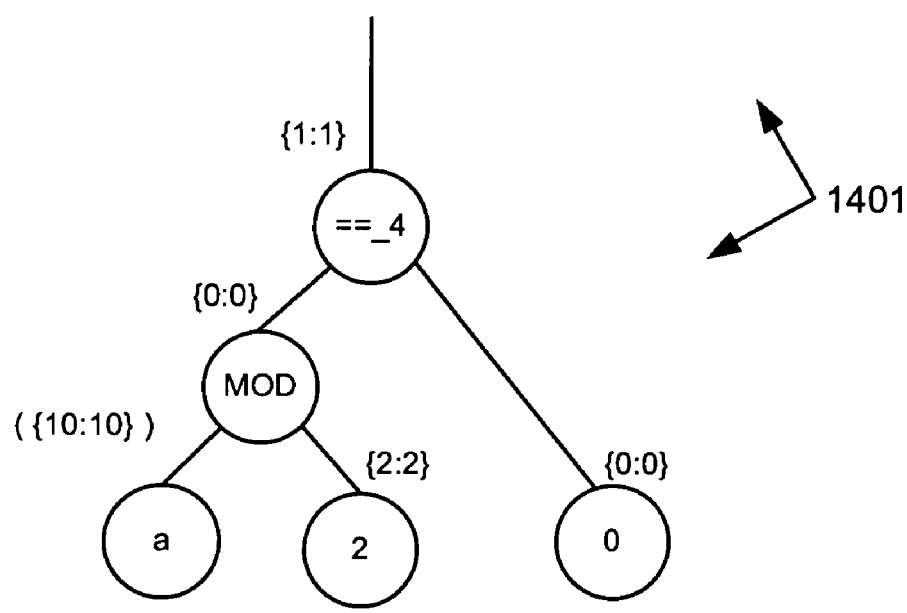

PNL PROCESS

FIGURE 17

```
1    // Main procedure
2    IdentifyPivotNodesAndCones(Circuit,
3                                       HashTableOfCandidatePivotNodes)
4    {
5    IdentifyCandidatePivotNodes(Circuit,
6                                       HashTableOfCandidatePivotNodes);
7
8    IdentifyPivotCones(HashTableOfCandidatePivotNodes,
9                               HashTableOfPivotNodeStructures
10                              HashTableOfVisitedNodes);
11
12   HashClearAll(HashTableOfVisitedNodes);
13   }
```

FIGURE 18

```
1    // procedure to identify candidate pivot nodes
2    IdentifyCandidatePivotNodes(Circuit,
3                                            HashTableOfCandidatePivotNodes)
4    {
5    Foreach node myNode in Circuit
6    {
7            If (! NodeIsPrimaryInput(nyNode) &&
8                    /* this is really a detail; bit slice operator is treated almost like a primary input */
9                    ! NodeIsBitSliceOperator(myNode) &&
10                   /* following function just tests for whether node's operator is complete   */
11                   NodeCanBeInPivotCone(myNode) &&
12                   NodeHasSingletonValue(myNode))
13           {
14                   numSingletonInputs = numOfSingletonValueInputs(myNode);
15                   numInputs = numInputsOfNode(myNode);
16                   /* A node with one or more non-singleton ranges on its inputs is a candidate pivot
17                   node. */
18                   If (numSingletonInputs != numInputs)
19                   {
20                           HashInsert(HashTableOfCandidatePivotNodes, myNode, 0);
21                   }
22           }
23   } /* end "foreach node" */
24   } /* end IdentifyCandidatePivotNodes */
25
26
27   // Procedure to determine if a node can be included in a pivot cone
28   boolean NodeCanBeInPivotCone(node)
29   {
30   If (NodeIsRelationalOperator(node) ||
31           NodeIsBooleanOperator(node) ||
32           NodeIsEqualityOperator(node))
33           Return TRUE;
34   Else
35           Return FALSE;
36   }
```

FIGURE 19

```
1    // procedure to identify pivot cones
2    IdentifyPivotCones(
3                           /* input -- produced by IdentifyCandidatePivotNodes */
4                           HashTableOfCandidatePivotNodes,
5                           /* output -- given a pivot node key, returns pivot node structure that identifies
6                           the nodes and basis nodes of a pivot cone. */
7                           HashTableOfPivotNodeStructures,
8                           /* bookeeping -- used to support recursion of this procedure. */
9                           HashTableOfVisitedNodes)
10   {
11
12   /* Loop over each candidate pivot node identified by IdentifyCandidatePivotNodes. */
13   Foreach candPivotNode in HashTableOfCandidatePivotNodes
14   {
15           /* for each candidate pivot node, call IdentifyPivotConeInt */
16           IdentifyPivotConeInt(
17                           /* input */
18                           candPivotNode,
19                           /* bookeeping */
20                           HashTableOfVisitedNodes,
21                           /* output -- if pivot cone found */
22                           HashTableOfBasisNodes,
23                           /* another output -- if pivot cone found */
24                           HashTableOfPivotConeNodes);
25           /* basis of pivot cone can only have one node with a non-singleton range */
26           If (HashNumElementsWithNonSingletonValue(HashTableOfBasisNodes) ==
27           1)
28           {
29                   basisNode = HashGetElementWithNonSingletonValue(
30                                           HashTableOfBasisNodes);
31                   /* create structure for pivot cone comprising the non-singleton range node (aka, the
32                   "basisNode" and a hash table of the nodes comprising the pivot cone. */
33                   pivotStructure = CreatePivotStructure(basisNode,
34                                           HashTableOfPivotConeNodes);
35                   /* insert the pivot cone structure in a hash table to be accessed by value of
36                   candPivotNode key */
37                   HashInsert(HashTableOfPivotNodeStructures,
38                                           candPivotNode,
39                                           pivotStructure);
40           }
41
42           /* bookeeping -- clear hash tables for the finding of next pivot cone */
43           HashClear(HashTableOfBasisNodes);
44           HashClear(HashTableOfPivotConeNodes);
45           HashClear(HashTableOfVisitedNodes);
46   } /* end "Foreach candPivotNode" */
47   } /* end IdentifyPivotCones */
```

FIGURE 20A

```
1    // Internal procedure to identify pivot cone for a candidate pivot node.
2    IdentifyPivotConeInt(candPivotNode,
3                         HashTableOfVisitedNodes,
4                         HashTableOfBasisNodes,
5                         HashTableOfPivotConeNodes)
6    {
7    HashInsert(HashTableOfPivotConeNodes, candPivotNode, 0);
8    HashInsert(HashTableOfVisitedNodes, candPivotNode, 0);
9
10   Foreach inputNode of candPivotNode
11   {
12           /* test whether inputNode should be part of basis */
13           If (NodeIsPrimaryInput(inputNode) ||
14                   NodeIsBitSliceOperator(inputNode) ||
15                   ! NodeCanBeInPivotCone(inputNode) ||
16                   NodeHasSingletonValue(inputNode) ||
17                   ! AllFanoutsOfNodeVisited(inputNode, HashTableOfVisitedNodes))
18           HashInsert(HashTableOfBasisNodes, inputNode, 0);
19
20           Else /* inputNode should not be part of basis */
21           {
22                   If (NumberOfFanoutsOfNode(inputNode) > 1)
23                   {
24                           If(HashNumElementsWithNonSingletonValue(HashTableOfBas
25                           isNodes) == 1)
26                           {
27                                   // Recursively check if the pivot cone can be expanded further.
28                                   IdentifyPivotConeInt(inputNode,
29                                           CopyOfHashTableOfVisitedNodes,
30                                           NewHashTableOfBasisNodes,
31                                           NewHashTableOfPivotConeNodes);
32                                   If (HashNumElementsWithNonSingletonValue(
33                                           NewHashTableOfBasisNodes) == 1)
34                                   {
35                                           HashDelete(HashTableOfBasisNodes,
36                                           inputNode);
37                                           HashMerge(HashTableOfBasisNodes,
38                                                   NewHashTableOfBasisNodes);
39                                           HashMerge(HashTableOfPivotConeNodes,
40                                                   NewHashTableOfPivotConeNodes);
41                                           HashTableOfVisitedNodes =
42                                           CopyOfHashTableOfVisitedNodes;
43                                   }
44                           }
45                   }
```

FIGURE 20B

```
1          /* number of fanouts of inputNode = 1 */
2          Else
3                  IdentifyPivotConeInt(inputNode,
4                          HashTableOfVisitedNodes,
5                          HashTableOfBasisNodes,
6                          HashTableOfPivotConeNodes);
7
8          } /* end inputNode should not be part of basis */
9      } /* end "Foreach inputNode" */
10  } /* end "IdentifyPivotConeInt" */
```

METHOD AND APPARATUS FOR IMPROVING EFFICIENCY OF CONSTRAINT SOLVING

CROSS REFERENCE TO RELATED APPLICATIONS

This application is related to the following four U.S. patent applications, all of which are herein incorporated by reference in their entirety:

"Method and Apparatus For Improving Efficiency of Constraint Solving," filed on May 2, 2005, having inventors Mahesh A. Iyer and Vikram Saxena, application Ser. No. 11/120,921 and having U.S. Postal Service Express Mail No. EV587-184-895US.

"Method and Apparatus For Solving Constraints," filed on Aug. 16, 2003, having inventor Mahesh A. Iyer, and having U.S. patent Office application Ser. No. 10/641,845.

"Method and Apparatus For Case-Based Learning," filed on Sep. 17, 2003, having inventor Mahesh A. Iyer, and having U.S. patent Office application Ser. No. 10/666,765.

"Method and Apparatus For Solving Bit-Slice Operators," filed on Sep. 17, 2003, having inventor Mahesh A. Iyer, filed with a docket number of 06816.0506CON2 and having U.S. patent Office application Ser. No. 10/666,964.

FIELD OF THE INVENTION

The present invention relates generally to the solution of sets of constraints, and more particularly to techniques for improving the efficiency of constraint solving.

BACKGROUND OF THE INVENTION

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into a physical circuit specification through processes, well known to those of ordinary skill in the art as "synthesis," involving translation and optimization. Examples of an HLHDL are:

1. IEEE Standard 1364-2001, for the Verilog Hardware Description Language. The Institute of Electrical and Electronics Engineers, Inc., 345 East 47$^{th}$ Street, New York, N.Y. 10017-2394, USA.
2. IEEE Standard 1076-1993, for the VHDL Hardware Description Language. ISBN: 1559373768, August 1994. The Institute of Electrical and Electronics Engineers, Inc., 345 East 47$^{th}$ Street, New York, N.Y. 10017-2394, USA.

An HLHDL description can be verified by simulating the HLHDL description itself, without translating the HLHDL to a lower-level implementation. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under verification (DUV) can be accomplished much more quickly in an HLHDL than after the DUV has been translated into a lower-level, more circuit-oriented (e.g., gate-level) implementation.

The verification of HLHDL descriptions has been aided through the development of Hardware Verification Languages (or HVLs). An HVL can be implemented and supported by a test-bench automation (TBA) tool. Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUV, particularly those DUVs expressed in an HLHDL, to be tested by stimulating certain inputs of the DUV and monitoring the resulting states of the DUV.

Most HVLs include a programming mechanism by which to specify constraints on a set of variables. Constraints have the advantage of permitting "legal" sets of inputs to a DUV (i.e., inputs to the DUV that simulate the DUV's environmental restrictions) to be specified in a declarative programming manner that is often easier to specify than, for example, a procedural approach. Such randomly selected solutions to these constraints can be used to provide stimulus to the DUV. Consequently, there is a need for an efficient constraints solving system for use within TBA tools.

A high-level view of this commonly used functional verification methodology is depicted in FIG. 1A.

The high-level test bench is written in an HVL, that is supported by the underlying TBA tool, and has two main goals. First, the test bench seeks to apply random stimulus and/or directed tests to the DUV by interfacing to a simulator. Second, the test bench seeks to analyze results from the simulation by performing assertion checking and by measuring the functional coverage. Most designs have assumptions on how they interact with their environment. A goal of the test-bench is to generate random stimuli to the DUV that satisfy these environmental restrictions. Consequently, most commercial and industry-standard HVLs provide means to specify constraints on certain variables (that are declared within the test-bench) and the ability to randomize a certain set of these variables upon demand. The constraints themselves could be arbitrary expressions on signed or unsigned variables with varying bit-widths using the high-level operators supported by the HVL. The results of the randomization specified by the test-bench are translated (through procedural code within the test-bench) by the TBA tool into legal random stimuli to the DUV. When control is handed over to the simulator of the DUV, the effect of the newly-generated stimulus from the TBA tool is simulated until there are no more events for the simulator in the current clock cycle. At this point, control is handed back to the test-bench, which does assertion checking for the truth of certain properties (based on the current signal values of the DUV) and measures functional coverage (as defined by test-bench criteria). In addition, the test bench can receive feedback from the DUV, in the form of state variables (sv's), that it uses to adaptively adjust the course of its test generation. The constraints in the test-bench can also contain test-bench state variables (sv's). The test-bench, through the TBA tool, then generates the next set of random stimuli to the DUV, by finding a solution to the random variables of its constraints, given the current values for the sv's, and the process continues, until the test-bench finishes.

While constraints provide a powerful specification language, for such applications as design verification, finding an assignment to their variables that satisfies them can be complex. It is therefore desirable to have improved methods for finding solutions to a constraint or a set of constraints.

SUMMARY OF THE INVENTION

Please refer to the Glossary of Selected Terms, included at the end of the Detailed Description, for the definition of selected terms used in the below Summary.

Summary of Overview:

The present invention comprises techniques for improving the efficiency by which combinational constraint expressions can be solved. Constraints-solving procedures, to which the efficiency-improving techniques of the present invention can be applied, are described in the '845, '765 and '964 applications. Certain material of the '845, '765 and '964 applications is also re-presented herein.

From an input set of constraints to be solved, a high-level representation, referred to herein as a "constraint set representation" (or CSR), is determined. The CSR is discussed in detail in the '845, '765 and '964 applications, some of which is re-presented herein. Each time a CSR solver is invoked, a particular solution to the CSR can be produced.

The present invention comprises techniques for increasing the efficiency (or computing speed) by which solutions to a CSR can be found by identifying of a type of subset, of the nodes of a CSR, referred to herein as a "blockable subset." A blockable subset requires no further application of implication or other learning procedure in order that a solution to a CSR can be produced.

A blockable subset can be identified at any point during a CSR solving process. Once identified, the nodes of the blockable subset can be marked as "blocked." The learning and implication procedures, used as part of a CSR solving process, can be designed to skip nodes marked as blocked. By skipping the processing of nodes marked as blocked, the process by which a CSR solution is found can be shortened (and therefore accomplished in less time).

The identification of a particular blockable subset "x" is typically associated with certain conditions "conds4_x," about the CSR, being true. If and when, during the CSR solving process, the conditions conds4_x no longer hold, then the nodes of "x" need to be unblocked. Changes to a CSR, that can cause conditions conds4_x to no longer hold, include the following: reversion of a CSR to an earlier state in the CSR solving process and a change in the sv's when the CSR solving process is invoked.

A high-level view, of an example process for finding solutions to a CSR, is presented.

During the execution of an HVL program, the CSR solver is called. Based upon the results of two decisions, one of three execution paths can be followed by the CSR solver.

All three execution paths share the following in common: the next-to-last step is performing a function called "ATPG" and the last step is reverting the state of the CSR to a state that existed before the ATPG step was performed.

ATPG is a term used herein to refer to a process for narrowing the range, of each rv of a CSR, to a single value.

The second execution path is comprised only of an ATPG step followed by a CSR state reversion step. The first and third execution paths, however, can share the following in common: the application of any combination of three techniques that attempt to limit the ranges of the CSR's rv's before ATPG is tried. The three techniques are referred to herein as: an implication engine (or IE), pivot node learning (or PNL) and case-based learning (or CBL). The IE and PNL are presented. CBL was presented in the '845, '765 and '964 applications.

The order of use of the three techniques, for each of the first and third execution paths, is as follows. The first execution path begins by applying the IE. PNL is then applied. Third, CBL is used. In the third execution path, the CSR (that resulted from prior uses of the IE, PNL and CBL) can no longer be relied upon because at least one sv has changed. Therefore, the actions of this execution path include unblocking any nodes that had previously been blocked. The IE is then applied. A test is done to determine whether any pivot cones, identified by a prior application of PNL, are still usable. For each pivot cone that is still usable, performance of PNL is bypassed and control passes to a CBL procedure.

While some of the above discussion of a CSR solver is a re-presentation of material presented in the '845, '765 and '964 applications, there are also differences relating to the present invention. These differences include the following.

The IE can perform three major operations: forward implications, backward implications and justified node blocking (JNB). While forward and backward implications are presented in the '845, '765 and '964 applications, JNB is a new efficiency-improving technique for identifying a type of blockable subset. Also, since the IE is used within the ATPG step, a discussion is included on how changes in IE operation effect operation of ATPG.

Like JNB, PNL is another new efficiency-improving technique based upon identifying another type of blockable subset. The type of blockable subset identified by PNL is referred to herein as a "pivot cone."

The above discussion of a CSR solver also differs from the '845, '765 and '964 applications in presenting techniques for reusing pivot cones.

CBL differs from the 845, '765 and '964 applications in its skipping, for application of CBL, those UBNs marked as blocked. Also, due to the fact that PNL operates on the UBNs of a CSR before CBL is applied, there can be a difference in the order in which CBL processes the UBNs.

Since the above discussion of a CSR solver encompasses identification of blockable subsets, reversion to earlier states of the CSR solving process also includes techniques for unblocking blocked nodes. These unblocking techniques were not presented in the '845, '765 and '964 applications.

A sub-section is presented to address each major functional unit introduced above.

Summary of ATPG:

All the random variables (rv's) of a CSR, not currently limited to a single value (referred to herein as an "available" rv), are identified such that, from among such available rv's, a current decision variable (dv) can be selected. If there are no available rv's, then all the rv's have been limited to a single value and a solution to the input constraint set has been found.

The range of the current dv is limited to encompass a single value.

Once a value has been selected for the current dv, the IE can be applied to the resulting CSR. The IE can return a record (the "IE record") that indicates the following: the current dv and the value it was limited to; the old and new values for any nodes of the CSR that were changed as a result of running the IE; and (since the IE can include the new technique of JNB) any nodes that were marked as blocked.

Using the IE record a reversion record can be prepared and pushed onto a reversion stack.

If no conflict results from the IE then ATPG can continue with picking the next current dv.

However, if a conflict does result from the IE, the state of the CSR can be reverted to its state prior to the last application of the IE. This can include unblocking any nodes marked as blocked by the last IE invocation, if such invocation used JNB. The value causing the conflict can be removed from the range of the current dv.

If all the single values for the current dv have not been exhausted, the current dv is limited to another single value of its range. If, however, all the single values for the current dv have been exhausted, ATPG will next try backtracking to the prior current dv. If there is no previously current dv to backtrack to, the ATPG procedure ends in FAILURE.

If there is a previously current dv to backtrack to, the state of the CSR can be reverted to its state prior to the selection of the current dv.

While much of the above ATPG discussion is a re-presentation of material presented in the '845, '765 and '964 applications, some of the differences, related to the present invention, are as follows.

Wherever the IE is run, it can also include running the new technique of JNB.

Wherever reversion is done, it can also include unblocking blocked nodes.

Summary of the Implication Engine:

The IE presented herein, compared with the '845, '765 and '964 applications, contains the new technique of JNB.

Operation of the IE, in addition to that of JNB, is presented in order to conveniently provide context.

In general, the IE seeks to further narrow ranges of a CSR by attempting to discover implications of a CSR's current state.

Operation of an IE can include any or all of the following techniques: forward implication, backward implication and justified node blocking. If a conflict results from the IE process, then a solution to the input constraint set does not exist and it can return a value of FAILURE to its calling procedure.

As part of the implication process, as performed by the implication engine, when a node evaluates to a new range as a result of an implication, an IE record can be created. The old and new values of the changed node can be added to an IE record. If JNB causes new nodes being blocked, the newly blocked nodes can also be indicated in the IE record.

For each type of operator, that can occur in a CSR, algorithms can be implemented to perform any or all of the following across each CSR node representing such operator: forward and backward implications. Some examples of such operator-specific implication algorithms are presented. A generic discussion of forward and backward implication follows.

In general, forward implication across an operator node is the process of determining a value range for that node's output using the value ranges of all its input nodes and the semantic functionality of that operator.

In general, backward implication, to an input of an operator node, is the process of determining a range on that input using the ranges of other inputs of that operator node, the range of the output of that node and the semantic functionality of the operator.

Justified node blocking (or JNB) is a technique for identifying a type of blockable subset during either forward or backward implication.

Each time an implication (referred to generically as "IMP_1") is accomplished, either backward or forward, that changes a range, the OR and AND nodes of the CSR can be checked to determine which, if any, have become justified. Justification occurs when at least one input "i_1" to a node "x" (where "x" represents a Boolean function, such as OR or AND) is assigned a controlling range as a result of an implication IMP_1. The other inputs to node "x" shall be referred to as "i_2" to "i_n." Any input, of the set of inputs i_2 to i_n, can be referred to as "i_other."

For each input "i_other," its transitive fanin "i_other_tfi" is found. Each node "q" of i_other_tfi is a member of the blockable subset for i_other, and can be marked as blocked, if the following property is true: all paths from "q" to any primary output include traversing i_other.

Once a node is blocked, it can be skipped from further evaluation, for either a forward or backward implication.

Each time a CSR is reverted to an earlier state, nodes that had previously been identified as justified can be re-checked for whether they are still justified. If a node "x" becomes unjustified, any node "y" that was blocked, when "x" became justified, should be unblocked. An exception to unblocking a node "y" is if it still should be blocked due to another node that remains justified.

An example pseudo-code embodiment for an implication engine is presented.

Pseudo-code for operator-specific implication procedures is presented.

Changes to the example pseudo-code embodiment for an implication engine, to implement JNB, are presented.

An example of the operation of the IE pseudo-code is presented.

Summary of Pivot Node Learning:

PNL is a process by which pivot cones are identified and blocked in a CSR. An overview of a PNL process is as follows.

Pivot cones are identified.

A current pivot cone for processing is selected.

A set "not_curr_PC" is identified. not_curr_PC contains all nodes of the CSR that are not part of the current pivot cone and are not already marked as blocked.

The nodes of not_curr_PC are blocked.

Aggressive recursive learning is applied to any UBNs of the current pivot cone. Since the nodes of the CSR, other than the nodes of the current pivot cone, are blocked, aggressive learning is able to operate very efficiently on the nodes of the current pivot cone.

The nodes of not_curr_PC are unblocked and the nodes of the current pivot cone are blocked. The nodes of the current pivot cone can be blocked since the aggressive recursive learning has extracted from such nodes all benefit that can be obtained from a CBL type learning procedure.

Once there are no more pivot cones to process, a return from the PNL process can be performed.

A definition, for a blockable subset referred to as a pivot cone, is presented.

The root of a pivot cone, called a "pivot node," Is also defined.

A requirement, for a node to be a pivot node, is that the range of the node contain only a single value (also referred to herein as a "singleton range").

A requirement, for a node to be a member of a pivot cone, is that the operator of the node be "complete."

The nodes that drive the leaf nodes of a pivot cone are referred to herein as its "basis" nodes.

Non-aggressive recursive learning (or simply, recursive learning) is presented in the '845, '765 and '964 applications. A summary of recursive learning is presented.

Non-aggressive recursive learning differs from aggressive recursive learning as follows. Non-aggressive recursive learning will search a particular CSR, for opportunities in which to apply recursive learning, to a limited recursion depth. In contrast, aggressive recursive learning has no limit on the recursion depth to which it will search.

Aggressive recursive learning is applied within pivot cones since such cones are intended to be blocked off from any further evaluation for the applicability of implications or learning procedures. To permit aggressive recursive learning to be applied, however, the PNL process can include blocking off the nodes of the CSR, except for the pivot cone to which aggressive learning is to be applied.

An example OpenVera HVL, to which a PNL process is applied, is presented. To put the example in a fuller context, discussion of it begins with discussion of a CSR solver process.

Pseudo-code for pivot cone identification is presented.

Pseudo-code for aggressive recursive learning is presented.

Differences, between the aggressive recursive learning pseudo-code and the recursive learning presented in the '845, '765 and '964 applications, is presented.

An example application, of the pseudo-code for pivot cone identification, is presented.

An example application, of the pseudo-code for aggressive recursive learning, is presented.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 5 presents a procedure, called "ImplyValuesInCircuitFe."

FIG. 6 contains an example pseudo-code embodiment, called "ForwardImply."

FIG. 7 contains an example pseudo-code embodiment, called "BackwardImply."

FIGS. 8A-8B present pseudo-code for look_for_justified_nodes_and_block.

FIGS. 10, 11A-11C, 12 and 13 present pseudo-code for aggressive recursive learning.

FIG. 14D shows the result of applying aggressive recursive learning to the pivot cone of FIG. 14C.

FIG. 14E shows the result of applying ATPG to find a particular solution for FIG. 14D.

FIGS. 17-19 and 20A-20B present pseudo-code for pivot cone identification.

DETAILED DESCRIPTION OF PREFERRED EMBODIMENTS

Figure 1A:
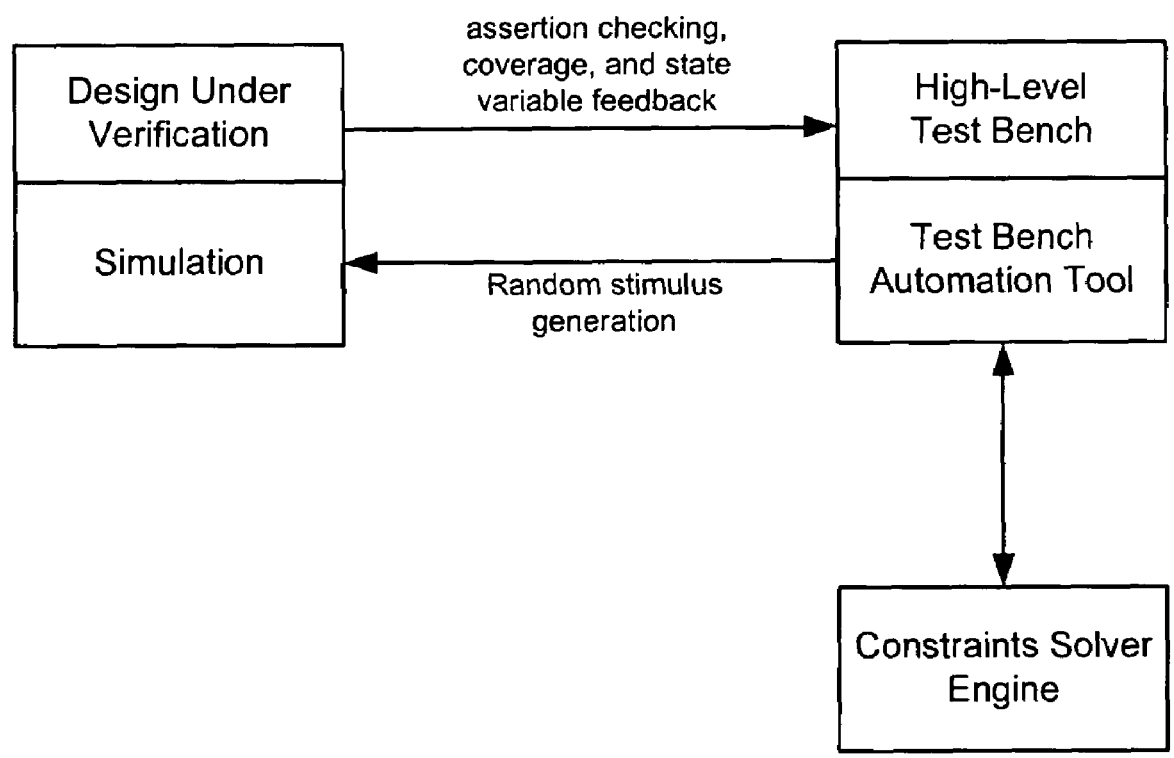
FIG. 1A presents a high-level view of a commonly used functional verification methodology.

Please refer to the Glossary of Selected Terms, included at the end of this Detailed Description, for the definition of certain selected terms used below.

Reference will now be made in detail to preferred embodiments of the invention, examples of which are illustrated in the accompanying drawings. Wherever possible, the same reference numbers will be used throughout the drawings to refer to the same or like parts.

Table of Contents to Detailed Description

1. Constraints Solving
   1.1. Overview
   1.2. ATPG
   1.3. Implication Engine
      1.3.1. Overview
         1.3.1.1. Forward Implication
         1.3.1.2. Backward Implication
         1.3.1.3. Justified Node Blocking
      1.3.2. Pseudo-Code
         1.3.2.1. Overview
            1.3.2.1.1. ImplyValuesInCircuitFe
            1.3.2.1.2. ForwardImply
            1.3.2.1.3. BackwardImply
            1.3.2.1.4. Levelization
            1.3.2.1.5. Operator-Specific Implication Procedures
         1.3.2.2. Justified Node Blocking
         1.3.2.3. Example
   1.4. Pivot Node Learning
      1.4.1. Overview
         1.4.1.1. Pivot Node and Pivot Cone
         1.4.1.2. Aggressive Recursive Learning
         1.4.1.3. Complete and Incomplete Operators
         1.4.1.4. PNL Example
      1.4.2. Pseudo-Code
         1.4.2.1. Pivot Cone Identification
            1.4.2.1.1. IdentifyPivotNodesAndCones
            1.4.2.1.2. IdentifyCandidatePivotNodes
            1.4.2.1.3. IdentifyPivotCones
            1.4.2.1.4. IdentifyPivotConeInt
         1.4.2.2. Aggressive Recursive Learning
            1.4.2.2.1. PerformLearningInCircuitFe
            1.4.2.2.2. PerformLearningInCircuit
            1.4.2.2.3. RecursiveImplyDecisionValue
            1.4.2.2.4. RecursiveLearnAndImply -continued Table of Contents to Detailed Description 1.4.2.3. Pivot Cone Identification Example
        1.4.2.4. Aggressive Recursive Learning Example
    1.5. Pivot Cone Re-Use
    1.6. Reversion to Previous CSR State
    1.7. Case-Based Learning
2. Constraint Representation
    2.1. Example HVL
    2.2. CSR
    2.3. Example CSR
    2.4. Definition of Justification
    2.5. Justification of Boolean Nodes
    2.6. Definition of Range and Interval
3. Operator-Specific Pseudo-Code
    3.1. Forward Propagation
        3.1.1. + Operator:
        3.1.2. − Operator:
        3.1.3. == Operator:
        3.1.4. && Operator:
        3.1.5. || Operator:
    3.2. Backward Propagation
        3.2.1. + Operator:
        3.2.2. − Operator:
        3.2.3. == Operator:
        3.2.4. && Operator:
        3.2.5. || Operator:
4. Hardware Environment
5. Glossary of Selected Terms 1. Constraints Solving 1.1. Overview The present invention comprises techniques for improving the efficiency by which combinational constraint expressions can be solved. Constraints-solving procedures, to which the efficiency-improving techniques of the present invention can be applied, are described in the '845, '765 and '964 applications. Certain material of the '845, '765 and '964 applications is also re-presented herein.

From an input set of constraints to be solved, a high-level representation, referred to herein as a "constraint set representation" (or CSR), is determined. The CSR is discussed in detail in the '845, '765 and '964 applications, some of which is re-presented in section 2 ("Constraint Representation"). Each time a CSR solver is invoked, a particular solution to the CSR can be produced.

The present invention comprises techniques for increasing the efficiency (or computing speed) by which solutions to a CSR can be found by identifying of a type of subset, of the nodes of a CSR, referred to herein as a "blockable subset." A blockable subset requires no further application of implication or other learning procedure in order that a solution to a CSR can be produced.

A blockable subset can be identified at any point during a CSR solving process. Once identified, the nodes of the blockable subset can be marked as "blocked." The learning and implication procedures, used as part of a CSR solving process, can be designed to skip nodes marked as blocked. By skipping the processing of nodes marked as blocked, the process by which a CSR solution is found can be shortened (and therefore accomplished in less time).

The identification of a particular blockable subset "x" is typically associated with certain conditions "conds4_x," about the CSR, being true. If and when, during the CSR solving process, conds4_x no longer hold, then the nodes of "x" need to be unblocked. Changes to a CSR, that can cause conds4_x to no longer hold, include the following: reversion of a CSR to an earlier state in the CSR solving process and a change in the sv's when the CSR solving process is invoked.

Figure 1B:
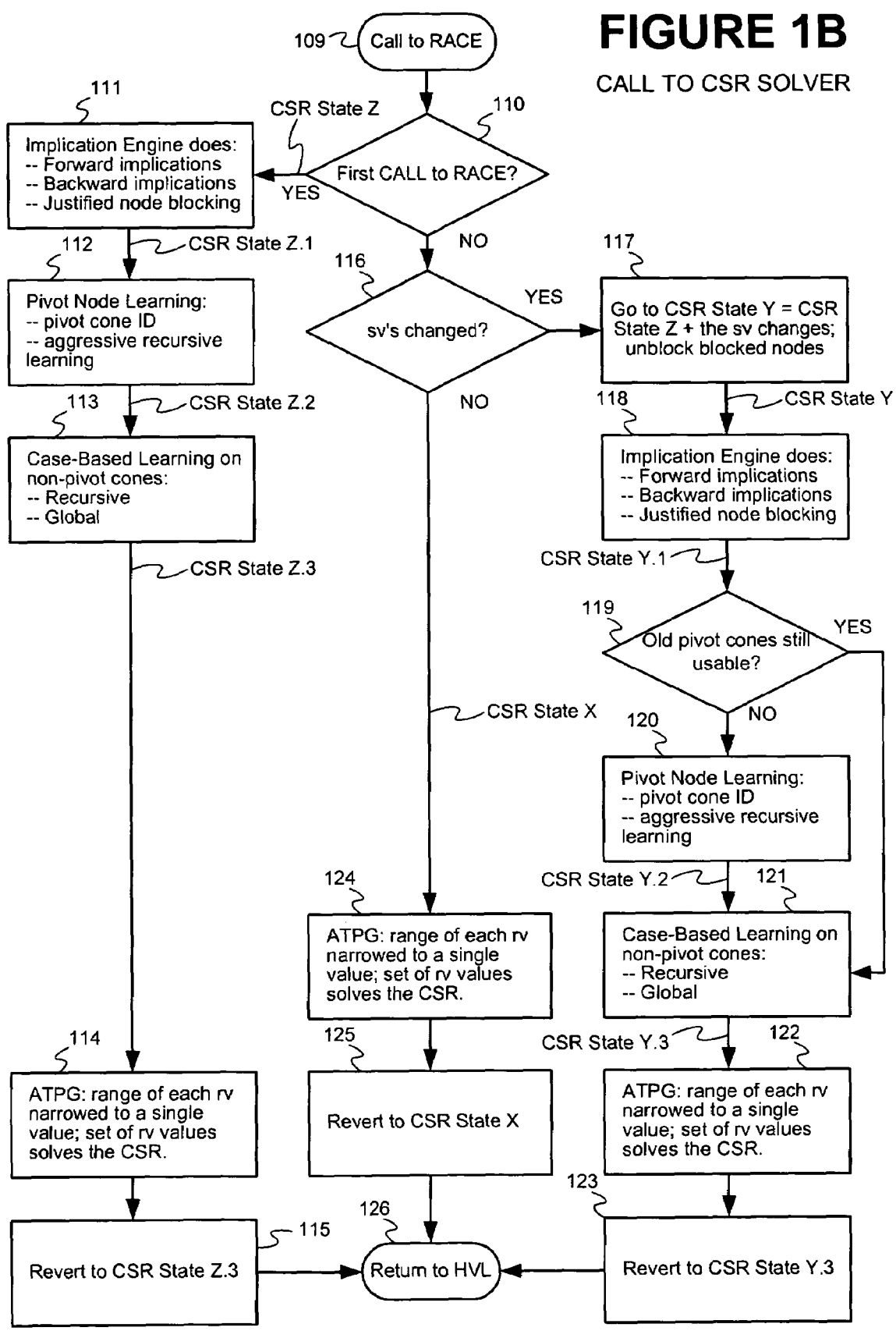
FIG. 1B presents a high-level view of an example process for finding solutions to a CSR.

FIG. 1B presents a high-level view of an example process for finding solutions to a CSR.

During the execution of an HVL program, the CSR solver is called. This call is represented in FIG. 1B by step 109. Based upon the results of two decisions (steps 110 and 116), one of three execution paths can be followed.

The first execution path is selected as follows. If the CSR solver is called for the first time, during the execution of an HVL program, the "yes" branch of step 110 is taken and steps 111 to 115 are performed. The second execution path is selected as follows. If the CSR solver is not being called for the first time (the "no" branch of step 110 is followed), and none of the sv's has changed since the last call to the CSR solver (the "no" branch of step 116 is taken), then steps 124 to 125 are performed. The third execution path is selected as follows. If the CSR solver is not being called for the first time (the "no" branch of step 110 is followed), but at least one of the sv's has changed since the last call to the CSR solver, the "yes" branch of step 116 is taken and steps 117 to 123 are performed.

All three execution paths share the following in common: the next-to-last step is performing a function called "ATPG" and the last step is reverting the state of the CSR to a state that existed before the ATPG step was performed in that execution path. For the first execution path, step 115 reverts the state of the CSR to a state "Z.3," which is the state of the CSR after step 113 had been accomplished but before ATPG step 114 had been started. For the second execution path, step 125 reverts the state of the CSR to a state "X," which is the state of the CSR after decision 116 had taken the "no" path but before ATPG step 124 had been started. For the third execution path, step 123 reverts the state of the CSR to a state "Y.3," which is the state of the CSR after step 121 had been accomplished but before ATPG step 122 had been started.

Figure 1C:
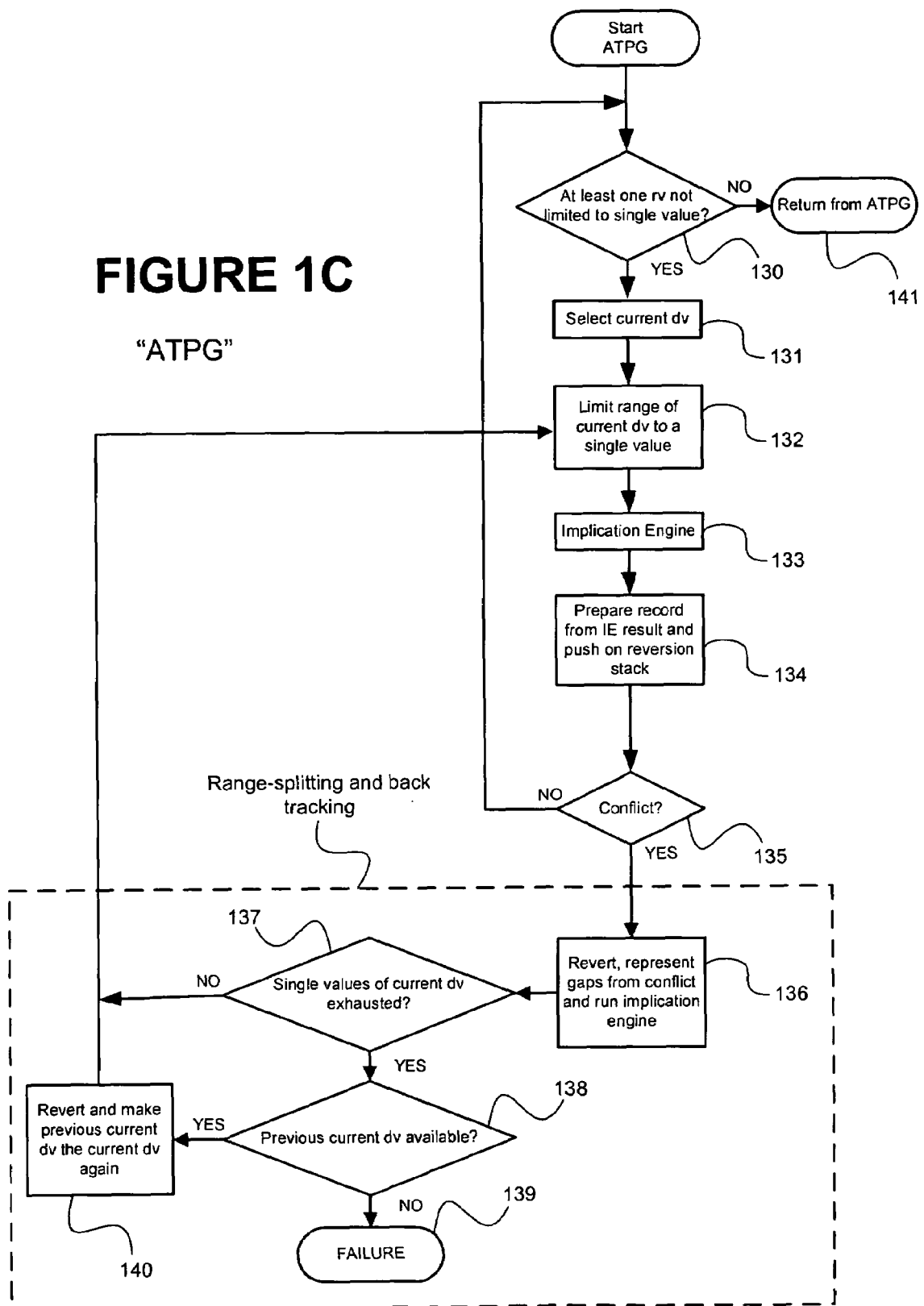
FIG. 1C presents an ATPG process.

ATPG is a term used herein to refer to a process for narrowing the range, of each rv of a CSR, to a single value. ATPG is discussed in section 1.2 ("ATPG") and is illustrated in FIG. 1C.

The second execution path is comprised only of an ATPG step followed by a CSR state reversion step. The first and third execution paths, however, can share the following in common: the application of any combination of three techniques that attempt to limit the ranges of the CSR's rv's before ATPG is tried. The three techniques are referred to herein as: an implication engine (or IE), pivot node learning (or PNL) and case-based learning (or CBL). The IE and PNL are discussed in the below sections 1.3 ("Implication Engine") and 1.4 ("Pivot Node Learning"). CBL, while discussed in the '845, '765 and '964 applications, is briefly represented in section 1.7 ("Case-Based Learning").

The order of use of the three techniques, for each of the first and third execution paths, is as follows. The first execution path begins by applying the IE (step 111). PNL is then applied (step 112). Third, CBL is used (step 113). In the third execution path, the CSR that resulted from prior use of the IE, PNL and CBL can no longer be relied upon because at least one sv has changed. Therefore, the third execution path begins (step 117) by bringing the state of the CSR to a state "Y" that is the state "Z" which the CSR was in just after the first call to the CSR solver, plus the changes in the sv's (relative to the values the sv's had in state "Z"). This change to a state "Y" is accompanied by unblocking any nodes that had previously been blocked. The IE is applied to CSR state Y (step 118). Step 119 then tests for whether any pivot cones, identified by a prior application of PNL, are still usable. If not, the "no" branch of decision 119 is taken and PNL (step 120) is performed again. However, if the pivot cones are still usable, the "yes" branch of decision 119 is taken, performance of PNL is bypassed, and control passes to a CBL procedure (step 121). It is also possible that a subset of the pivot cones are reusable, in which case PNL (step 120) is performed only for the pivot cones that are not reusable.

While some of FIG. 1B is a re-presentation of material presented in the '845, '765 and '964 applications, there are also differences relating to the present invention. These differences include the following.

The IE, as presented in FIG. 1B, can perform three major operations: forward implications, backward implications and justified node blocking (JNB). While forward and backward implications are presented in the '845, '765 and '964 applications, JNB is a new efficiency-improving technique for identifying a type of blockable subset. In the below re-presentation of the IE (see below section 1.3 "Implication Engine"), differences of the IE, from the '845, '765 and '964 applications, are discussed. Also, since the IE is used within the ATPG step, the below section 1.2 ("ATPG") discusses how changes in IE operation effect operation of ATPG.

Like JNB, PNL is another new efficiency-improving technique based upon identifying another type of blockable subset. The type of blockable subset identified by PNL is referred to herein as a "pivot cone." PNL is presented in below section 1.4 ("Pivot Node Learning").

FIG. 1B also differs from the '845, '765 and '964 applications in presenting techniques for reusing pivot cones (e.g., step 119 tests for whether a pivot cone is still usable after the sv's have changed).

CBL of FIG. 1B (steps 113 and 121) differs from the 845, '765 and '964 applications in its skipping, for application of CBL, those UBNs marked as blocked. Also, due to the fact that PNL operates on the UBNs of a CSR before CBL is applied, there can be a difference in the order in which CBL processes the UBNs.

Since FIG. 1B encompasses identification of blockable subsets, the reversion presented (i.e., steps 115, 125 and 123) also includes techniques for unblocking blocked nodes. These unblocking techniques were not presented in the '845, '765 and '964 applications.

The following sub-sections, of "Constraints Solving," are organized to address each of the major functional units introduced in this section: "1.2 ATPG," "1.3 Implication Engine," "1.4 Pivot Node Learning," "1.5 Pivot Cone Re-Use," "1.6 Reversion to Previous CSR State" and "1.7 Case-based Learning."

1.2. ATPG

The selection of the term ATPG, to represent the narrowing of the ranges of the rv's of a CSR to singleton values, is discussed in the Glossary.

Execution of ATPG is presented in FIG. 1C.

All the random variables (rv's) of a CSR, not currently limited to a single value (referred to herein as an "available" rv), need to be identified (see step 130) such that, from among such available rv's, a current decision variable (dv) can be selected. Note that if there are no available rv's, then all the rv's have been limited to a single value and a solution to the input constraint set has been found. The finding of a solution to the input constraint set is indicated in FIG. 1C by the ATPG procedure returning (see step 141).

The selection of a current dv (see step 131), from among the available rv's, can be accomplished according to a variety of different algorithms. A first approach is to select the current dv at random. A second approach is to compute a cost function, for each available rv, that is a metric of its desirability as a dv.

The range of the current dv is limited to encompass a single value (see step 132). Such range limitation of the dv may be performed gradually, using such techniques as iterative relaxation. Iterative relaxation is presented in the '845, '765 and '964 applications.

Once a value has been selected for the current dv, the IE can be applied to the resulting CSR (see step 133). The IE can return a record (the "IE record") that indicates the following: the current dv and the value it was limited to; the old and new values for any nodes of the CSR that were changed as a result of running the IE; and (since the IE can include the new technique of JNB) any nodes that were marked as blocked.

Using the IE record a reversion record can be prepared and pushed onto a reversion stack (step 134).

If no conflict results from the IE (the "no" path of step 135 is taken), then the procedure continues with picking the next current dv (at step 130).

However, if a conflict does result from the IE (the "yes" path of step 135 is taken), the procedure can do the following (see step 136). The state of the CSR can be reverted to its state prior to the last application of the IE. This can be accomplished by popping the top reversion record and using the popped record for converting the CSR back to its state prior to the last IE invocation. This can include unblocking any nodes marked as blocked by the last IE invocation, if such invocation used JNB. The value causing the conflict can be removed from the range of the current dv (see step 136) by splitting the dv's range of values (such splitting can be represented by adding gaps to the dv's range). The IE can be run again (see step 136) to gain any implications resulting from the additional range splitting. A range is considered split if it has more than one interval. For example, consider a range that has a single interval {0:15}. By removing the value {7:7} from this range, we get a split range {{0:6}, {8:15}}. The original range that had only one interval is now considered split because it has 2 intervals.

If all the single values for the current dv have not been exhausted, the "no" branch of step 137 is followed and the current dv is limited to another single value of its range (by step 132). If, however, all the single values for the current dv have been exhausted, the "yes" branch of step 137 is followed, and the procedure will next try backtracking to the prior current dv. In discussing this type of backtracking, the current dv shall be referred to as "x" and the previously current dv shall be referred to as "y."

Step 138 asks whether a previously current dv "y" is available (i.e., if "x" is the first rv to be made the current dv, then there is no "y" to backtrack to). If there is no previously current dv to backtrack to, the "no" path of step 138 is taken and the ATPG procedure ends in FAILURE (see step 139).

If there is a previously current dv to backtrack to, the "yes" path of step 138 is taken and step 140 can perform the following. The state of the CSR can be reverted to its state prior to the selection of the current dv at step 131. This can be accomplished by popping the top two reversion records from the reversion stack. The first popped record can be used for converting the CSR back to its state prior to the last IE invocation (including unblocking any nodes marked as blocked by the last IE invocation as a result of JNB). The second popped record can be used to convert the CSR back to the state before a value was chosen for previously current dv "y" (and to unblocked any nodes that had been marked as blocked as a result of "y" being assigned a value). In step 140 "y" can also replace "x" as the current dv. This permits "y" to be limited, by step 132, to a single value of its range other than the value previously settled upon that had led to a conflict for "x."

While much of FIG. 1C is a re-presentation of material presented in the '845, '765 and '964 applications, some of the differences, related to the present invention, are as follows.

Wherever the IE is run (i.e., steps 133 and 136), it can also include running the new technique of JNB.

Wherever reversion is done (i.e., steps 136 and 140), it can also include unblocking blocked nodes.

1.3. Implication Engine

As discussed above, the IE presented herein, compared with the '845, '765 and '964 applications, contains the new technique of JNB.

Operation of the IE, in addition to that of JNB, is presented in this section in order to conveniently provide context.

1.3.1. Overview

A core sub-system of an effective constraint solver can be a fast IE. In general, the IE seeks to further narrow ranges of a CSR by attempting to discover implications (please see Glossary for definition of "implication") of a CSR's current state. Towards this end, the IE manages such operations as node evaluation, scheduling and the extent to which implications are exhaustively explored.

The state of a CSR when the IE is called shall be referred to, for purposes of describing the operation of the IE, as an "initial" state. The initial state of the CSR comprises the following: initial ranges of the CSR and current values for the state variables. The initial ranges of the CSR are determined by such factors as: the requirement of the root-level node being justified to $\{1:1\}$, constant values specified as part of the constraints themselves, and the initial range values for random variables (that are primary inputs to the CSR) as determined by their precision and sign.

Operation of an IE can include any or all of the following techniques: forward implication, backward implication and justified node blocking. These techniques are described in more detail below. If a conflict results from the IE process, then a solution to the input constraint set does not exist and it can return a value of FAILURE to its calling procedure.

As part of the implication process, as performed by the implication engine, when a node evaluates to a new range as a result of an implication, the following actions can occur. The old and new values of the changed node can be added to an IE record. If JNB causes new nodes being blocked, the newly blocked nodes can also be indicated in the IE record. The new range can also be intersected with the old range of the node. This ensures that results of an implication cannot reduce what is known about a range, since the range of values encompassed can either remain constant (if the latest implication adds no information) or decrease (if progress is made by the implication) in size as the implication process proceeds. If an intersection results in a range that is the empty set, an inconsistent state has been reached (also referred to as a conflict).

For each type of operator, that can occur in a CSR, algorithms are implemented to perform any or all of the following across each CSR node representing such operator: forward and backward implications. Some examples of such operator-specific implication algorithms are presented in Section 3 ("Operator-Specific Pseudo-Code"). A generic discussion of forward and backward implication is presented in the two just-below sections (1.3.1.1 "Forward Implication" and 1.3.1.2 "Backward Implication").

1.3.1.1. Forward Implication

In general, forward implication across an operator node is the process of determining a value range for that node's output using the value ranges of all its input nodes and the semantic functionality of that operator. Such forward implication can be done using unbounded precision. For example, consider an adder with two 4-bit unsigned inputs that have value ranges $\{0:15\}$ and $\{5:10\}$. The output of this adder is evaluated and represented in 5-bit precision with the value range $\{5:25\}$. Note that for many operators (for example Boolean, relational and unary reduction operators), the output node value range can be either $\{0:0\}$, $\{1:1\}$, or $\{0:1\}$. For signed or unsigned semantics, these ranges can be represented in 2 bits of storage. For example, if we are forward evaluating a less-than comparator, where the two input ranges are ($\{0:3\}$, $\{5:6\}$) and $\{9:12\}$, respectively, the result would be $\{1:1\}$. On the other hand if the second range value was $\{6:12\}$ instead of $\{9:12\}$, the result would be $\{0:1\}$.

1.3.1.2. Backward Implication

In general, backward implication, to an input of an operator node, is the process of determining a range on that input using the ranges of other inputs of that operator node, the range of the output of that node and the semantic functionality of the operator. To illustrate a simple case of backward implication, consider a comparator node "c" (an operator node is identified herein, for purposes of illustration, with its output signal), that evaluates a<b, where a and b are 4-bit unsigned inputs to the comparator. Assume that $c=\{1:1\}$, $a=\{0:15\}$, and $b=\{0:15\}$. A backward evaluation to node "a" implies that $a=\{0:14\}$. Similarly, a backward evaluation to node "b" implies that $b=\{1:15\}$.

1.3.1.3. Justified Node Blocking

Justified node blocking (or JNB) is a technique for identifying a type of blockable subset during either forward or backward implication.

Each time an implication (referred to generically as "IMP_1") is accomplished, either backward or forward, that changes a range, the OR and AND nodes of the CSR can be checked to determine which, if any, have become justified. Justification occurs when at least one input "i_1" to a node "x" (where "x" represents a Boolean function, such as OR or AND) is assigned a controlling range as a result of an implication IMP_1. The other inputs to node "x" shall be referred to as "i_2" to "i_n." Any input, of the set of inputs i_2 to i_n, can be referred to as "i_other."

For each input "i_other," its transitive fanin "i_other_tfi" is found. Each node "q" of i_other_tfi is a member of the blockable subset for i_other, and can be marked as blocked, if the following property is true: all paths from "q" to any primary output include traversing i_other.

Once a node is blocked, it can be skipped from further evaluation, for either a forward or backward implication.

Because the implication and learning processes described herein are generally designed to either further limit the ranges of a CSR, or leave such ranges the same, once a Boolean node has become justified, it does not become unjustified, unless a reversion to an earlier state of the CSR is performed.

Each time a CSR is reverted to an earlier state, nodes that had previously been identified as justified can be re-checked for whether they are still justified. If a node "x" becomes unjustified, any node "y" that was blocked, when "x"

became justified, should be unblocked. An exception to unblocking a node "y" is if it still should be blocked due to another node that remains justified.

1.3.2. Pseudo-Code

FIGS. 5, 6-7 and 8A-8B present an example pseudo-code embodiment for the implication engine as discussed above. FIG. 5 presents a procedure, called "ImplyValuesInCircuitFe." The "Fe" of ImplyValuesInCircuitFe stands for "front end," and ImplyValuesInCircuitFe is an embodiment of an overall implication process that proceeds until the possible implications of a given CSR has been converged upon. FIG. 6 contains an example pseudo-code embodiment, "ForwardImply," of the forward implication process generally described in the above section 1.3.1.1 "Forward Implication." FIG. 7 contains an example pseudo-code embodiment, "BackwardImply," of the backward implication process generally described in the above section 1.3.1.2 "Backward Implication."

Additions to ForwardImply and BackwardImply, with respect to the '845, '765 and '964 applications, to implement JNB, are indicated in square brackets. In FIG. 6, additional material is indicated on line 8 and lines 19-20. In FIG. 7, additional material is indicated on line 8 and lines 20-21. The additional material includes invoking a procedure "look_for_justified_nodes_and_block," and this additional procedure is shown in FIGS. 8A-8B.

1.3.2.1. Overview

To present an example context, in which to utilize JNB, this section presents an overview of the operation of the pseudo-code of FIGS. 5, 6 and 7, without addressing the additional bracketed material for implementing JNB.

1.3.2.1.1. ImplyValuesInCircuitFe

ImplyValuesInCircuitFe has parameters "impVals" and "nodesImplied" (FIG. 5, line 5). The parameter "impVals" can be an appropriate data structure for representing pairs of a node and its range. impVals represents those nodes that the IE is directed to use as the starting point of its implications. The parameter "nodesImplied" can be an appropriate data structure for representing nodes whose ranges are changed as a result of the implications performed by ImplyValuesInCircuitFe.

When ImplyValuesInCircuitFe is used to perform IE step 111 of FIG. 1B, the value of impVals can be each leaf node, and the root node, of the CSR.

When ImplyValuesInCircuitFe is used to perform IE step 133 of FIG. 1C (the invocation of the IE following limitation of the current dv to a single value), the value of impVals can be a single pair of the current dv node and its selected range value.

ImplyValuesInCircuitFe calls the functions FowardImply and BackwardImply.

Step 1 of ImplyValuesInCircuitFe (FIG. 5, lines 7-8) sets the values of the passed-in impVals table onto the corresponding nodes of the CSR to be processed. Step 1 of ImplyValuesInCircuitFe also puts the values of impVals table into its corresponding nodesImplied table.

Step 2 of ImplyValuesInCircuitFe (FIG. 5, lines 9-14) creates an initial forward and backward queue for each level of the CSR on which IE is to operate. Step 2 also initializes the forward and backward queues, using the initial values for nodesImplied. Levelization is discussed in the below section "Levelization."

Step 3 of ImplyValuesInCircuitFe (FIG. 5, lines 15-19) invokes ForwardImply. FowardImply has parameters "forwardQueues," "backwardQueues," and "nodesImplied."

The parameter "nodesImplied" is a list of nodes whose ranges are changed as a result of the implication process of ForwardImply. The parameter "forwardQueues" contains levelized forward queues of the CSR that are used to accomplish forward implication. The parameter "backwardQueues" contains levelized backward queues. ForwardImply uses backwardQueues as an output parameter that is input to BackwardImply for backward implication.

Assuming step 3 is successful, step 4 of ImplyValuesInCircuitFe (FIG. 5, lines 20-26) invokes BackwardImply. BackwardImply takes the same set of parameters as FowardImply. As with FowardImply, the parameter "nodesImplied" is a list of nodes whose ranges are changed as a result of the implications performed by BackwardImply. In BackwardImply, however, the backward queues of backwardQueues are used to accomplish backward implications and forwardQueues is used as an output parameter that is input to ForwardImply for forward implication.

In step 5 (FIG. 5, lines 27-28) the following test is performed: if step 3 or step 4 is successful, and if there are still pending events for implication in the forward for backward queues, ImplyValuesInCircuitFe loops back to step 3.

In step 6 (FIG. 5, line 29), if the test of step 5 is not satisfied, ImplyValuesInCircuitFe returns the value of "retVal" as set by the last execution of ForwardImply or BackwardImply.

1.3.2.1.2. ForwardImply

The outer loop of ForwardImply iterates over each forward queue (FIG. 6, line 6). The iteration begins with the lowest level (i.e., leaf level) queue and proceeds towards the root level queue. The current forward queue, selected by the outer loop, is referred to as "forwardEvents."

The inner loop of iterates over each node of forwardEvents (FIG. 6, line 8). The current node, selected by the inner loop, is referred to simply as "node." The following steps are performed on each selection for "node."

Depending upon the operator represented by "node," the appropriate forward implication procedure is applied. Operator-specific forward implication procedures are discussed further in the below section 1.3.2.1.5 "Operator-Specific Implication Procedures." The result of the forward implication is stored in "newValue" (FIG. 6, line 10).

The value of "node," prior to application of an operator-specific forward implication procedure, is stored in "oldValue" (FIG. 6, line 11).

If newValue equals oldValue (FIG. 6, line 12), "node" is just scheduled for backward implications (FIG. 6, line 13). However, if newValue does not equal oldValue, the following steps are performed (see "else" of lines 15-28). The newValue and oldValue are intersected, with the result placed in "intersectValue" (FIG. 6, line 16). Assuming intersectValue is non-null, the following steps are taken (see lines 18-26). A pair, comprised of "node" and its intersectValue, is stored in nodesImplied (FIG. 6, line 21). The value of "node" is set to intersectValue (FIG. 6, line 22). "node" is scheduled for backward implications (FIG. 6, line 23). The immediate fanout of "node" is scheduled for forward implications (FIG. 6, lines 24-25).

1.3.2.1.3. BackwardImply

The outer loop of BackwardImply iterates over each Backward queue (FIG. 7, line 6). The iteration begins with the highest level (i.e., root level) queue and proceeds towards the leaf level queue. The current backward queue, selected by the outer loop, is referred to as "backwardEvents."

The first inner loop of iterates over each node of backwardEvents (FIG. 7, line 8). The current node, selected by the first inner loop, is referred to simply as "node."

The second inner loop of iterates over each input node (referred to as "input_node") of "node" (FIG. 7, line 10). If the range for input_node is not a singleton value (FIG. 7, line 12), the following steps are performed on each selection for "input_node" (see lines 13-29).

Depending upon the operator represented by "node," the appropriate backward implication procedure is applied (FIG. 7, line 14). Operator-specific backward implication procedures are discussed further in the below section 1.3.2.1.5 "Operator-Specific Implication Procedures." The result of the backward implication is stored in "newValue."

The value of "node," prior to application of an operator-specific backward implication procedure, is stored in "oldValue" (FIG. 7, line 15).

The newValue and oldValue are intersected, with the result placed in "intersectValue" (FIG. 7, line 16). Assuming intersectValue is non-null (meaning that BackwardImply does not return at line 17), the following steps are taken.

If newValue does not equal oldValue (FIG. 7, line 18), the following steps are performed (see lines 19-28). A pair, comprised of input_node and its intersectValue, is stored in nodesImplied (FIG. 7, lines 22-23). The value of input_node is set to intersectValue (FIG. 7, line 24). Input node is scheduled for backward implications (FIG. 7, line 25). The immediate fanout of input_node is scheduled for forward implications (FIG. 7, lines 26-27).

1.3.2.1.4. Levelization

Figure 2:
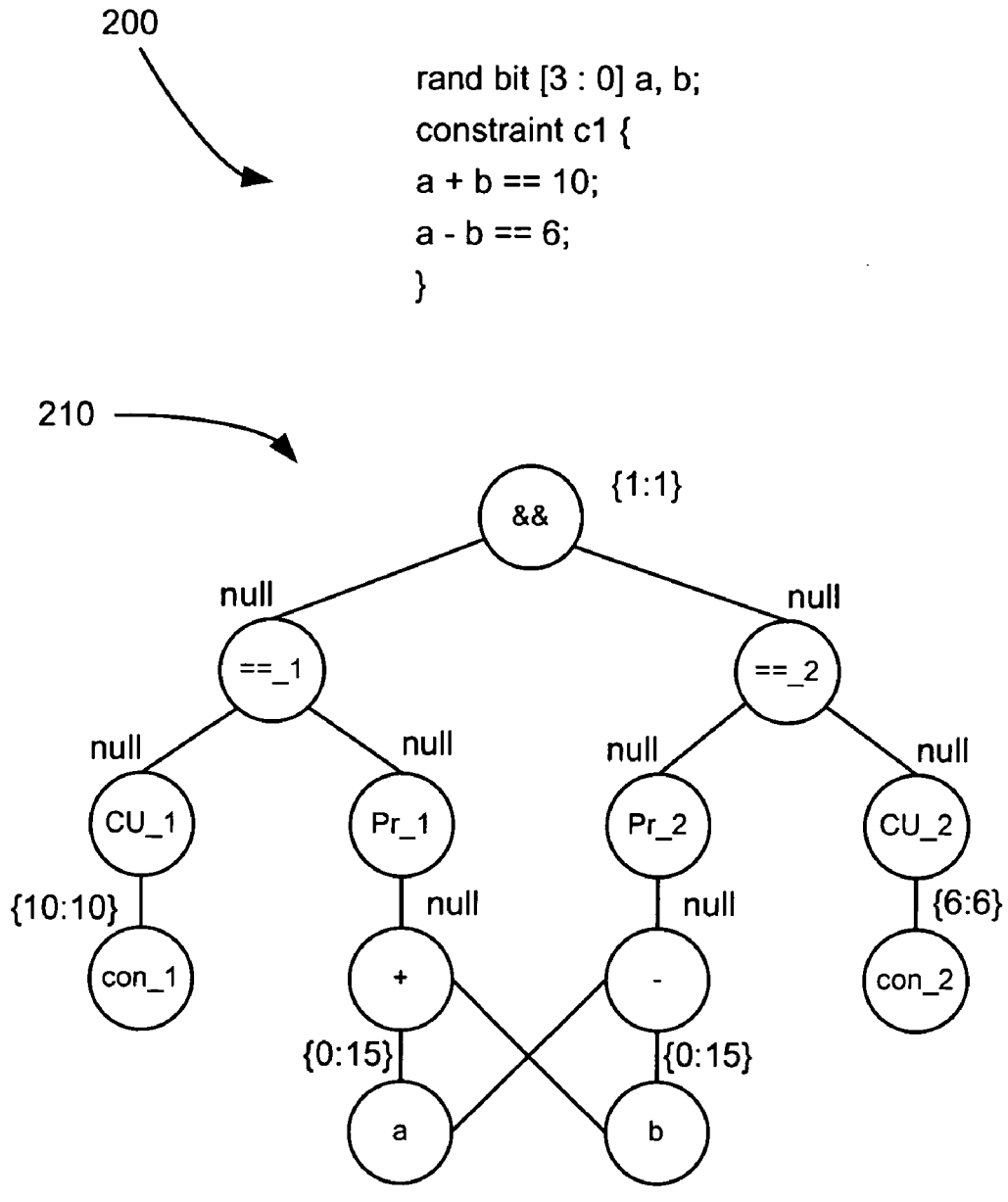
FIG. 2 presents an example used in conjunction with describing the operation of the IE pseudo-code.

Levels, for the purpose of the levelized queues, can be defined as follows for a CSR. All the leaf nodes are assigned an initial level, such as zero. In the example CSR 210 of FIG. 2 (produced from OpenVera HVL 200), from left to right, the following leaf nodes are assigned value zero: 10, "a," "b," and 6. The parent nodes of each leaf node is identified. For CSR 210, from left to right, these are: CU, +, −, and CU. Each parent of a leaf node is assigned a level that is one greater than the greatest level of any of its children. In the example of FIG. 2, all of the parent nodes are assigned the level of one. The levelization process then finds the parents of all the level one nodes. In the example of FIG. 2, from left to right, these are: ==, Pr, Pr, and ==. Each parent of a level one node is assigned a level one greater than the greatest level of any of its children, so long as all of its children have already been assigned a level. In the case of the two "==" nodes, each has a Pr node child that has not already been assigned a level and so these two nodes are not assigned a level. The two Pr nodes themselves, however, are each assigned a level of two. The levelization process continues in a likewise manner, where the next step is finding the parents of the two Pr nodes of level two. The levelization process continues to move up the CSR until the root node has been assigned a level. For the example of FIG. 2, the end result of the levelization process is indicated by numeral 220.

1.3.2.1.5. Operator-Specific Implication Procedures

The below section "Operator-Specific Pseudo-Code" presents pseudo-code for operator-specific implication procedures. The section is divided into two sub-sections: ForwardImply and BackwardImply. The pseudo-code of the ForwardImply sub-section can be utilized by ForwardImply on an operator-specific basis. Such pseudo-code can be invoked by line 10 of FIG. 6 that states: "newValue=forward evaluate node." Similarly, the pseudo-code of the BackwardImply sub-section can be utilized by BackwardImply on an operator-specific basis. Such pseudo-code can be invoked by line 14 of FIG. 7 that states: "newValue=backward evaluate to input_node."

The pseudo-code of "Operator-Specific Pseudo-Code" is written on an interval basis, while the above-referenced lines of ForwardImply and BackwardImply pass whole ranges of the node to be implied. Therefore, between the calls of ForwardImply and BackwardImply to an operator-specific pseudo-code, and the interval-basis pseudo-code of the "Operator-Specific Pseudo-Code", is additional code that generates cross-product combinations of intervals for the node to be implied. In addition, results from "Operator-Specific Pseudo-Code" need to be combined, on a cross-product basis, before they can be used by ForwardImply or BackwardImply.

For example, consider an AND node, with inputs "a" and "b," that is to be forward evaluated by ForwardImply. If the range of input "a" has two intervals, while the range for input "b" has three intervals, the number of cross-product combinations of intervals, each of which is to be processed by the "&&" operator pseudo-code of "Operator-Specific Pseudo-Code", is two times three or six.

1.3.2.2. Justified Node Blocking

Having presented a context for JNB in the above overview of the IE pseudo-code, this section discusses the additional square-bracketed material of FIGS. 6 and 7. As discussed above, the square-bracketed material is a way to change ForwardImply and BackwardImply such that JNB can be implemented.

In ForwardImply of FIG. 6 (at line 8), within the inner loop, if a node of the current forward queue has the property "blocked," it is skipped from further evaluation. Similarly, in BackwardImply of FIG. 7 (at line 8), within the first inner loop, if a node of the current backward queue has the property "blocked," it is skipped from further evaluation.

Within either ForwardImply or BackwardImply, if an implication produces a new value (with the new value referred to in the pseudo-code as "intersectValue") for a node, the procedure "look_for_justified_nodes_and_block" is called (look_for_justified_nodes_and_block is called at lines 19-20 of FIG. 6 and at lines 20-21 of FIG. 7). Pseudo-code for look_for_justified_nodes_and_block is shown in FIGS. 8A-8B.

In general, the operation of look_for_justified_nodes_and_block operates as follows, where the variable names used are the same as those found in the pseudo-code of FIGS. 8A-8B. look_for_justified_nodes_and_block checks whether a new value for a node "node" justifies any other node "output_node" in the fanout of "node." If "node" does, then look_for_justified_nodes_and_block finds the transitive fanin of each input "output_node_input" of "output_node," other than the input driven by "node," and blocks any node "tfi_node" of that transitive fanin if all paths from "tfi_node," to any primary output, include traversal of "output_node_input." A more detailed description of the pseudo-code of look_for_justified_nodes_and_block follows.

The new value produced for "node" is represented by the variable "intersectValue." intersectValue is tested for whether it is capable of justifying a Boolean OR node (see line 6, FIG. 8A) or a Boolean AND node (see line 31, FIG. 8A).

If intersectValue is capable of justifying a Boolean node, each node "output node" in the fanout of "node" is tested for whether it is a Boolean node of the appropriate type and whether the Boolean node has already been justified (see FIG. 8A, lines 11 and 36). Although the procedure is written for "output node" being a Boolean OR or AND node, for purposes of example, this procedure can apply to an "output_node" representing any Boolean function, so long as intersectValue is capable of justifying "output node."

If "output node" is justified, then each input "output_node_input" of "output node" is iterated over (see FIG. 8A, lines 15-16 and 40-41).

The transitive fanin of each "output_node_input" is found and each member node "tfi_node" of the transitive fanin is test for whether all paths from it, to any primary output, include "output_node_input" (see FIG. 8A, lines 20-25 and FIG. 8A, line 45 to FIG. 8B, line 1.

1.3.2.3. Example

Figure 3A:
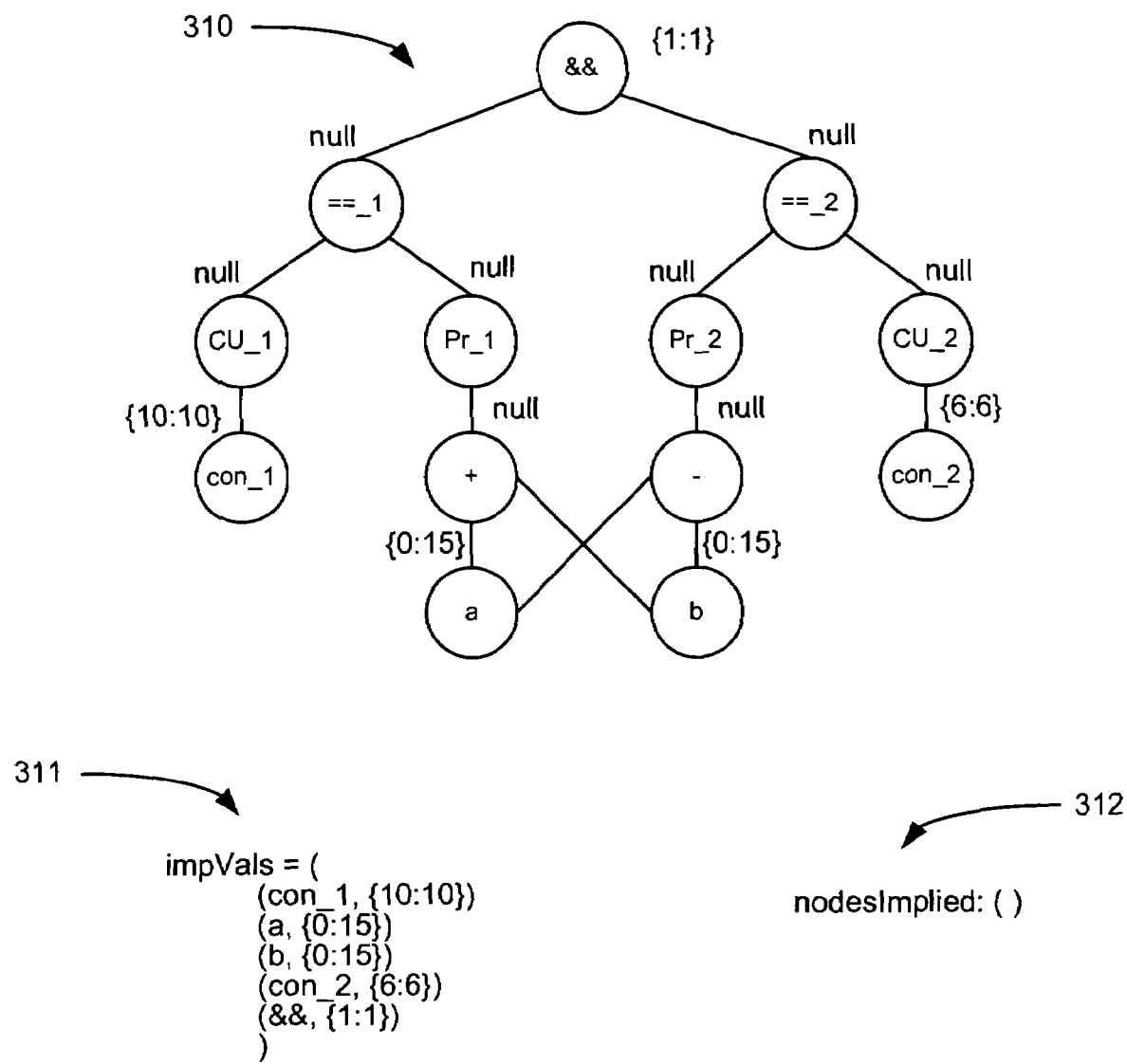
FIG. 3A presents an example value of the impVals parameter as passed to ImplyValuesInCircuitFe.

An example of the operation of the IE pseudo-code is presented in this section. The operation of the IE pseudo-code is described below in conjunction with processing the example CSR 210 of FIG. 2. CSR 210 can be produced from OpenVera HVL code 200. Numeral 220 of FIG. 2 depicts a levelization of the nodes of CSR 210. In this example ImplyValuesInCircuitFe is used to perform IE step 111 of FIG. 1B on CSR 210. Therefore, the impVals parameter passed to ImplyValuesInCircuitFe, indicated in FIG. 3A by numeral 311, sets the leaf nodes, and the root node, of CSR 210. In this case, impVals sets the leaf nodes, and the root node, to ranges they had already acquired by virtue of the source HVL.

Figure 3B:
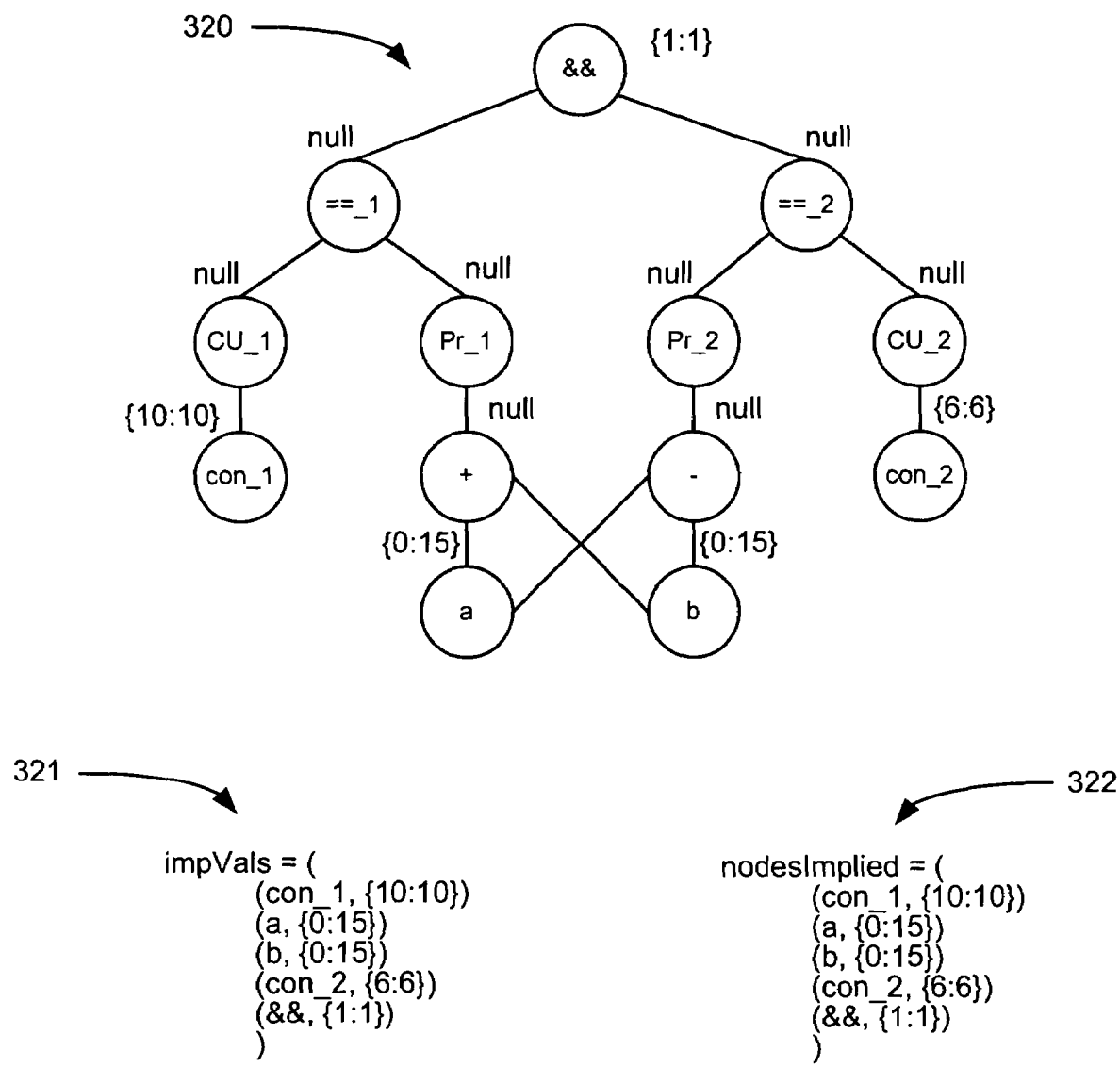
FIG. 3B presents a state of ImplyValuesInCircuitFe after step 1 has been accomplished.

Step 1 of ImplyValuesInCircuitFe sets the values of impVals table 311 onto the corresponding nodes of CSR 210, with the resulting CSR state indicated by numeral 320 in FIG. 3B. Step 1 of ImplyValuesInCircuitFe also puts the values of impVals table 321 into its nodesImplied table, indicated in FIG. 3B by numeral 322.

Step 2 of ImplyValuesInCircuitFe creates an initial forward and backward queue for each level of the CSR on which IE is to operate. For the example, the forward queues created are indicated by numeral 333 in FIG. 3C and the backward queues created are indicated by numeral 334. Step 2 also initializes the forward and backward queues, using the initial values for nodesImplied. In the example, the forward queue for level 1, of forward queues 333, has been initialized and the backward queue for level 4, of backward queues 334, has also been initialized.

Step 3 of ImplyValuesInCircuitFe invokes ForwardImply. The parameter "forwardQueues" contains levelized forward queues 333 that are used to accomplish forward implication. The parameter "backwardQueues" contains levelized backward queues 334.

Figure 3C:
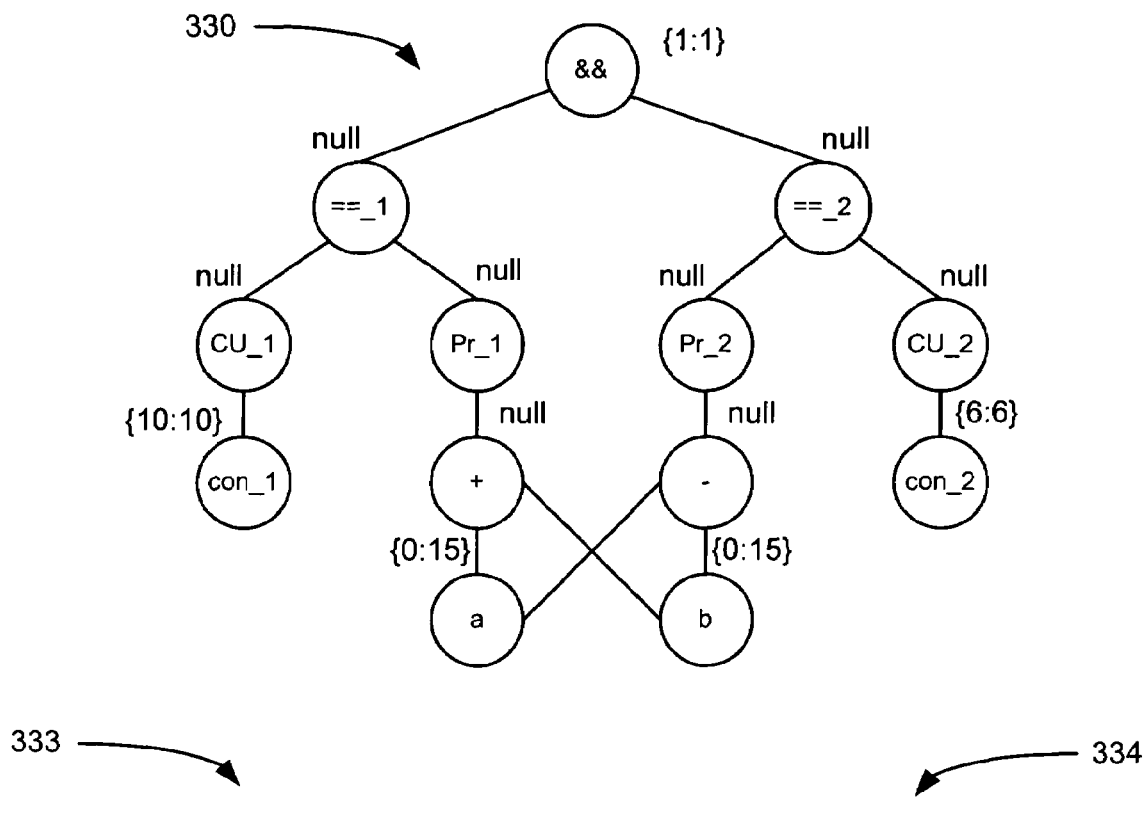
FIG. 3C presents a state of ImplyValuesInCircuitFe after step 2 has been accomplished.
Figure 4A:
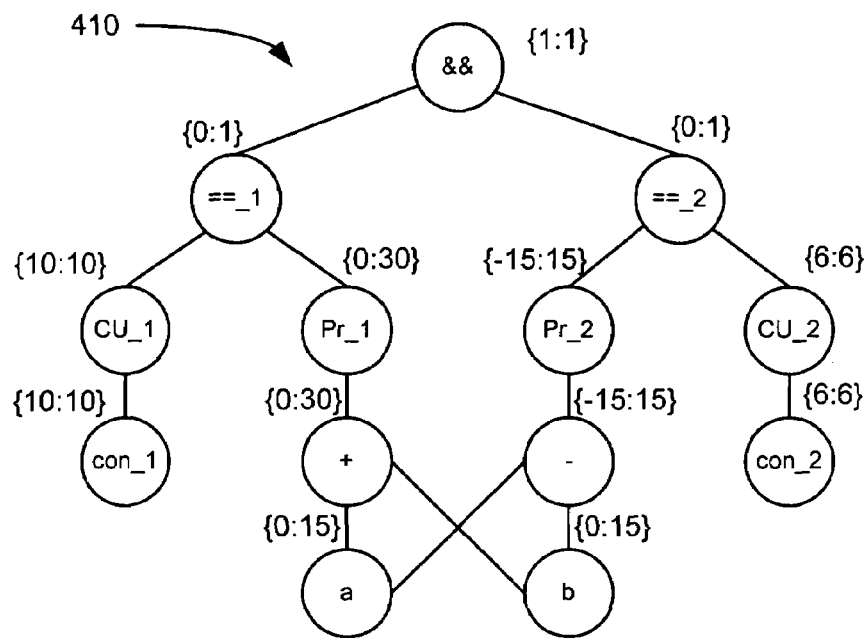
FIG. 4A shows the results of a simulated execution of ForwardImply on the state of FIG. 3C.

Starting with the state of FIG. 3C, a simulated execution of ForwardImply produces the state shown in FIG. 4A.

When ForwardImply is initially called by ImplyValuesInCircuitFe, the values of its parameters are shown in FIG. 3C.

ForwardImply's outer loop iterates over each forward queue 333, beginning with the forward queue for level 0 and ending with level 4. Each forward queue iterated over is assigned to forwardEvents.

The inner loop of ForwardImply iterates over each node of forwardEvents that is not marked as blocked. For purposes of this example, it is assumed that no nodes are blocked. Executions of the inner loop can cause nodes to be scheduled in both the forward and backward queues. Whenever a node is set to a controlling value, such as CU_1 being set to {10:10} in FIG. 4A, that inner loop iteration will also check for whether nodes should be marked as blocked in accordance with JNB. For the example, no nodes are blocked as a result of JNB.

Figure 4B:
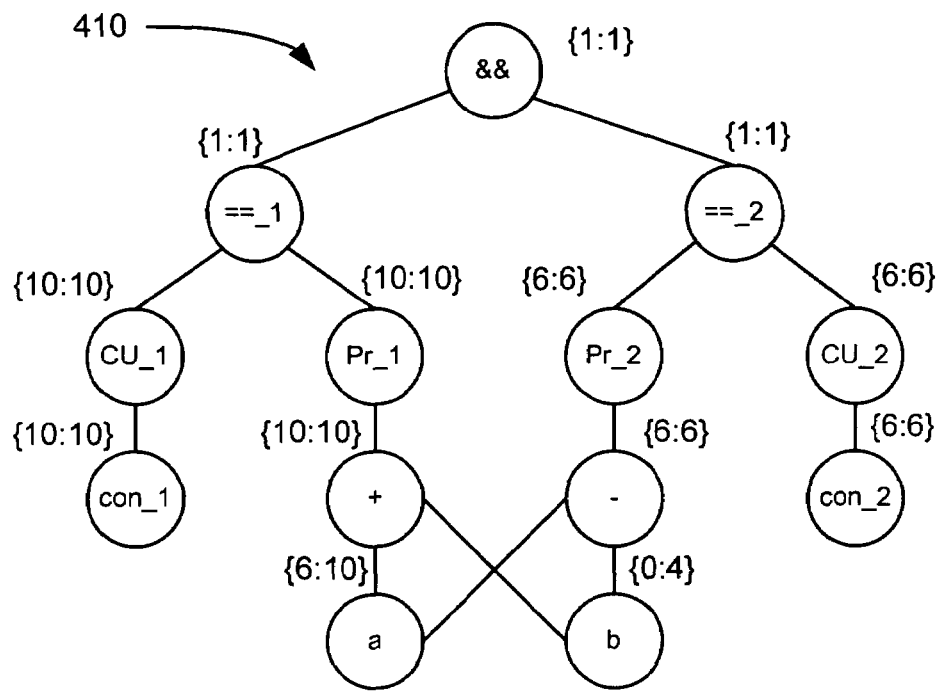
FIG. 4B shows the results of a simulated execution of BackwardImply on the state of FIG. 4A.

Starting with the state of FIG. 4A, a simulated execution of BackwardImply produces the state shown in FIG. 4B.

Assume BackwardImply is called by ImplyValuesInCircuitFe with the values of its parameters set as shown in FIG. 4A.

BackwardImply's outer loop iterates over backward queues 413, beginning with the backward queue for level 4 being assigned to backwardEvents, and ending with the backward queue for level 0. The first inner loop of BackwardImply iterates over each node of backwardEvents that is not marked as blocked. The second inner loop of BackwardImply iterates over each input_node of "node." Executions of the second inner loop cause nodes to be scheduled in both the forward and backward queues. Whenever a node is set to a controlling value, such as Pr_2 being set to {6:6} in FIG. 4B, that inner loop iteration will also check for whether nodes should be marked as blocked in accordance with JNB.

Once all the backward queues have been iterated over, BackwardImply returns.

The next step for ImplyValuesInCircuitFe is to call ForwardImply a second time (since, when BacwardImply returns, there are pending events in the forward queues of FIG. 4B).

ForwardImply's outer loop iterates over forward queues 412 of FIG. 4B, beginning with the forward queue for level 0. Each forward queue iterated over is assigned to forward Events.

The inner loop of ForwardImply iterates over each node of forwardEvents. Executions of the inner loop can cause nodes to be scheduled in both the forward and backward queues.

Figure 4C:
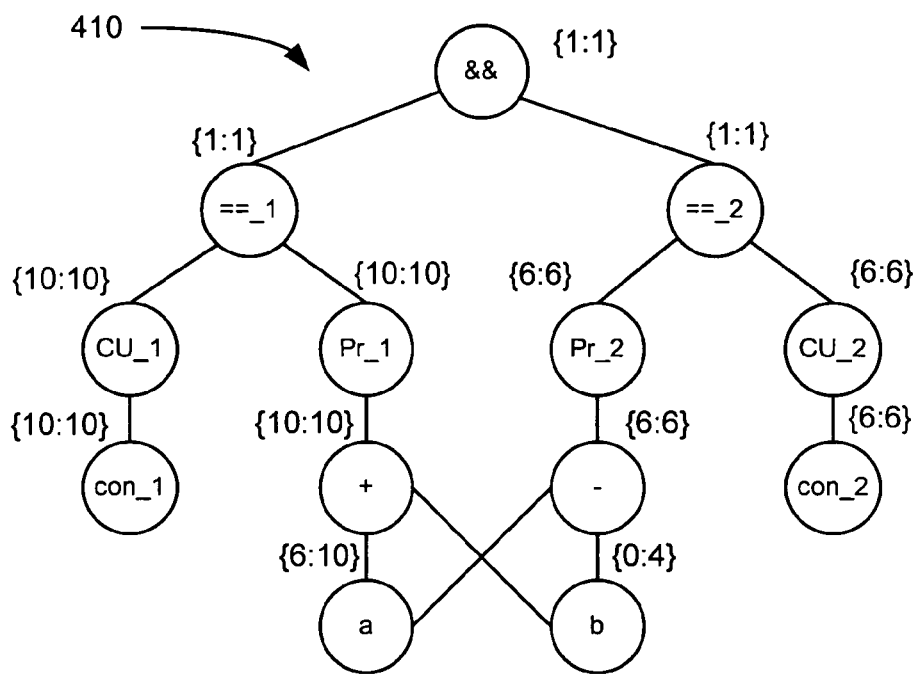
FIG. 4C shows the state of a CSR once a second call to ForwardImply returns.

Once the second call to ForwardImply returns, the state of the CSR, and of the forward and backward queues, is shown in FIG. 4C.

ImplyValuesInCircuitFe calls BackwardImply a second time (since there are pending events in the backward queues of FIG. 4C). Once the second call to BackwardImply returns, the state of the CSR, and of the forward and backward queues, is shown in FIG. 4D.

Figure 4D:
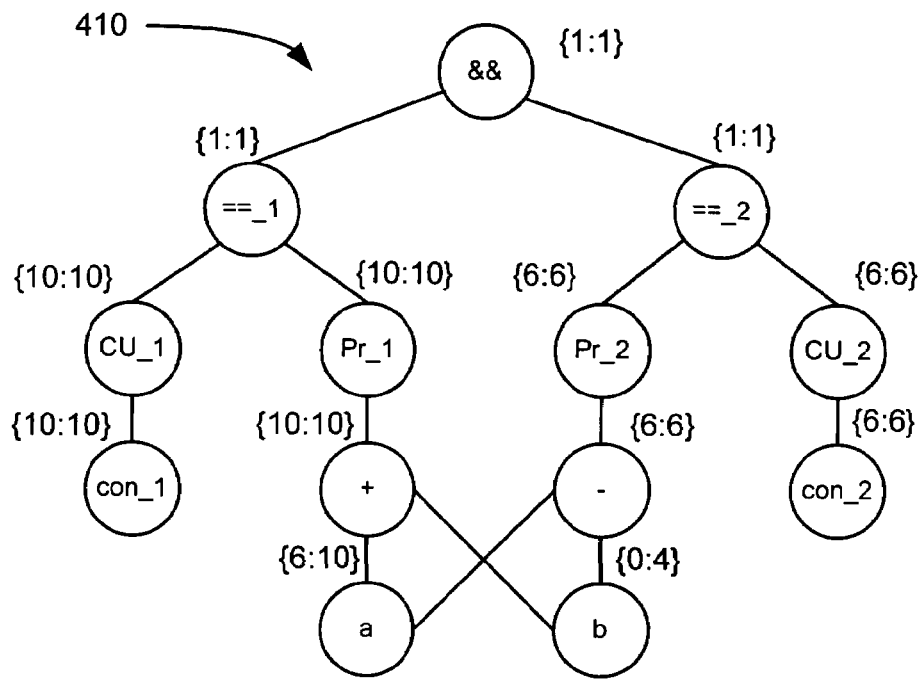
FIG. 4D shows the state of a CSR once a second call to BackwardImply returns.

When BackwardImply returns from its second execution, ImplyValuesInCircuitFe returns as well since there are no pending events in the forward or backward queues of FIG. 4D.

1.4. Pivot Node Learning 1.4.1. Overview

Figure 16:
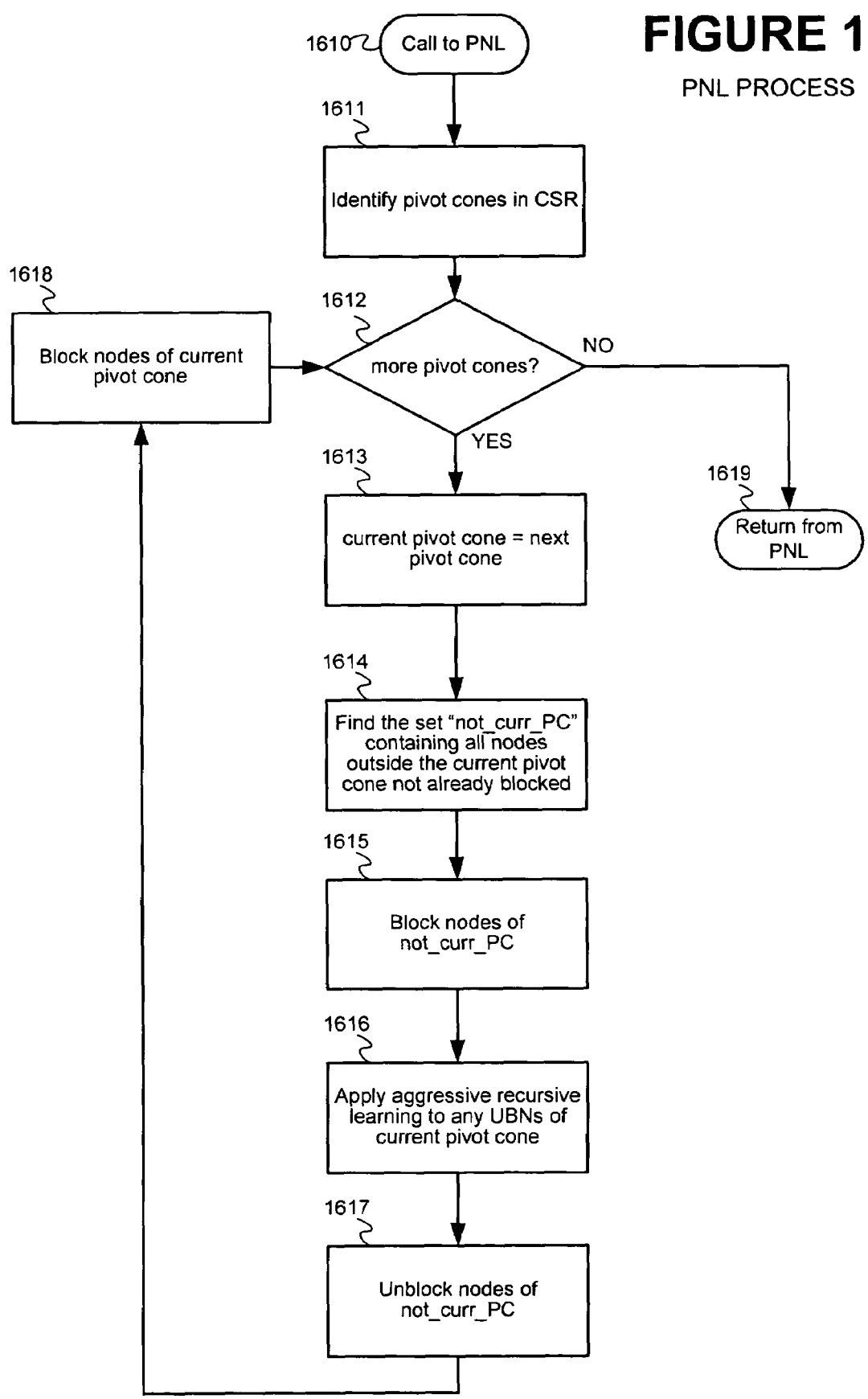
FIG. 16 presents an overview of PNL.

FIG. 16 presents an overview of a process, referred to herein as a pivot node learning or PNL, by which pivot cones are identified and blocked in a CSR.

Pivot cones are identified (step 1611). Pivot cones are defined in below section 1.4.1.1 "Pivot Node and Pivot Cone." Pseudo-code for accomplishing pivot cone identification is discussed in the below section 1.4.2.1 "Pivot Cone Identification."

As long as there are more pivot cones to be processed, the yes path of step 1612 is taken.

A current pivot cone for processing is selected (step 1613).

A set "not_curr_PC" is identified (step 1614). not_curr_PC contains all nodes of the CSR that are not part of the current pivot cone and are not already marked as blocked.

The nodes of not_curr_PC are blocked (step 1615).

Aggressive recursive learning is applied to any UBNs of the current pivot cone (step 1616). Aggressive recursive learning, and its differences from the recursive learning of the '845, '765 and '964 applications, is presented in the below section 1.4.1.2 "Aggressive Recursive Learning." Pseudo-code for accomplishing aggressive recursive learning is discussed in the below section 1.4.2.2 "Aggressive Recursive Learning." Since the nodes of the CSR, other than the nodes of the current pivot cone, are blocked, aggressive learning is able to operate very efficiently on the nodes of the current pivot cone.

The nodes of not_curr_PC are unblocked (step 1617) and the nodes of the current pivot cone are blocked (step 1618). The nodes of the current pivot cone can be blocked since the aggressive recursive learning has extracted from such nodes all benefit that can be obtained from a CBL type learning procedure.

Once there are no more pivot cones to process, the "no" branch of decision 1612 is followed and a return from pivot node learning (step 1619) is performed.

1.4.1.1. Pivot Node and Pivot Cone

A blockable subset referred to as a pivot cone can be defined as follows.

The root of a pivot cone is called a "pivot node." A pivot node is limited to nodes that have the properties enumerated below. The pivot cone is comprised of the pivot node plus its transitive fanin, where the transitive fanin is limited to nodes that have properties enumerated below.

A node can be a pivot node if the following two properties are true: it is not a primary input node and the range of the node contains only a single value (also referred to herein as a "singleton range").

A node "x" of a CSR can be a member of a pivot cone "P," rooted at a pivot node "P_root," if the following properties are true. The operator of node "x" is "complete" (please see below section, "Complete and Incomplete Operators," for a definition of a complete operator). All paths from node "x" to any primary output pass through P_root.

The nodes that drive the leaf nodes of a pivot cone are referred to herein as its "basis" nodes. The set of basis nodes, of a potential pivot cone, is an acceptable basis for a pivot cone if only one of the nodes has a non-singleton range. A basis node can be either a primary input or it can be a node (referred to herein as an "intermediate node") of a CSR that is in-between a primary input and primary output. A suitable intermediate node, for inclusion in a pivot cone basis, can include a node with multiple fanouts or a node whose operator is incomplete.

1.4.1.2. Aggressive Recursive Learning

Non-aggressive recursive learning (or simply, recursive learning) is presented in the '845, '765 and '964 applications. Recursive learning is summarized herein as follows. When the inputs to an unjustified Boolean node are each assumed to have a controlling value, and when such assumption leads to the input also being an unjustified Boolean node, then recursive learning is said to have occurred. The new type of recursive learning presented herein is referred to as "aggressive" recursive learning.

Non-aggressive recursive learning differs from aggressive recursive learning as follows. Non-aggressive recursive learning will search a particular CSR, for opportunities in which to apply recursive learning, to a limited recursion depth. In contrast, aggressive recursive learning has no limit on the recursion depth to which it will search. A disadvantage of the limited recursion depth of non-aggressive recursive learning is that opportunities for recursive learning can be missed. An advantage of the limited recursion depth, however, is that a CSR network can be explored more quickly for recursive learning opportunities. The greater speed of non-aggressive recursive learning means that larger CSR networks can be explored in an acceptable time period.

Aggressive recursive learning is applied within pivot cones since such cones are intended to be blocked off from any further evaluation for the applicability of implications or learning procedures. To permit aggressive recursive learning to be applied, however, the PNL process can include blocking off the nodes of the CSR, except for the pivot cone to which aggressive learning is to be applied. Such blocking, of the non-pivot cone nodes during aggressive learning, is accomplished in FIG. 16 by steps 1614 and 1615.

1.4.1.3. Complete and Incomplete Operators

Incomplete operators can have an exponential relationship between the number of intervals required to represent the result of an implication and the bit-width of a relevant input or output of the operator. Complete operators do not exhibit this exponential relationship.

Example incomplete operators include the following: modulo, division, multiplication, left shift and right shift. Complete operators include the following: relational operators (e.g., greater than, less than, equal to, not equal to, greater than or equal to, less than or equal to), Boolean operators (e.g., AND, OR, XOR, NAND, NOR, XNOR), addition and subtraction.

An example constraint (written in OpenVera) using the incomplete modulo operator is as follows:

```
rand bit[31 : 0] a;
constraint c1 {
    a mod 2 == 0;
}
```

In the above, "a" is declared an rv with a width of 32 bits. A constraint block "c1" contains the constraint that for any value assigned to "a," when a modulo two operation is performed on it, the result is zero.

Figure 9:
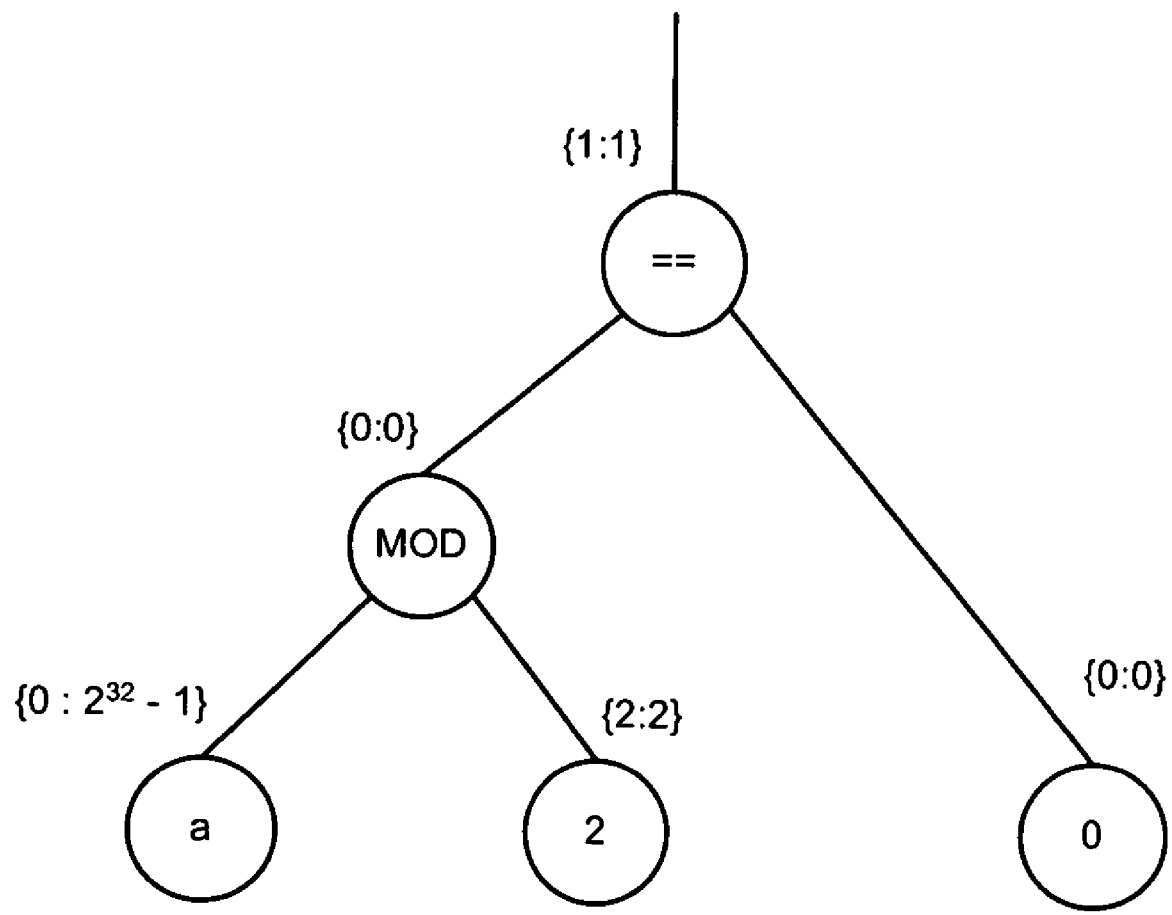
FIG. 9 depicts an example CSR used in conjunction with explaining incomplete operators.

FIG. 9 depicts a corresponding CSR for the constraint of block "c1." Based upon the output of the MOD operator being limited to {0:0}, and the right-side input to MOD being limited to {2:2}, backward implication would indicate that the range of "a" should only include the number zero (expressed as the interval {0:0}) and all even numbers from 2 through $2^{32}$-2. Thus, an exact representation of the range of "a" would comprise $2^{31}$ (or two billion) intervals, which range would appear as follows: a={{0:0}, {2:2}, {4:4}, ... {$2^{32}$-2:$2^{32}$-2}}.

1.4.1.4. PNL Example

Figures 14A, 14B:
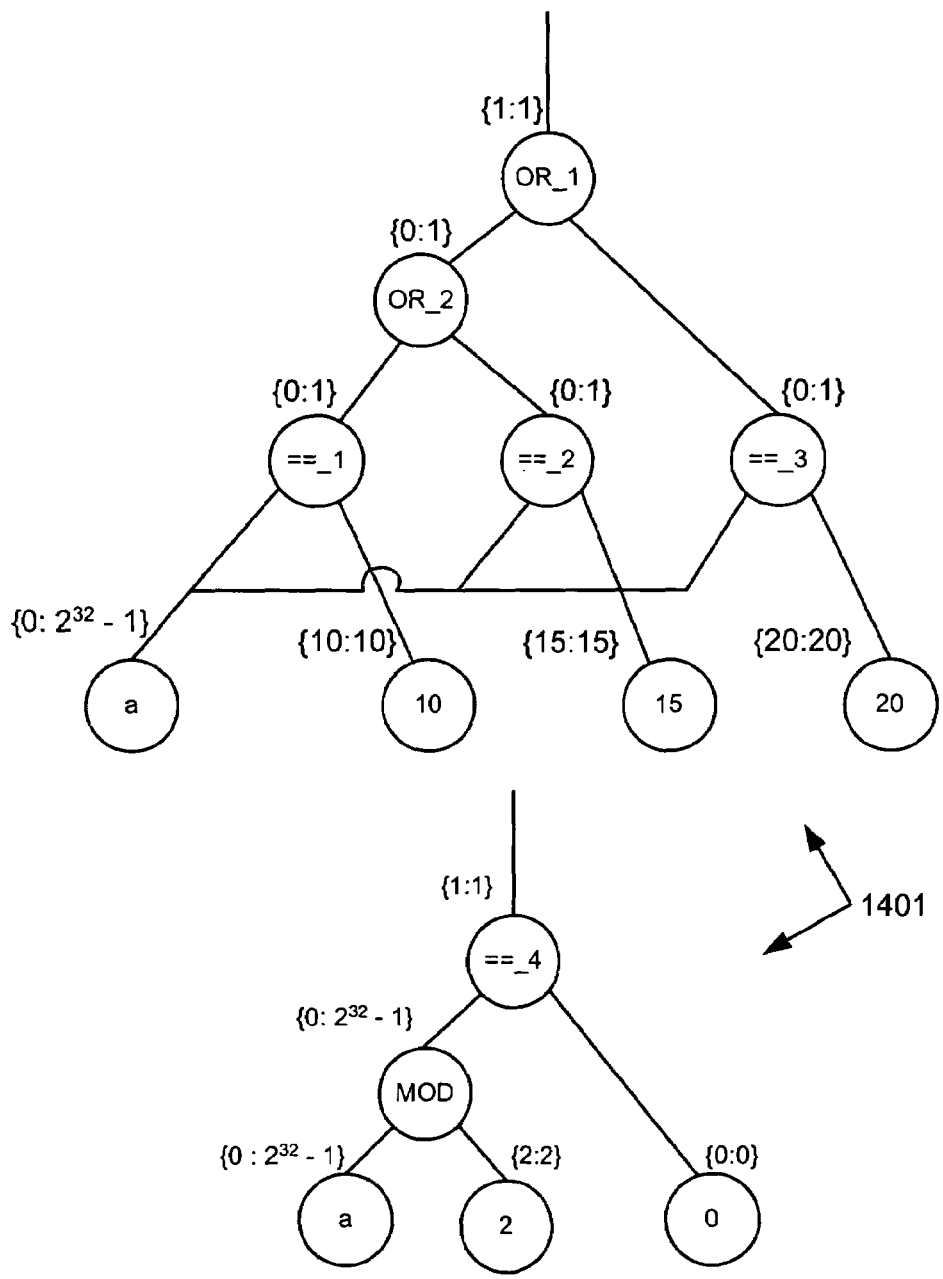
FIG. 14A presents an example OpenVera HVL to which a PNL process can be applied.
FIG. 14B depicts a CSR 1401 that HVL 1400 can be converted into.

An example OpenVera HVL 1400, to which the PNL process of FIG. 16 can be applied, is shown in FIG. 14A. To put this example in a fuller context, discussion of it begins with the CSR solver process of FIG. 1B.

FIG. 14B depicts a CSR 1401 that HVL 1400 can be converted into. CSR 1401 is comprised of two tree structures: one with root node OR_1 and the other with root node "==_4." Each tree structure corresponds to one constraint in source HVL 1400. The two tree structures share a common rv "a."

Assume a CSR solver is called for the first time.

Decision step 110 of FIG. 1B follows the "yes" path. The IE is applied to CSR 1401 (step 111). The only effect of the IE, on the CSR of FIG. 14B, is to change the range of the "MOD" node to {0:0}.

PNL is next applied to CSR 1401 (step 112). To appreciate application of PNL, this example continues with the PNL process of FIG. 16.

Figure 14C:
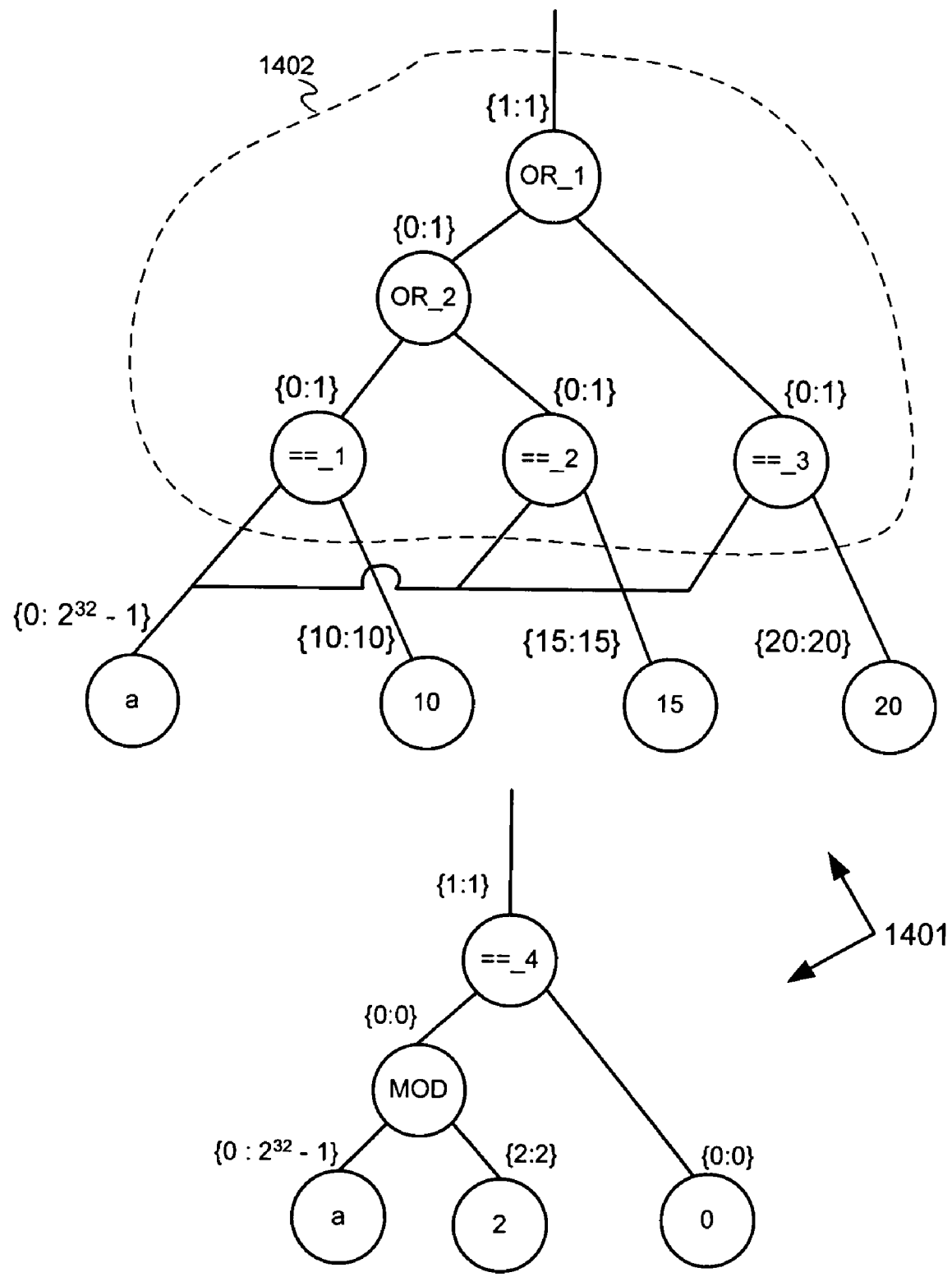
FIG. 14C depicts the result of applying the IE and pivot cone identification to FIG. 14B.

Per step 1611, pivot cone 1402, of FIG. 14C, is identified. An example pseudo-code procedure (called "IdentifyPivotNodesAndCones"), for identifying pivot cones, is presented in below section 1.4.2.1. IdentifyPivotNodesAndCones is a new technique, relative to the '845, '765 and '964 applications.

Assume pivot cone 1402 is made the current pivot cone (step 1613).

The set "not_curr_PC" is determined to comprise all unblocked nodes of 14C, other than the nodes of 1402 (step 1614).

The nodes of not_curr_PC are marked as blocked (step 1615).

Aggressive recursive learning (step 1616) is applied to pivot cone 1402, resulting in the CSR 1401 of FIG. 14D. An example pseudo-code procedure (called "PerformLearningInCircuitFe"), for performing aggressive learning on a pivot cone, is presented in below section 1.4.2.2. This learning step limits the possible values for rv "a" to be {10:10}, {15:15}, {20:20}.

The nodes of not_curr_PC are unblocked (step 1617).

The nodes of pivot cone 1402 are marked as blocked (step 1618).

Since there are no further pivot cones to process, the PNL process returns (step 1619) to the CSR solver process of FIG. 1B.

Case-based learning (step 113) is applied to CSR 1401 of FIG. 14D, but UBN OR_1 is skipped because it is blocked.

ATPG is applied (step 114) to the CSR of FIG. 14D to produce a solution to the constraint set. Assume ATPG has chosen, from among the three possible values for rv "a," the value {10:10}. The resulting state of CSR 1401 is shown in FIG. 14E.

To prepare for another call to the CSR solver, before returning to the HVL (step 126), the state of the CSR of FIG. 14E is reverted (step 115) to the state of FIG. 14D.

1.4.2. Pseudo-Code 1.4.2.1. Pivot Cone Identification

Pseudo-code for pivot cone identification is depicted in FIGS. 17-19 and 20A-20B. The pseudo-code presents an algorithm whose execution time is linearly related to number of nodes of the CSR being searched for pivot cones. FIGS. 17-19 and 20A-20B refer to the CSR being searched as the "Circuit."

1.4.2.1.1. IdentifyPivotNodesAndCones

The top-level procedure, IdentifyPivotNodesAndCones, is presented in FIG. 17. IdentifyPivotNodesAndCones operates by calling two procedures: IdentifyCandidatePivotNodes (FIG. 17, line 5) and IdentifyPivotCones (FIG. 17, line 8). IdentifyCandidatePivotNodes (defined in FIG. 18) identifies candidate pivot nodes in the circuit. Starting from the candidate pivot nodes provided by IdentifyCandidatePivotNodes, IdentifyPivotCones (define in FIG. 19) finds pivot cones in a CSR. Below, the operation of IdentifyCandidatePivotNodes and of IdentifyPivotCones are discussed in more detail.

1.4.2.1.2. IdentifyCandidatePivotNodes

IdentifyCandidatePivotNodes iterates over each node, called "myNode," of the CSR to be searched (FIG. 18, line 5). Each node "myNode" is first tested (see FIG. 18, lines 7-12) to see whether it satisfies the following properties: not a primary input (line 7), not a "bit-slice" operator (line 9 and see Glossary for definition of bit-slice operator), is a complete operator (line 11) and has a singleton output range (line 12). Whether myNode is a complete operator is tested by the procedure "NodeCanBeInPivotCone" that is called in FIG. 18 at line 11. NodeCanBeInPivotCone is also defined in FIG. 18 at lines 27-36.

The second test of IdentifyCandidatePivotNodes is whether each node "myNode" has at least one input node with a non-singleton range (see FIG. 18, lines 14-18).

If both the first and second tests of IdentifyCandidatePivotNodes are satisfied, "myNode" is counted as a candidate pivot node. In the pseudo-code, this is accomplished by inserting myNode into a hash table "HashTableOfCandidatePivotNodes" (see FIG. 18, line 20).

1.4.2.1.3. IdentifyPivotCones

IdentifyPivotCones iterates over each candidate pivot node "candPivotNode" found by IdentifyCandidatePivotNodes (see FIG. 19, line 13). For each candidate pivot node "candPivotNode," the procedure IdentifyPivotConeInt is invoked (see FIG. 19, lines 16-24).

Given a candidate pivot node "candPivotNode," IdentifyPivotConeInt returns what should be a pivot cone, assuming one further test is satisfied. The pivot cone is returned by IdentifyPivotConeInt in the form of the following two groups of nodes being identified: its basis nodes (in "HashTableOfBasisNodes") and the nodes comprising the pivot cone (in "HashTableOfPivotConeNodes").

The one further test of the result returned by IdentifyPivotConeInt is whether the basis nodes returned comprise only one node with a non-singleton range (see FIG. 19, lines 26-27). If this test is satisfied, the pivot cone is expressed as a "pivotStructure" comprised of the one non-singleton basis node and the nodes comprising the pivot cone (see FIG. 19, lines 29-34).

The resulting pivotStructure can be stored in a way that permits it to be accessed according to its root node (see FIG. 19, lines 37-39, inserting pivotStructure in a hash table with candPivotNode as the key).

1.4.2.1.4. IdentifyPivotConeInt

IdentifyPivotConeInt identifies a pivot cone, starting from a candidate pivot node, in a recursive fashion.

IdentifyPivotConeInt iterates over each input node "inputNode" to candidate pivot node "candPivotNode" and ends the recursion when a node "inputNode" is a basis node (see FIG. 20A, line 10 for the iteration over each input node and FIG. 20A, lines 13-17 for the test for an input node being a basis node). An input node "inputNode" is a basis node when any one of the following properties are satisfied: it is a primary input node (FIG. 20A, line 13), it is a bit-slice operator (FIG. 20A, line 14), it's operator is incomplete (FIG. 20A, line 15), its output range is a singleton (FIG. 20A, line 16) or all fanout nodes of inputNode have not yet been visited (FIG. 20A, line 17).

If an input node "inputNode" should not be part of the basis, then it is tested for whether it has more than one fanout node (at line 22 of FIG. 20A).

If "inputNode" does not have a fanout greater than one, it forms part of a relatively simple tree structure and the only action necessary is a recursive call to IdentifyPivotConeInt to further explore the tree (see FIG. 20B, lines 1-6).

If "inputNode" does have a fanout greater than one, all fanouts of "inputNode" have been visited, and thus far in the search only one basis node with a non-singleton range has been identified (FIG. 20A, lines 24-25), a new search rooted at "inputNode" can be invoked by calling IdentifyPivotConeInt (FIG. 20A, lines 28-31). The resulting of calling IdentifyPivotConeInt can be tested to determine if it returns a valid tree (or cone of logic) that has only a single basis variable with a non-singleton range (FIG. 20A, lines 32-33). If the test is successful, "inputNode" can be deleted as a basis node from the HashTableOfBasisNodes (FIG. 20A, lines 35-36), the newly found basis nodes can be merged with the previously found basis nodes for this pivot node (FIG. 20A, lines 37-38), the newly found pivot cone nodes can be merged with the previously found pivot cone nodes (FIG. 20A, lines 39-40), and the HashTableOfVisitedNodes can be the union of the newly visited nodes and the previously visited nodes (FIG. 20A, lines 41-42). Otherwise, if the test is not successful, the current recursive call to IdentifyPivotConeInt stops its search at "inputNode."

1.4.2.2. Aggressive Recursive Learning

Without loss of generality, the below-described recursive learning pseudo-code assumes that the Boolean nodes to be analyzed have two inputs.

The recursive learning pseudo-code presented herein differs from the recursive learning presented in the '845, '765 and '964 applications in the following aspects. The recursive learning of the pseudo-code presented herein is "aggressive" in the sense that it has no limits on its depth of recursion. In contrast, the recursive learning pseudo-code of the '845, '765 and '964 applications is designed to search to a predetermined recursion depth. The recursive learning of the pseudo-code presented herein will skip blocked nodes. In contrast, the recursive learning pseudo-code of the '845, '765 and '964 applications is not designed to skip blockable subsets.

Pseudo-code for aggressive recursive learning is shown in FIGS. 10, 11A-11C, 12 and 13. The top-level function is "PerformLearningInCircuitFe" and is shown in FIG. 10. As presented in the above discussion of FIG. 16, PerformLearningInCircuitFe can be called in step 1616. The operation of PerformLearningInCircuitFe is focused on only the current pivot cone by step 1615 having made sure that all nodes, not of the current pivot cone, are blocked.

A function-by-function overview of the pseudo-code follows.

1.4.2.2.1. PerformLearningInCircuitFe

PerformLearningInCircuitFe (FIG. 10) is passed a parameter "raceCircuit" that contains the CSR to be processed (FIG. 10, line 5). The recursive learning PerformLearningInCircuitFe is able to accomplish on raceCircuit is returned in the second parameter of PerformLearningInCircuitFe: a nodesImplied table.

PerformLearningInCircuitFe iterates over each unblocked UBN of raceCircuit, with the current UBN referred to as "UBN" (FIG. 10, lines 9-10). For each UBN, the procedure PerformLearningInCircuit is invoked (FIG. 10, line 12). PerformLearningInCircuit explores all the recursive learning possible for the raceCircuit and UBN passed to it. The results learned by PerformLearningInCircuit are returned in its third parameter: a learnedImps table.

If PerformLearningInCircuit is successful, then any implications, that may result from the recursive learning, are found by invoking the IE (at line 16, of FIG. 10, "ImplyValuesInCircuitFe" is called) with the learned implications in learnedImps. ImplyValuesInCircuitFe updates the CSR to be processed (the CSR being processed, raceCircuit, is not shown as a parameter of ImplyValuesInCircuitFe) and returns the particular implications resulting, from learnedImps, in a nodesImplied table.

For each unblocked UBN iterated over, any recursive learning accomplished is accumulated as further updates to raceCircuit.

1.4.2.2.2. PerformLearningInCircuit

PerformLearningInCircuit (FIGS. 11A-11C) is passed a parameter "raceCircuit" that contains the CSR to be processed (FIG. 11A, line 3). It is also passed the particular UBN chosen by PerformLearningInCircuitFe. The results that PerformLearningInCircuit are able to learn are returned in the table "learnedImps."

PerformLearningInCircuit iterates over each unblocked input node (called "input_node") of the UBN (FIG. 11A, line 6).

A controlling value for input_node, called "sel_value," is generated (FIG. 11A, lines 9-10).

The procedure "RecursiveImplyDecisionValue" is called to find the implications of setting the input_node input to the UBN to a controlling value (FIG. 11A, lines 13-14). Any implications learned by RecursiveImplyDecisionValue are returned in the table "nodesImplied."

If RecursiveImplyDecisionValue is successful, the following steps can be performed (see FIG. 11A, line 18 to FIG. 11B, line 20). A test is done to determine whether input_node is the first input of the UBN to be processed by PerformLearningInCircuit (FIG. 11A, line 21). If it is, then any implications learned by RecursiveImplyDecisionValue, returned in nodesImplied, are stored in learnedImps (FIG. 11A, line 24). If input_node is not the first input of the UBN (see FIG. 11A, line 29 to FIG. 11B, line 19), then the results of RecursiveImplyDecisionValue for the current input node (stored in nodesImplied) are unioned with the results of RecursiveImplyDecisionValue for the first input_node (that have been stored in learnedImps). See FIG. 11B, lines 3-17.

If RecursiveImplyDecisionValue is failed (FIG. 11B, lines 21-30), this means that it is not possible to set the current UBN input_node to a controlling value. Steps are taken (FIG. 11B, lines 27-29) to exclude the controlling value from the range of input_node so that it will not be tried again.

Before each iteration, of a particular input_node, ends, the state of raceCircuit is restored to the state it was in before the call to RecursiveImplyDecisionValue (FIG. 11B, line 35).

Once the input_nodes of the UBN have been iterated over, the following steps can be performed. As long as the "failCount" indicates that at least one input_node was successfully evaluated by RecursiveImplyDecisionValue (test of FIG. 11C, line 4 is successful), learnedImps is adjusted by those implications that should be excluded and learnedImps is then returned (FIG. 11C, lines 6-17). If the failCount indicates that every input_node failed RecursiveImplyDecisionValue (else of FIG. 11C, lines 27-31 is executed), then an anomalous CSR state has been reached and PerformLearningInCircuit returns a value of failure (FIG. 11C, line 30).

1.4.2.2.3. RecursiveImplyDecisionValue

RecursiveImplyDecisionValue finds the recursive implications of setting the input_node, of the UBN selected by PerformLearningInCircuit, to the controlling value represented by sel_value (FIG. 12, line 12). The resulting implications are stored in "nodesImplied" table (FIG. 12, line 14). If the implications include producing more UBNs, then RecursiveImplyDecisionValue pursues those UBNs with RecursiveLearnAndImply (FIG. 12, lines 34-35), otherwise RecursiveImplyDecisionValue can return after running the implication engine (ImplyValuesInCircuitFe). A more detailed discussion, of the pseudo-code for RecursiveImplyDecisionValue, follows.

The implications of setting input_node to a controlling value are found by inserting the pair "(input_node, sel_value)" in a table called "impVals" (FIG. 12, line 12) and invoking ImplyValuesInCircuitFe upon impVals (FIG. 12, line 14).

"unjustNodes" (FIG. 12, line 24) is set to any UBNs resulting from input_node being set to a controlling value.

If unjustNodes is not empty (tested for in FIG. 12 by line 26), the UBNs of unjustNodes are put in reverse levelized order (FIG. 12, line 33). Reverse levelized order means that the UBNs closest to the root of the CSR are accessed first. The UBNs of unjustNodes are pursued by calling RecursiveLearnAndImply (FIG. 12, lines 34-35).

If unjustNodes is empty, RecursiveImplyDecisionValue returns after having run ImplyValuesInCircuitFe.

1.4.2.2.4. RecursiveLearnAndImply

Iterates over a list "unjustNodes" of UBNs (FIG. 13, line 7).

Recursively applies PerformLearningInCircuit (at FIG. 13, line 9) to each UBN "unjust_node" to acquire further case-based implications. Implications acquired are returned in nodesImplied (by calling the IE at FIG. 13, line 11).

1.4.2.3. Pivot Cone Identification Example

This section discusses application of IdentifyPivotNodesAndCones to the CSR of FIG. 14C.

Candidate pivot nodes are identified by invoking IdentifyCandidatePivotNodes. Node "OR_1" is identified as a candidate pivot node since: it is not a primary input, it is not a bit-slice operator, its operator is complete (i.e., the OR operator), it has a singleton range (i.e., {1:1}) and it has one or more non-singleton ranges on its inputs (i.e., OR_2 and "==_3" both have the non-singleton ranges {0:1}). It can readily be appreciated that OR_1 and "==_4" are the only possible candidate pivot nodes since they are the only two nodes that meet just the criteria of having singleton ranges and of not being primary inputs. Node "==_4," however, does not meet the criteria of having one or more non-singleton ranges on its inputs (i.e., MOD and "0" both have the singleton range {0:0}).

Next, IdentifyPivotNodesAndCones invokes IdentifyPivotCones to see whether candidate pivot node "OR_1" is an actual pivot node. IdentifyPivotCones accomplishes this by invoking IdentifyPivotConeInt on "OR_1." IdentifyPivotConeInt returns a hash table of basis nodes ("HashTableOfBasisNodes") containing the following nodes: "a," "10," "15" and "20." IdentifyPivotConeInt also returns a hash table of nodes forming the potential pivot cone ("HashTableOfPivotConeNodes") containing the following nodes: "OR_1," "OR_2," "==_1," "==_2" and "==_3." IdentifyPivotCones determines that only one node of HashTableOfBasisNodes is non-singleton (i.e., node "a") and creates a "pivotStructure" to represent the pivot cone 1402 that has been found. The pivotStructure is comprised of a "basisNode" (i.e., node "a") and the HashTableOfPivotConeNodes.

IdentifyPivotConeInt operates as follows upon the candidate pivot node "OR_1." Each input node "inputNode" to OR_1 is tested for whether it should be part of the basis. Neither input node to OR_1 (i.e., nodes OR_2 and "==_3") meet the test for being included in the basis. Next, each inputNode to OR_1 is tested for whether it has a fanout greater than one. Since neither OR_2 nor "==_3" has a fanout greater than one, a recursive call to IdentifyPivotConeInt is performed on each of OR_2 and "==_3." It can readily be appreciated that the recursive call to IdentifyPivotConeInt, with "==_3" serving as the candPivotNode, will identify nodes "a" and "20" as basis nodes. The recursive call to IdentifyPivotConeInt, with "OR_2" serving as the candPivotNode, will result in two further recursive calls to IdentifyPivotConeInt: one such call with "==_1" serving as the candPivotNode and the other such call with "==_2" serving as the candPivotNode. The call to IdentifyPivotConeInt with "==_1" serving as the candPivotNode identifies nodes "a" and "10" as basis nodes. The call to IdentifyPivotConeInt with "==_2" serving as the candPivotNode identifies nodes "a" and "15" as basis nodes.

1.4.2.4. Aggressive Recursive Learning Example

An example execution of PerformLearningInCircuitFe is discussed in this section. PerformLearningInCircuitFe is applied to pivot cone 1402 of FIG. 14C.

While FIG. 14D (discussed above) shows the final state of pivot cone 1402, after aggressive recursive learning has been applied, FIGS. 15A to 15G show the intermediate states that PerformLearningInCircuitFe can be expected to produce in getting from the initial state of FIG. 14C to the final state of FIG. 14D. These intermediate states are produced by PerformLearningInCircuitFe calling PerformLearningInCircuit. PerformLearningInCircuit uses recursion to explore the possible configurations by which Boolean nodes of pivot cone 1402 can be justified.

Figure 15A:
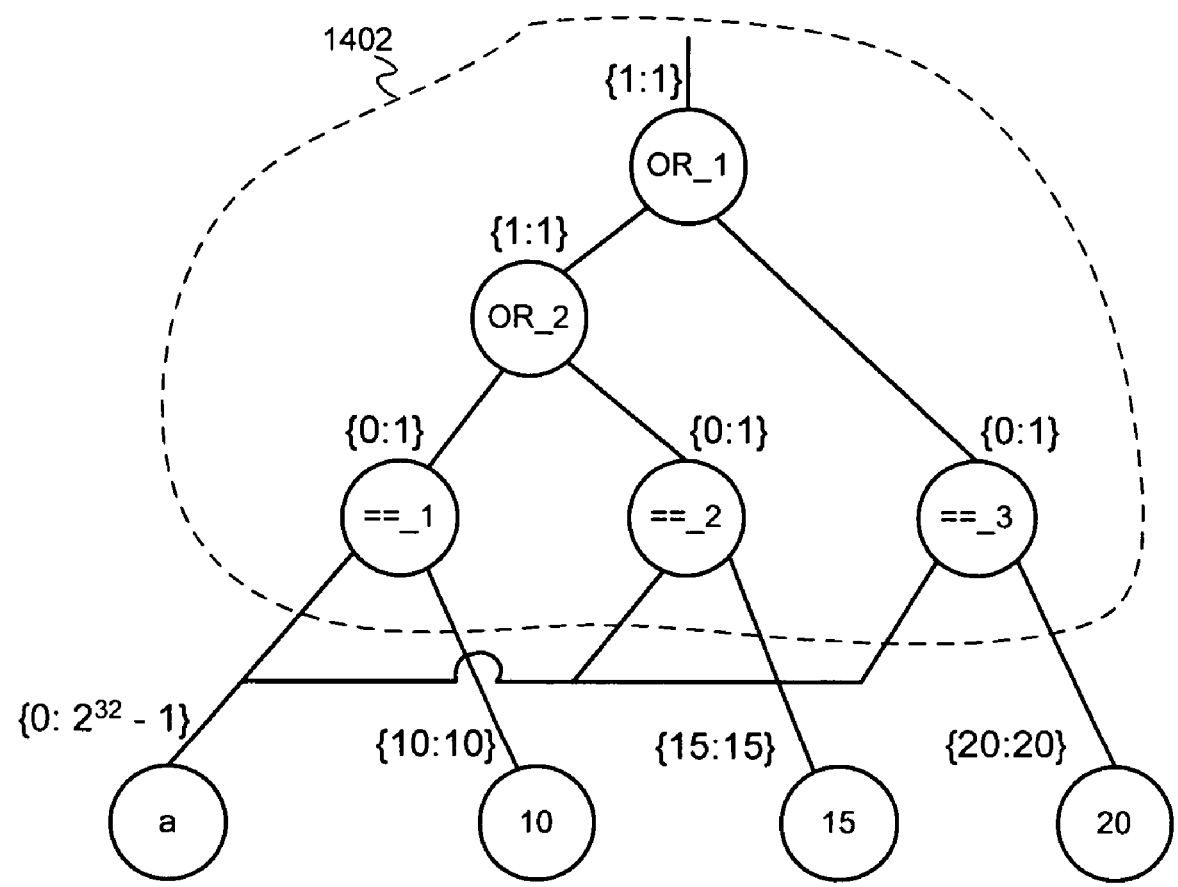
FIGS. 15A to 15G show the intermediate states that PerformLearningInCircuitFe can be expected to produce in getting from the initial state of FIG. 14C to the final state of FIG. 14D.

In FIG. 15A, OR_2 has been set to a controlling value in order to justify OR_1. Since the setting of OR_2 to a controlling value has caused it to become a UBN, PerformLearningInCircuit employs recursion to explore putting controlling values on each of OR_2's inputs.

Figure 15B:
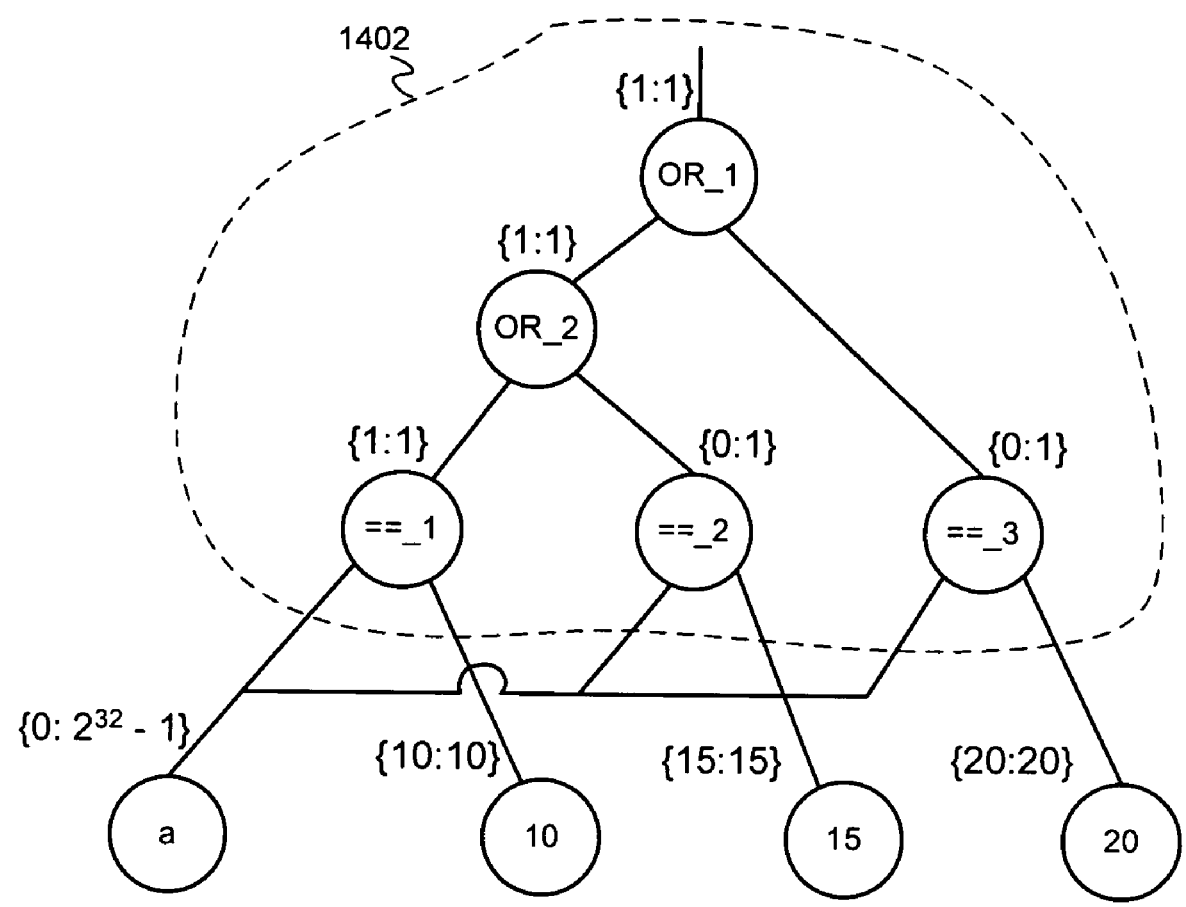
Figure 15C:
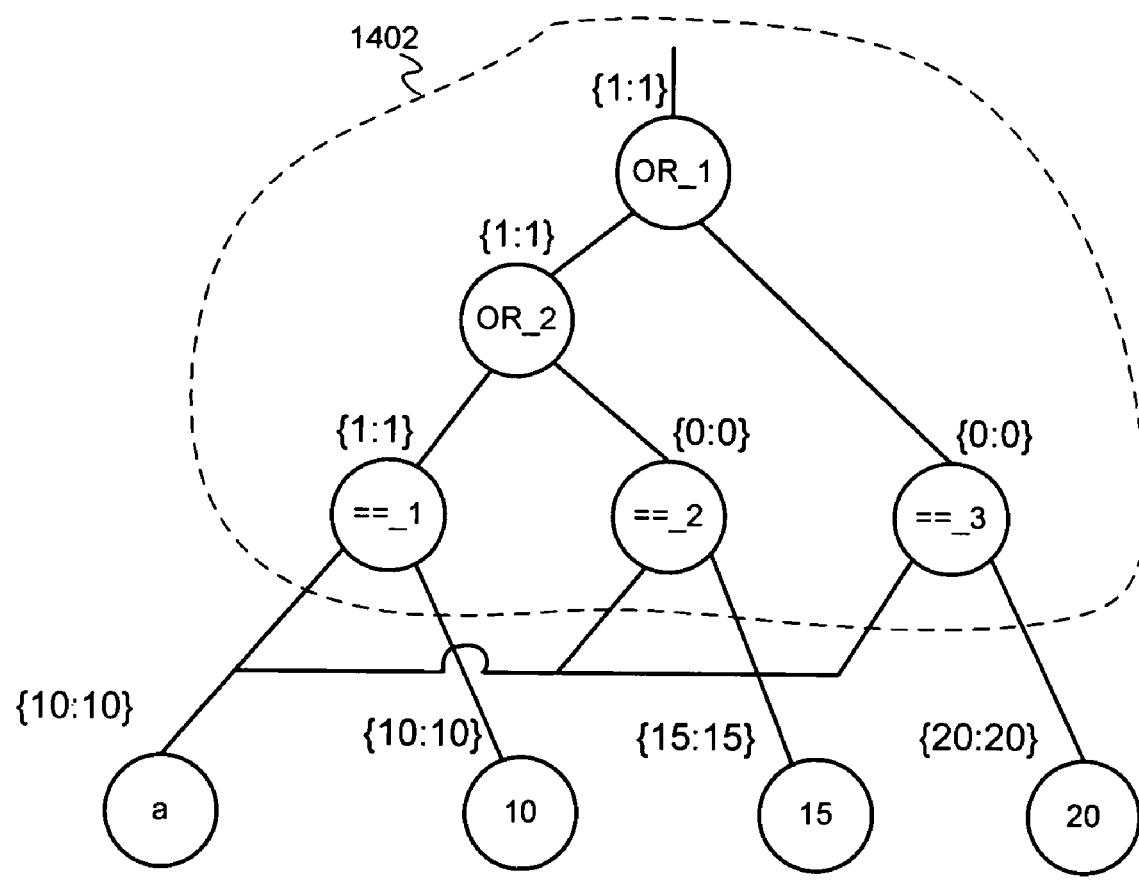

FIG. 15B shows input "==_1" having been set to a controlling value in order to justify OR_2. FIG. 15C shows that, with OR_1 and OR_2 justified, "a" is limited to the range {10:10}.

Figure 15D:
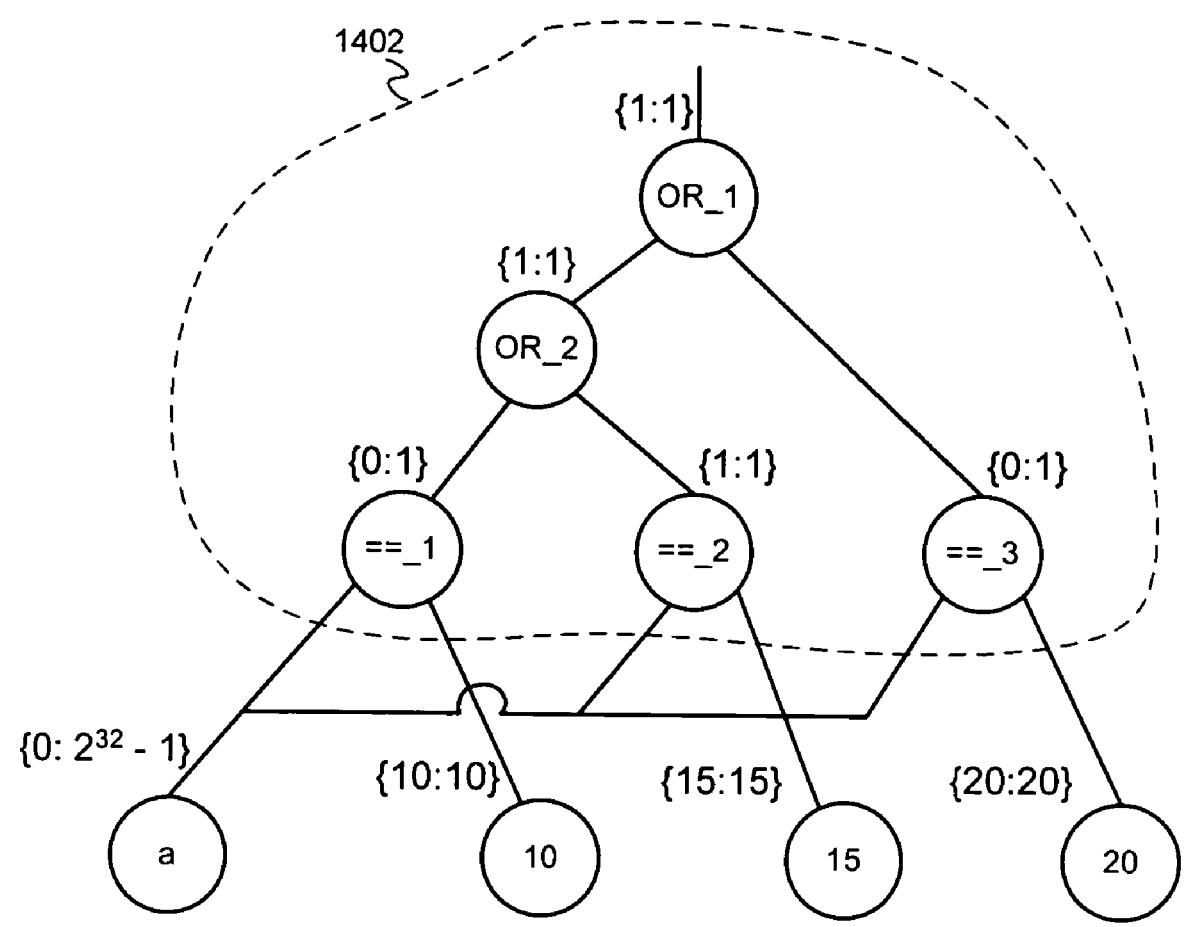
Figure 15E:
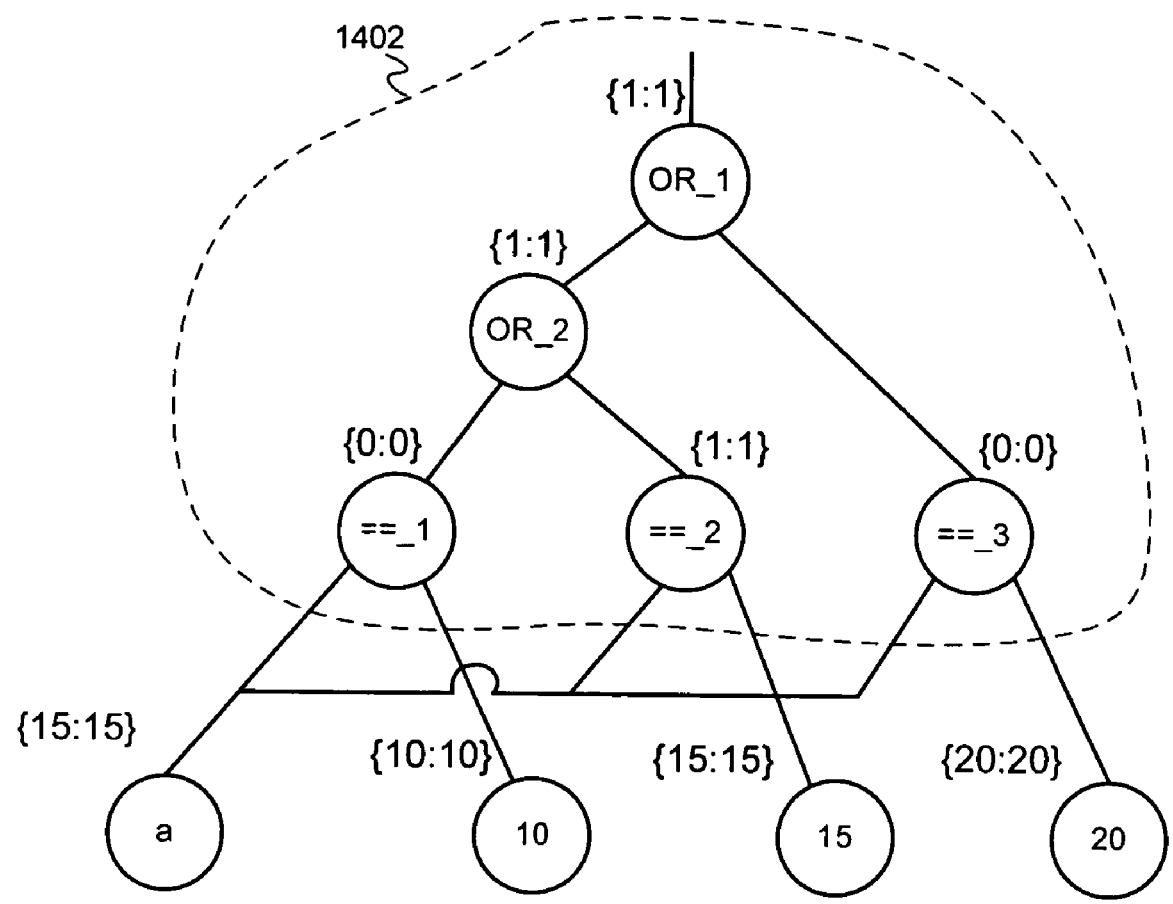

FIG. 15D shows how PerformLearningInCircuit sets the other input to OR_2, "==_2," to a controlling value in order to justify OR_2. FIG. 15E shows that, with OR_1 and OR_2 justified, "a" is limited to the range {15:15}.

Figure 15F:
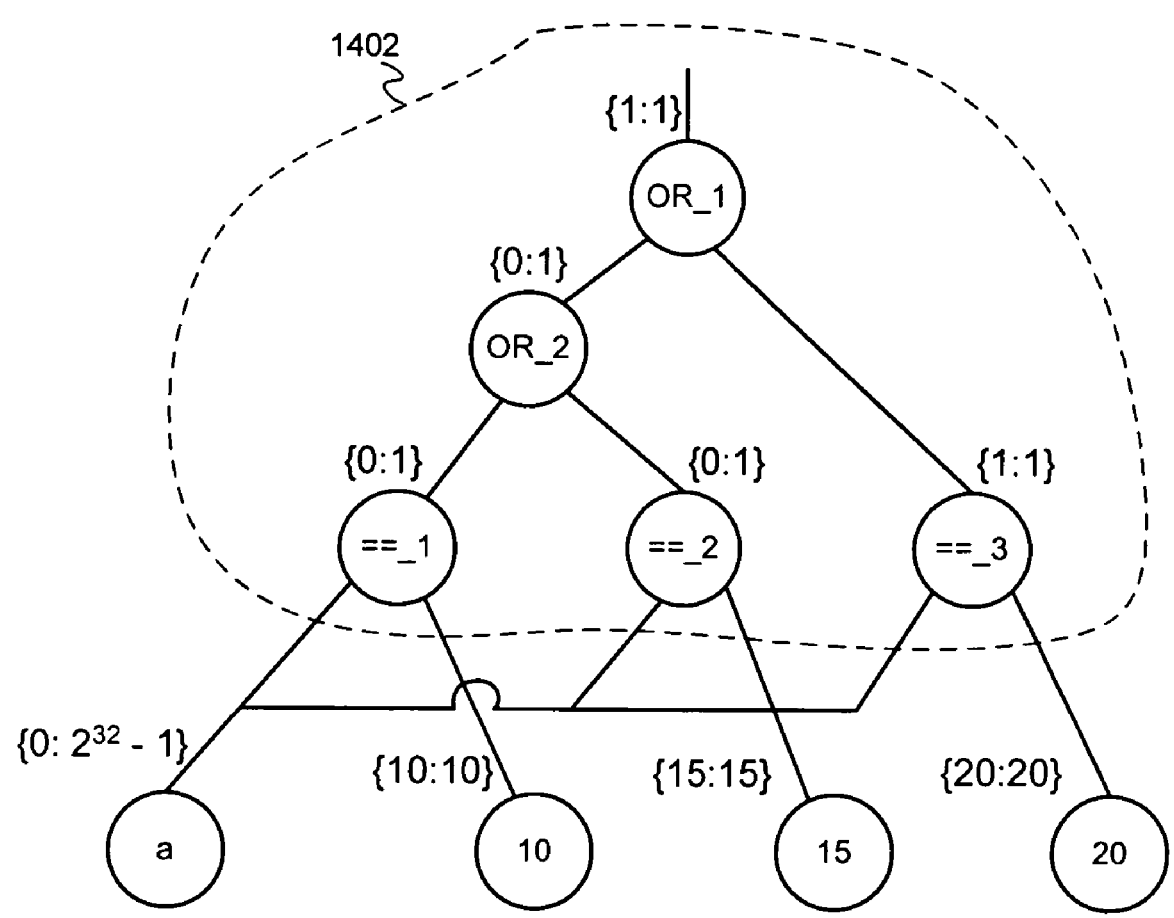
Figure 15G:
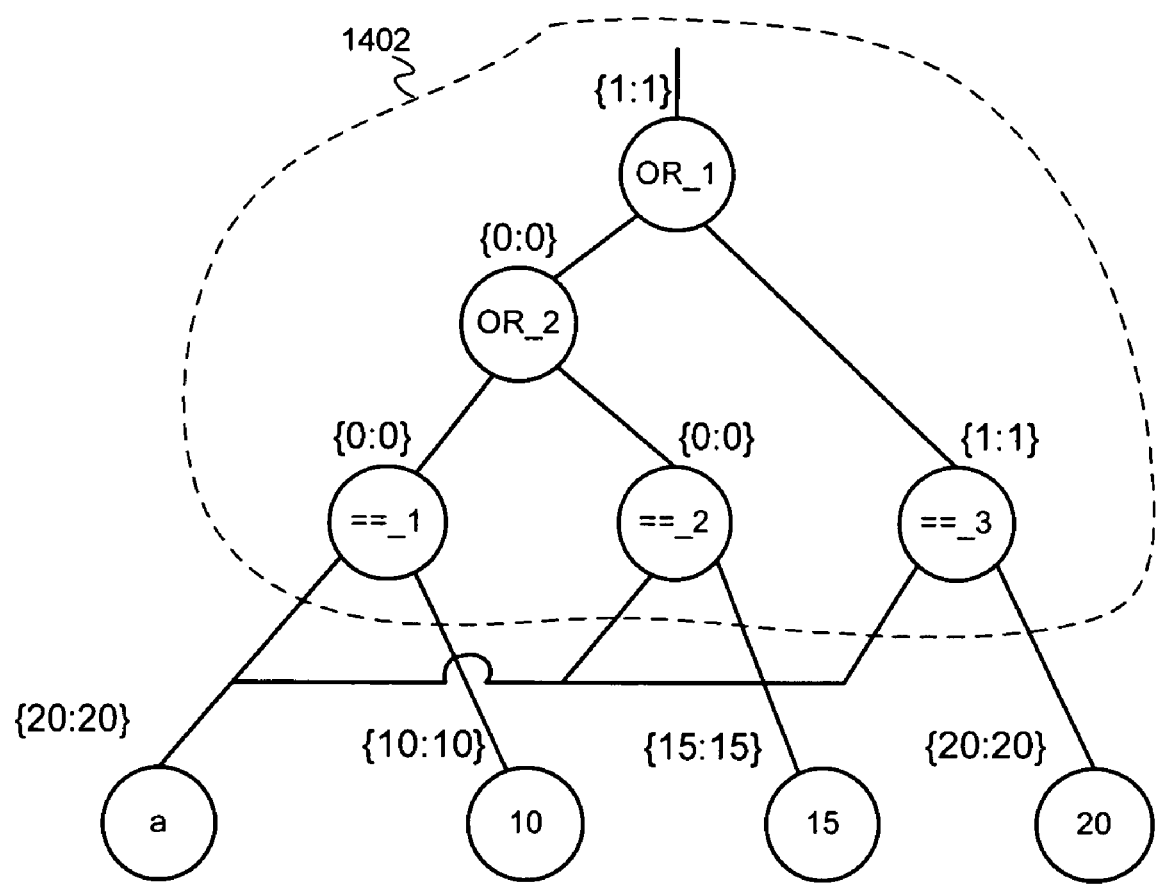

Now that both inputs to OR_2 have been explored, FIG. 15F shows how PerformLearningInCircuit can return from a level of recursion in order to explore setting the other input to OR_1 (the "=_3" input) to a controlling value. FIG. 15G shows that, with OR_1 justified, "a" is limited to the range {20:20}.

As PerformLearningInCircuit returns from a recursive exploration, the results it has found, to the extent they apply to the same rv, are unioned together. For example, after PerformLearningInCircuit has explored setting both inputs to OR_2 to a controlling value, by FIG. 15E, when the recursion to OR_2 is returned from, such that "==_3" can be explored in 15F, the two results learned thus far for rv "a," that "a" can be {10:10} or {15:15}, are unioned together to produce the following range for "a": ({10:10}, {15:15}).

After PerformLearningInCircuit has explored setting both inputs to OR_1 to a controlling value, the two results learned thus far for rv "a," that "a" can be ({10:10}, {15:15}) or {20:20}, are unioned together to produce the following range for "a" that is shown in FIG. 14D: ({10:10}, {15:15}, {20:20}).

1.5. Pivot Cone Re-Use

As discussed above, a determination, of whether previously determined pivot cones can be re-used, is performed in step 119 of FIG. 1B. The determination can be accomplished as follows.

When the nodes of the pivot cones are unblocked in step 117, the following information about each pivot cone can be saved: the identity and range of its pivot node; the identity and range of each of its basis nodes. The pivot cones that had been found, prior to step 117, can be referred to as the prior pivot cones.

After the IE is applied in step 118, the re-usability of each prior pivot cone "x" is determined by step 119 performing the following comparisons. The prior range of the pivot node for "x" is compared for equality to its current range. Also, the prior range for each basis node of "x" is compared for either being equal to, or "broader" than, its current range.

If the results of all such comparisons by step 119 are positive, then the prior pivot cone "x" can be re-used, except that where the prior range of a basis node is broader than its current range, the current range is set to the intersection of the prior and current ranges.

A range "r1" is defined herein to be "equal" to a range "r2" if every value in r2 is also in r1 and every value in r1 is also in r2. A range "r1" is defined herein to be "broader" than a range "r2" if every value in r2 is also in r1, but there is at least one value in r1 not in r2.

1.6. Reversion to Previous CSR State

Prior CSR states are reverted to in steps 115,125 and 123. Such reversion can be accomplished by any suitable technique. One approach is to save the state of the CSR at the point expected to be reverted to. For example, prior to accomplishing step 114, CSR state Z.3 can be saved. In order to accomplish the reversion to CSR state Z.3, as specified by step 115, the saved CSR state Z.3 can be substituted for the CSR state resulting after accomplishing ATPG 114.

More specifically, the reversion stack, discussed above in the section "ATPG," can be used. When ATPG finishes, a reversion process can pop the reversion records from the reversion stack, using each reversion record to put the CSR into an earlier state. Once the last reversion record has been popped and used for reversion, the CSR is in the state it was prior to the ATPG invocation.

Similarly, in order to accomplish the generation of CSR state Y in step 117, CSR state Z can be saved before step 111 is executed. Step 117 can then be accomplished by setting the CSR to state Z and then substituting, for the ranges of the sv's of state Z, the ranges of the sv's when RACE is called with changed sv's at step 109.

1.7. Case-Based Learning

Since CBL is discussed in detail in the '845, '765 and '964 applications, only a very brief discussion of CBL is presented herein.

CBL is comprised of both non-aggressive recursive learning and global learning.

Global learning occurs when, as a result of the input constraint set, without further assumptions, at least two Boolean nodes "v" and "w" are unjustified. Nodes "v" and node "w" are explored, simultaneously, for combinations of each having an input with a controlling value. To limit computational complexity of the global learning process, embodiments of the technique can use the heuristic of limiting "v" and "w" to being within a pre-defined number of levels of logic of each other.

As discussed above, the CBL utilized with the present invention differs from the CBL of the '845, '765 and '964 applications in skipping from processing those UBNs marked as blocked. Also, due to the fact that PNL operates on the UBNs of a CSR before CBL is applied, there can be a difference in the order in which CBL processes the UBNs.

2. Constraint Representation

As mentioned above, constraint representation and the CSR are discussed in detail in the '845, '765 and '964 applications. This section presents, as a convenient reference, some of the material presented in the '845, '765 and '964 applications.

The combinational constraints solving problem can be formulated as follows. Consider a set of variables, V={v1, v2, . . . , vn}, and a set of relations or constraints, C={c1, c2, . . . , cm}, such that each constraint is a relation between expressions over a subset of the variables in V. A constraint is any expression that evaluates to a Boolean value (i.e., either TRUE or FALSE). In this context, an expression is any legal sequence of variables and operators, as defined in the language used to express the constraints.

Each variable in V can have a defined bit-width and sign that determine a range of values that can possibly be assigned to it. A variable in V can be random or state. A random variable (or rv) can be defined as taking on, at the appropriate point in the execution of an HVL program, a value that is randomly selected from its range, such that all the active constraints that the variable participates in are satisfied. A state variable (or sv) is similar to an "ordinary" programming language variable, i.e., it is a variable whose value is set by the various assignment constructs of the HVL. In addition to being a function of the HVL program itself, a state variable can also represent feedback from the DUV that is used by the HVL program to adapt the further course of testing.

Each constraint, of a set of constraints "C," can employ a variety of operators, including arithmetic, Boolean, relational, unary reduction, bit-wise, shift, concatenation, bit slice, implication, and ternary multiplexing.

The resulting precision and sign, from operator evaluation, can play an important role in solving a set of constraints. Different precision and sign semantics, for operator evaluation, can lead to different solution spaces for the same set of constraints. One approach, for example, is to use the IEEE Verilog Language model of precision and sign semantics in operator evaluation.

An example set of constraints, specified in the HVL OpenVera, is presented in the below section "Example HVL."

Solving a set of constraints can comprise converting the constraints into a representation referred to herein as a "constraint set representation" (please see below section "CSR" for further discussion of a constraint set representation) and then finding a legal assignment for all random variables (or rv's) in V, given the particular values currently assigned to the state variables (or sv's in V, such that all the constraints in C are justified (please see below section "Definition of Justification"). An example CSR is illustrated below (please see below section "Example CSR").

2.1. Example HVL

Consider the following constraint solving problem, labeled Example 1, that is written in the Vera HVL:

---

Example 1:

```
rand bit[3:0] a, b;
rand integer c;
constraint c1 {
    a + b == c * 2;
}
constraint c2 {
```

-continued

Example 1:

```
c > 0;
}
```

Here "a" and "b" are 4-bit unsigned random variables and "c" is a 32-bit signed random variable. Thus, "a," "b," and "c" can possibly take, respectively, 16, 16 and $2^{32}$ values (the integer data type is assumed to be comprised of a 32 bit word). In the OpenVera language, c1 and c2 represent constraint blocks, with each block containing a constraint expression (or constraint). As can be seen, the constraint expression of block c1 is a declarative statement regarding a relationship that must be maintained over the variables "a," "b," "c," and the constant value of 2. The constraint expression of block c2 is a declarative statement regarding a relationship that must be maintained between the variable "c" and the constant value of zero. The constraint solving problem comprises finding values for "a," "b," and "c" that satisfies the declarative statements of blocks c1 and c2. Within an OpenVera program, since OpenVera is an object-oriented programming language, Example 1 is part of a class declaration from which instances are created. The constraint solving process can be invoked by applying a randomize method to an instance. One solution to the constraints of Example 1 is: a=1, b=3, c=2.

2.2. CSR

The CSR utilized by the present invention is a word-level network in which each operator, represented by a node, can propagate values that are not restricted to being just one or zero. The word-level nature of the networks addressed by the present invention permits it to more fully and efficiently explore the search space of a particular network than in prior approaches that focus upon single-bit-level networks.

The word-level networks addressed by the present invention can be in the form of a directed acyclic graph (DAG), with each high-level operator and operand (both constants and variables) of a constraint represented as a node.

Each constraint is independently modeled and all active constraints are solved for simultaneously. If the input constraint set contains more than one constraint, the DAG models of each constraint are conjoined using a root-level Boolean AND node. If the input constraint set comprises only one constraint, the root level node, of the CSR, may not be an AND node.

There is a node in the CSR for each of the following: i) a leaf-level node for each operand to a constraint, including input variables and constants (variables that participate in multiple constraints have multiple fanouts in the CSR); ii) a root-level node for the CSR's output (which is an AND node in the case of multiple constraints); and iii) a node for each operator of a constraint, located between the leaf nodes and the root-level node.

Each node of a CSR assumes a value using a data structure referred to herein as a "range" (please see below section "Definition of Range and Interval"). For each operator of the HVL (in which the input constraint set to be solved is written), algorithms for implication, using the range data structure, are implemented.

For some CSRs, using a type of operator referred to herein as "incomplete," if the implication process is pursued completely, some of the ranges can contain an excessive number of intervals. Such excessive number of intervals is due to the absence of an "x" value that can compactly express certain repetitive "gaps" in the range associated with a node of the CSR. An approach of the present invention, for reducing the number of intervals needed to represent such repetitive gaps, is to produce an over-approximated range (i.e., a range that may contain values that cannot be part of a solution to the input constraint set).

A desirable property of the CSR is that its size is linear in the size of the input constraint set to be solved.

2.3. Example CSR

Consider the set of input constraints 200, shown in FIG. 2, for which the resultant CSR 210, along with initial values of the ranges, is also shown in FIG. 2.

Input constraints 200 (written in OpenVera), declare two random variables "a" and "b," each of which is four bits in width. The constraint block c1 contains two constraints, both of which must be satisfied.

For input constraints 200, the two constants (10 and 6) are interpreted as 32-bit signed numbers. The results of the adder and the subtractor are initially unsigned and unbounded in precision due to the type of their operands. The results of the adder and subtractor are converted into 32-bit unsigned numbers using the Precision without wrap (Pr) operators on the outputs of the adder and subtractor. IEEE Verilog HDL interprets mixed signs on the equality operator (e.g., the 32-bit signed constants and 32-bit unsigned results of the adder and subtractor) as unsigned. This is modeled using the cast unsigned (CU) operator on the output of each constant node, that converts the 32-bit signed number of each constant into a 32-bit unsigned number.

As part of the model building process in the present invention, the primary input and primary output nodes of the CSR are also initialized with value ranges. For example, the primary input node, a, is initialized with a range {0:15}. Similarly the output node is initialized with a range {1:1}, to model the constraint satisfiability problem.

2.4. Definition of Justification

Within a word-level constraint network, justification refers to assigning values to the leaf-level nodes of the DAG, associated with the root-level node, such that a logic 1 value is produced on the root-level node. The justification is accomplished through the assignment of an appropriate value to all the random variables appearing in currently active constraints of the input constraint set. The present invention can operate in conjunction with a constraint solver that solves all the constraints simultaneously, as opposed to solving them in a pre-determined order. The present invention can also embrace an input constraint set that specifies an order of evaluation, either explicitly or implicitly.

In general, the term "justification" is used to refer to the process of determining legal values, without any uncertainty. When an input constraint set problem is satisfied by determining legal values to all random variables, all nodes in the CSR are justified. The term "justified" is also defined below as it applies to Boolean nodes, with such nodes being called "justified Boolean nodes" or "unjustified Boolean nodes."

2.5. Justification of Boolean Nodes

In the absence of known or assumed constraints, the possible output values that a Boolean node can have are expressed by the intervals: {0:0}, {1:1} and {0:1}. The values that the inputs of a Boolean node can have depend on the following factors: i) the precision and sign of the Boolean node's input nodes, which determine the maximum range that the node can have, and ii) constraints upon the Boolean node's input nodes.

The output of a Boolean node is said to have a controlling value if its range is {1:1} for an OR node and {0:0} for an AND node. The range of an input of an OR node is said to only contain values classified as controlling if its range only contains values that do not include {0:0}. The range of an input of an AND node is said to only contain values classified as controlling if its range only contains {0:0}. The range of an input of an AND node is said to only contain values classified as non-controlling if its range only contains values that do not include {0:0}. The range of an input of an OR node is said to only contain values classified as non-controlling if its range only contains {0:0}.

In the absence of known constraints for its output, if both inputs of a Boolean node have ranges that contain both controlling and non-controlling values, then forward implication applied to such a Boolean node will result in the {0:1} range on its output.

An unjustified Boolean node (or UBN) is a Boolean node whose output range has a controlling value (i.e., {1:1} for OR node and {0:0} for AND node) and the range of each input has both controlling and non-controlling values. A Boolean node is justified when at least one of its inputs has a controlling value or when all of its inputs, except for one, are limited to non-controlling values.

For an unjustified Boolean node, it is known that the output of the node has been put to a controlling value by at least one of the inputs, but it is not known which input or inputs will cause such controlling output value. Therefore, unjustified Boolean nodes can be subjected to case analysis, in which, one-by-one, each of the Boolean node's inputs is assumed to have a controlling value. The implications, resulting from such controlling value assumptions, are explored.

As an example of how an OR node can be made to be justified or unjustified, consider an OR node whose output range is {1:1} and whose two inputs, "a" and "b," have the ranges of {0:15} and {0:31}, respectively. This is an example of an OR node where the ranges of both inputs contain both controlling and non-controlling values. This OR node is unjustified.

If the ranges for "a" and "b" are changed to, respectively, {12:15} and {0:7}, however, an example is produced in which only one of the ranges contains both controlling and non-controlling values (the range {0:7}), while the other range contains only controlling values (the range {12:15}). In this example, the OR node is no longer unjustified because forward implication on the node will result in the {1:1} range on its output that is consistent with the pre-existing range of the output.

If the ranges of "a" and "b" are changed to {0:0} and {0:7}, respectively, an example is produced in which only one of the ranges contains both controlling and non-controlling values (the range {0:7}), while the other range contains only non-controlling values (the range {0:0}). In this example, the OR node is also no longer unjustified for the following reason. A backward implication to input "b" will result in range {1:7} on input "b." A subsequent forward implication of the OR node, with the new ranges for "a" and "b," results in the range {1:1} on the output that is consistent with the current range of the output.

2.6. Definition of Range and Interval

Each node of a CSR assumes a value using a data structure referred to herein as a "range" (also referred to in the pseudo-code herein as a "raceRange" object). A range is comprised of a set of one or more "intervals." An interval is a set of contiguous, monotonically increasing, integer values, defined (inclusively) by a low value and a high value. The intervals of a range are typically non-overlapping. A range may have more than one interval when they are needed to describe "gaps" in the set of values the range represents. The low and high values that define an interval are typically of the same data type. The data type, for the low value and the high value, determines the desired bit width of the interval and whether it is a signed value. The present invention is designed to operate in an environment where very large bit widths may be used, e.g., widths of up to $2^{32}-1$ bits.

For example, a node representing a variable "a" that is a 4-bit value can have the following range: {{0:15}}. If the variable "a" cannot assume the value 7, two intervals can be used as follows to represent the gap: {{0:6}, {8:15}}.

In some cases the range can be represented by a pair of parenthesis, containing the intervals it is comprised of, rather than by a pair of brackets. For the two above example ranges for a variable "a," they can also be represented herein as follows: ({0:15}) and ({0:6}, {8:15}).

For purposes illustration, ranges that contain only one interval may be depicted herein as a single set directly containing values, rather than as a set containing a single interval set. For the above example range for variable "a" of ({0:15}), this range can also be represented herein as: {0:15}.

3. Operator-Specific Pseudo-Code

This section serves as a convenient reference for some of the material presented in the '845, '765 and '964 applications.

This section presents pseudo-code for forward and backward implication across the specific high-level operators used in the examples presented herein. Pseudo-code for additional high-level operators is presented in the '845, '765 and '964 applications.

Ranges are represented in the pseudo-code by object-oriented programming (OOP) objects of type raceRange. A raceInterval is comprised of a pair of OOP objects of type raceDataType, that represent the lower and upper bound of the raceInterval object.

A raceRange is comprised of a list of intervals, comprised of OOP objects of type raceInterval. While the forward and backward propagation algorithms operate on raceRange objects, at the core of each implication procedure is the implication of raceInterval objects across an operator.

For example, to forward implicate values of a raceRange object across an adder, whose inputs are "a" and "b," first the intervals, resulting from forward implicating on a pairwise basis each raceInterval combination, are computed. The resultant raceInterval objects are merged to create a list of canonical (or non-overlapping) raceInterval objects. This list of raceInterval objects comprises a new raceRange object that represents the result of the forward implication. The operator-specific pseudo-code of this Section focuses only on the raceInterval level of implication. The pseudo-code also assumes that the low-level procedures, for performing primitive operations on raceDataType objects, are available. For example, it is assumed that there exists a procedure to multiply two raceDataType objects.

A raceInterval object is comprised of a pair of OOP objects of type raceDataType. A raceDataType object can represents a number with a bit-width of up to $(2^{32}-1)$ bits, and the number can be signed or unsigned.

The following terminology is used in the pseudo-code. The input raceInterval objects are represented as {l1:h1}, {l2:h2}, {l3:h3}. The input raceInterval is limited to three intervals, for the purposes of illustration, since the operators illustrated by pseudo-code can only have up to three inputs. The raceInterval object on the output of an operator is represented as {o1:o2}.

The following pseudo-code procedure is used by various of the below-given operator-specific implication procedures:

```
/* lhsInterval = {l1:h1}, rhsInterval = {l2:h2} */
raceInterval raceIntersectInterval(lhsInterval, rhsInterval) {
    if (lhsInterval and rhsInterval overlap) {
        o1 = Maximum of l1 and l2
        o2 = Minimum of h1 and h2
        return {o1:o2}
    }
    else {
        return 0
    }
}
```

3.1. Forward Propagation

3.1.1. + Operator:

```
/* lhsInterval = {l1:h1}, rhsInterval = {l2:h2} */
raceInterval raceAddInterval(lhsInterval, rhsInterval) {
    return { (l1+l2) : (h1+h2) }
}
```

3.1.2. − Operator:

```
/* lhsInterval = {l1:h1}, rhsInterval = {l2:h2} */
list raceSubtractInterval(lhsInterval, rhsInterval) {
    retList = list containing intervals { (l1−h2) : (l1−l2) },
        { (l1−l2) : (h1 − l2) }
    Merge overlapping intervals in retList from the above operation
    return retList
}
```

3.1.3. == Operator:

```
/* lhsInterval = {l1:h1}, rhsInterval = {l2:h2} */
raceInterval raceEqInterval(lhsInterval, rhsInterval) {
    if ((l1 == h1) && (l2 == h2) && (l1 == l2)) {
        o1 = 1
        o2 = 1
    }
    else if (lhsInterval and rhsInterval overlap) {
        o1 = 0
        o2 = 1
    }
    else {
        o1 = 0
        o2 = 0
    }
    return {o1:o2}
}
```

3.1.4. && Operator:

```
/* lhsInterval = {l1:h1}, rhsInterval = {l2:h2} */
raceInterval raceBoolAndInterval(lhsInterval, rhsInterval) {
    if (lhsInterval == {0:0} || rhsInterval == {0:0}) {
        o1 = 0
        o2 = 0
    }
    else if (lhsInterval does not have 0 &&
             rhsInterval does not have 0) {
        o1 = 1
        o2 = 1
    }
    else{
        o1 = 0
        o2 = 1
    }
    return {o1:o2}
}
```

3.1.5. || Operator:

```
/* lhsInterval = {l1:h1}, rhsInterval = {l2:h2} */
raceInterval raceBoolOrInterval(lhsInterval, rhsInterval) {
    if (lhsInterval == {0:0} && rhsInterval == {0:0}) {
        o1 = 0
        o2 = 0
    }
    else if (lhsInterval does not have 0 ||
             rhsInterval does not have 0) {
        o1 = 1
        o2 = 1
    }
    else {
        o1 = 0
        o2 = 1
    }
    return {o1:o2}
}
```

3.2. Backward Propagation

3.2.1. + Operator:

```
/* result = {o1:o2}, operand = {l:h} */
list raceBackAddInterval(result, operand, numBits, sign) {
    retList = raceSubtractInterval(result, operand)
    minLow = Minimum value for numBits and sign
    maxHigh = Maximum value for numBits and sign
    maxInterval = {minLow:maxHigh}
    retList = list of intervals resulting from intersecting
        each interval in retList with maxInterval
    return retList
}
```

3.2.2. − Operator:

```
/* result = {o1:o2}, rhsInterval = {l2:h2} */
list raceBackLhsSubtractInterval(result, rhsInterval, numBits, sign) {
    retList = list containing only one interval { (o1+l2) : (o2+h2) }
        evaluated in numBits
        precision
    return retList
}
/* result = {o1:o2}, lhsInterval = {l1:h1} */
list raceBackRhsSubtractInterval(result, lhsInterval, numBits, sign) {
    retList = raceSubtractInterval(lhsInterval, result)
    retList = list of intervals resulting from converting all
        intervals in retList to numBits precision
    return retList
}
```

3.2.3. == Operator:

```
/* operand = {l:h}, result = {o1:o2} */
list raceBackEqInterval(result, operand, numBits, sign) {
    retList = 0
    minLow = Minimum value for numBits and sign
    maxHigh = Maximum value for numBits and sign
    maxInterval = {minLow:maxHigh}
    retList = list containing maxInterval
    if (result == {0:0}) {
        if (l == h){
            retList = Intervals resulting by excluding operand
                from maxInterval
        }
    }
    else if (result == {1:1}) {
        retList = raceIntersectInterval(operand, maxInterval)
            computed in
                numBits precision
    }
    else if (result != {0:1}) {
        retList = 0
    }
    return retList
}
```

3.2.4. && Operator:

```
/* operand = {l:h}, result = {o1:o2} */
list raceBackBoolAndInterval(result, operand, numBits, sign) {
    retList = 0
    if (result == {0:0} &&
        operand does not have 0) {
        retList = list containing only {0:0}
    }
    else {
        minLow = Minimum value for numBits and sign
        maxHigh = Maximum value for numBits and sign
        maxInterval = {minLow : maxHigh}
        if (result == {1:1}) {
            retList = List of intervals resulting by excluding 0
                from maxInterval
        }
        else if (result == {0:1}) {
            retList = list containing only maxInterval
        }
    }
    return retList
}
```

3.2.5. || Operator:

```
/* operand = {l:h}, result = {o1:o2} */
list raceBackBoolOrInterval(result, operand, numBits, sign) {
    retList = 0
    if (result == {0:0}) {
        retList = list containing only {0:0}
    }
    else {
        minLow = Minimum value for numBits and sign
        maxHigh = Maximum value for numBits and sign
        maxInterval = {minLow : maxHigh}
        if (result == {1:1} && operand == {0:0}) {
            retList = List of intervals resulting by excluding 0
                from maxInterval
        }
        else if (result =={0:1}) {
            retList = List containing only maxInterval
        }
    }
    return retList
}
```

4. Hardware Environment

Figure 21:
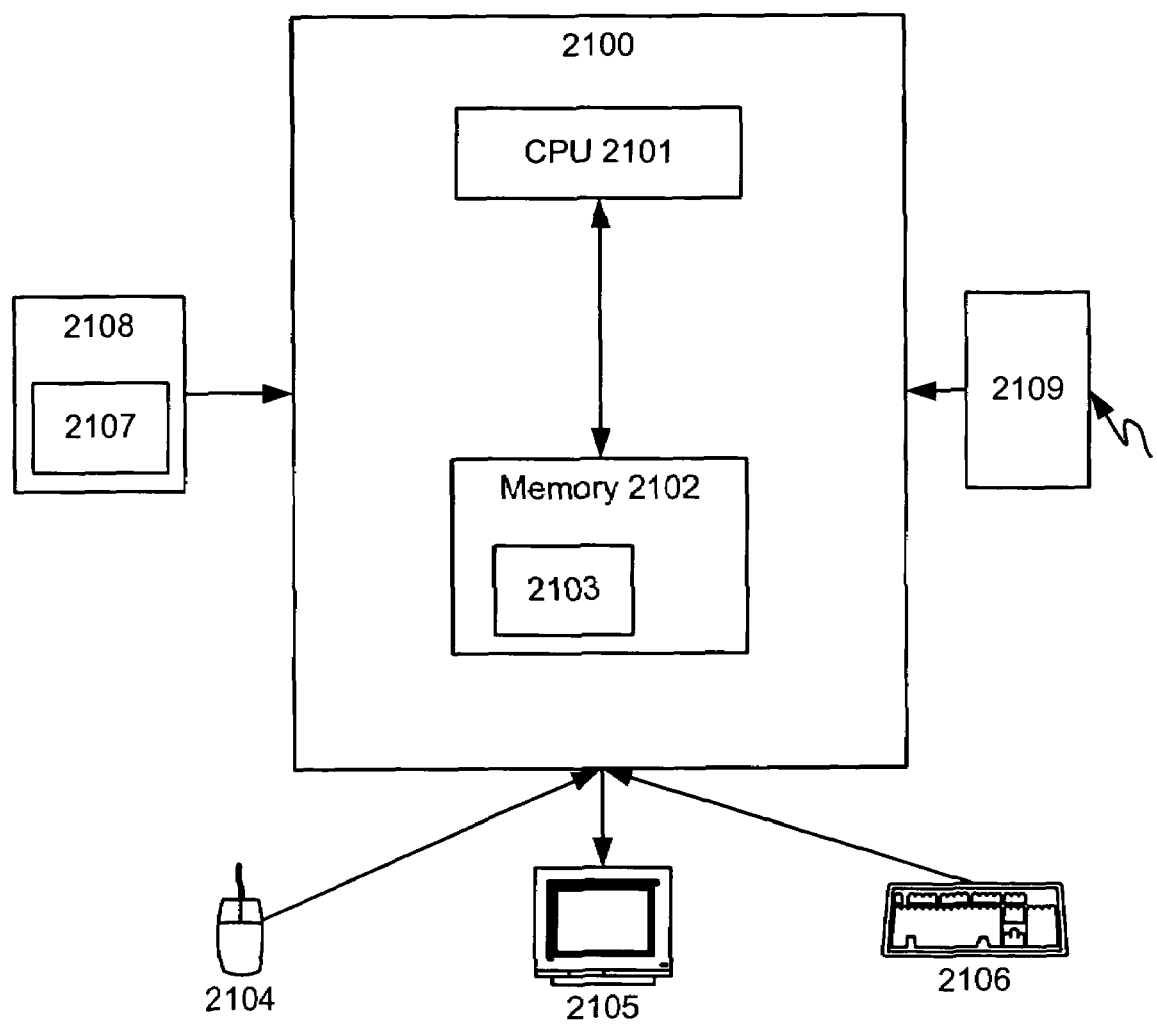
FIG. 21 presents an example hardware environment for the present invention.

The constraint set solving architecture of the present invention can be executed within a computing environment (or data processing system) such as that of FIG. 21. FIG. 21 depicts a workstation computer 2100 comprising a Central Processing Unit (CPU) 2101 (or other appropriate processor or processors) and a memory 2102. Memory 2102 has a portion of its memory in which is stored the software tools (or computer programs) and data of the present invention. While memory 2103 is depicted as a single region, those of ordinary skill in the art will appreciate that, in fact, such software may be distributed over several memory regions or several computers. Furthermore, depending upon the computer's memory organization (such as virtual memory), memory 2102 may comprise several types of memory (including cache, random access memory, hard disk and networked file server). Computer 2100 can be equipped with a display monitor 2105, a mouse pointing device 2104 and a keyboard 2106 to provide interactivity between the software of the present invention and the chip designer. Computer 2100 also includes a way of reading computer readable instructions from a computer readable medium 2107, via a medium reader 2108, into the memory 2102. Computer 2100 also includes a way of reading computer readable instructions via the Internet (or other network) through network interface 2109.

In one embodiment, the processes for solving constraints can be implemented within software produced by Synopsys, Inc., of Mountain View, Calif., USA. Examples of such Synopsys software are: OpenVera High Level Verification Language (including its associated electronic design automation software) and VCS HDL Simulator. In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

5. Glossary of Selected Terms

Bit-slice operator: bit-slice operators are discussed in detail in the '845, '765 and '964 applications. For purposes of the inventions described herein, nodes with bit-slice operators are treated equivalently to primary inputs.

CBL: case-based learning.

CSR: constraint set representation. See above section "CSR" for detailed definition.

DUV: design under verification.

HLHDL: high-level hardware description language.

HVL: Hardware Verification Language. An example is the OpenVera High Level Verification Language (also referred to herein as "Vera"), a product of Synopsys, Inc., Mountain View, Calif., USA.

IE: implication engine.

IE record: a data structure produced by the IE that indicates the changes to the CSR resulting from the invocation of the IE. Contents of IE record can include the following: the current dv and the value it was limited to; the old and new values for any nodes of the CSR that were changed as a result of running the IE; and any nodes that were marked as blocked.

Implication: The extent to which a range at a node of a CSR can be further limited as a deductive consequence of range values at other nodes of the CSR.

JNB: justified node blocking.

Immediate fanout: The immediate fanout of a node "x" is comprised of each node "y" that is driven by node "x" without there being an intervening node between "x" and "y."

OpenVera: The OpenVera High Level Verification Language, produced by Synopsys, Inc., of Mountain View, Calif., USA.

PNL: pivot node learning.

Pseudo-code: This specification contains pseudo-code to illustrate several embodiments of the invention and to explain its principles. The pseudo-code is loosely based upon the C and C++ programming languages. The C and C++ programming languages are described in such texts as "The C Programming Language", by B. W. Kernighan and D. M. Ritchie, Prentice Hall, Inc., 1988, ISBN 0-13-110362-8 (paperback), 0-13-110370-9 (hardback) and "The C++ Programming Language," by Bjarne Stroustrup, Addison-Wesley Pub. Co., 3rd edition, July 1997, ISBN 0-2018-8954-4, which are herein incorporated by reference.

RACE: This term is used to refer generally to a form of constraint solving presented by the '845, '765 and '964 applications. RACE is an acronym of the following phrase "Random ATPG for solving Constraint Expressions." The RACE acronym reflects an approach to constraint solving based upon adapting ATPG (Automatic Test Pattern Generation) techniques to the finding of randomly distributed solutions to constraint expressions. The term "RACE" or "race" is used herein as a root word in certain variable and function names of the pseudo-code.

raceCircuit: Used to refer to a CSR that is being processed by certain pseudo-code presented herein.

Reversion record: a record, prepared from an IE record, that can be pushed on a reversion stack. A reversion record can be used to revert a CSR to a state it was in prior to an application of the IE.

rv: random variable. Plural of rv is rv's.

sv: state variable. Plural of sv is sv's.

singleton value or singleton range: a range for a node of a CSR that encompasses only one value.

The '845, '765 and '964 applications:

"Method and Apparatus For Solving Constraints," filed on Aug. 16, 2003, having inventor Mahesh A. Iyer, filed with a docket number of 06816.0506 and having U.S. patent Office application Ser. No. 10/641,845.

"Method and Apparatus For Case-Based Learning," filed on Sep. 17, 2003, having inventor Mahesh A. Iyer, filed with a docket number of 06816.0506CON1 and having U.S. patent Office application Ser. No. 10/666,765.

"Method and Apparatus For Solving Bit-Slice Operators," filed on Sep. 17, 2003, having inventor Mahesh A. Iyer, filed with a docket number of 06816.0506CON2 and having U.S. patent Office application Ser. No. 10/666,964.

UBN: unjustified Boolean node.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for determining a solution to a set of constraints for a set of variables to verify a circuit, wherein the variables correspond to characteristics of the circuit, the method comprising:

identifying a justified Boolean node;

identifying a first input node, to the justified Boolean node, that does not have a controlling range;

identifying a first transitive fanin of the first input node, wherein a candidate node is included in the first transitive fanin if all paths from the candidate node to a primary output include traversal of the first input node;

marking the first input node and the nodes of the first transitive fanin as blocked; and producing a solution to the set of constraints, thereby facilitating generation of stimuli to a design under verification for the circuit.

2. The method of claim 1, wherein the step of identifying a justified Boolean node further comprises:

waiting for an implication to produce a controlling value before seeking to identify a justified Boolean node.

3. The method of claim 1, further comprising:

skipping a node, for application of an implication, if the node is marked as blocked.

4. The method of claim 1, further comprising:

skipping a node, for application of a learning procedure, if the node is marked as blocked.

5. The method of claim 1, further comprising:

unmarking a node, marked as blocked when the justified Boolean node was identified, if the justified Boolean node becomes unjustified.

6. The method of claim 1, further comprising:

unmarking a node, marked as blocked as a result of a current state, when a constraint set representation is reverted to an earlier state.

7. The method of claim 1, further comprising:

unmarking a node marked as blocked when a state variable changes.

8. A data-processing system for determining a solution to a set of constraints for a set of variables to verify a circuit, wherein the variables correspond to characteristics of the circuit, the system comprising the following sub-systems:

a sub-system configured to identify a justified Boolean node;

a sub-system configured to identify a first input node, to the justified Boolean node, that does not have a controlling range;

a sub-system configured to identify a first transitive fanin of the first input node, wherein a candidate node is included in the first transitive fanin if all paths from the candidate node to a primary output include traversal of the first input node;

a sub-system configured to mark the first input node and the nodes of the first transitive fan in as blocked; and an output mechanism configured to produce a solution to the set of constraints, thereby facilitating generation of stimuli to a design under verification for the circuit.

9. A computer program on a computer readable medium, having computer-readable code devices embodied therein, for determining a solution to a set of constraints for a set of variables to verify a circuit, wherein the variables correspond to characteristics of the circuit, the computer program comprising:

computer readable program code devices configured to identify a justified Boolean node;

computer readable program code devices configured to identify a first input node, to the justified Boolean node, that does not have a controlling range;

computer readable program code devices configured to identify a first transitive fanin of the first input node, wherein a candidate node is included in the first transitive fanin if all paths from the candidate node to a primary output include traversal of the first input node;

computer readable program code devices configured to mark the first input node and the nodes of the first transitive fanin as blocked; and computer readable program code devices configured to produce a solution to the set of constraints, thereby facilitating generation of stimuli to a design under verification for the circuit.

\* \* \* \* \*

UNITED STATES PATENT AND TRADEMARK OFFICE
CERTIFICATE OF CORRECTION

PATENT NO. : 7,302,417 B2
APPLICATION NO. : 11/120920
DATED : November 27, 2007
INVENTOR(S) : Mahesh Anantharaman Iyer Page 1 of 1

It is certified that error appears in the above-identified patent and that said Letters Patent is hereby corrected as shown below:

On the Title Page, Item (75), please delete "Burlingame" and insert --Fremont-- so that the Inventor's address appears as "Fremont, CA".

Signed and Sealed this

Fifteenth Day of April, 2008

JON W. DUDAS
*Director of the United States Patent and Trademark Office*